US011024747B2

(12) United States Patent
Yamazaki et al.

(10) Patent No.: US 11,024,747 B2
(45) Date of Patent: Jun. 1, 2021

(54) LIGHT-EMITTING DEVICE AND METHOD FOR MANUFACTURING THE SAME

(71) Applicant: Semiconductor Energy Laboratory Co., Ltd., Atsugi (JP)

(72) Inventors: Shunpei Yamazaki, Setagaya (JP); Junichiro Sakata, Atsugi (JP); Masayuki Sakakura, Tochigi (JP); Yoshiaki Oikawa, Sagamihara (JP); Kenichi Okazaki, Tochigi (JP); Hotaka Maruyama, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 16/823,678

(22) Filed: Mar. 19, 2020

(65) Prior Publication Data
US 2020/0220029 A1 Jul. 9, 2020

Related U.S. Application Data

(63) Continuation of application No. 15/207,923, filed on Jul. 12, 2016, now Pat. No. 10,672,915, which is a (Continued)

(30) Foreign Application Priority Data

Sep. 4, 2009 (JP) ................................. 2009-204972

(51) Int. Cl.
*H01L 27/12* (2006.01)
*H01L 29/786* (2006.01)
(Continued)

(52) U.S. Cl.
CPC ...... *H01L 29/78696* (2013.01); *H01L 27/124* (2013.01); *H01L 27/127* (2013.01);
(Continued)

(58) Field of Classification Search
None
See application file for complete search history.

(56) References Cited

U.S. PATENT DOCUMENTS 4,615,102 A 10/1986 Suzuki et al.
5,338,959 A 8/1994 Kim et al.
(Continued)

FOREIGN PATENT DOCUMENTS

CN 001770247 A 5/2006
CN 001914552 A 2/2007
(Continued)

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

(Continued)

*Primary Examiner* — Benjamin P Sandvik
(74) *Attorney, Agent, or Firm* — Eric J. Robinson; Robinson Intellectual Property Law Office, P.C.

(57) ABSTRACT

An object is to improve reliability of a light-emitting device. A light-emitting device has a driver circuit portion including a transistor for a driver circuit and a pixel portion including a transistor for a pixel over one substrate. The transistor for the driver circuit and the transistor for the pixel are inverted staggered transistors each including an oxide semiconductor layer in contact with part of an oxide insulating layer. In the pixel portion, a color filter layer and a light-emitting element are provided over the oxide insulating layer. In the transistor for the driver circuit, a conductive layer overlapping with a gate electrode layer and the oxide semiconductor layer is provided over the oxide insulating layer. The gate electrode
(Continued)

layer, a source electrode layer, and a drain electrode layer are formed using metal conductive films.

6 Claims, 26 Drawing Sheets

Related U.S. Application Data continuation of application No. 14/590,359, filed on Jan. 6, 2015, now Pat. No. 9,431,465, which is a continuation of application No. 13/950,404, filed on Jul. 25, 2013, now Pat. No. 8,957,411, which is a continuation of application No. 12/871,176, filed on Aug. 30, 2010, now Pat. No. 8,502,225.

(51) Int. Cl.
  *H01L 27/32* (2006.01)
  *H01L 51/52* (2006.01)
  *H01L 29/24* (2006.01)

(52) U.S. Cl.
  CPC ........ *H01L 27/1225* (2013.01); *H01L 27/322* (2013.01); *H01L 27/3244* (2013.01); *H01L 29/247* (2013.01); *H01L 29/7869* (2013.01); *H01L 29/78618* (2013.01); *H01L 29/78693* (2013.01); *H01L 51/52* (2013.01); *H01L 27/3262* (2013.01); *H01L 29/78648* (2013.01); *H01L 2227/323* (2013.01)

(56) References Cited

U.S. PATENT DOCUMENTS

| | | |
|---|---|---|
| 5,576,556 A | 11/1996 | Takemura et al. |
| 5,731,856 A | 3/1998 | Kim et al. |
| 5,744,823 A | 4/1998 | Harkin et al. |
| 5,744,864 A | 4/1998 | Cillessen et al. |
| 5,847,410 A | 12/1998 | Nakajima |
| 5,962,897 A | 10/1999 | Takemura et al. |
| 6,118,505 A | 9/2000 | Nagata et al. |
| 6,294,274 B1 | 9/2001 | Kawazoe et al. |
| 6,455,875 B2 | 9/2002 | Takemura et al. |
| 6,462,723 B1 | 10/2002 | Yamazaki et al. |
| 6,492,190 B2 | 12/2002 | Yamanaka et al. |
| 6,534,826 B2 | 3/2003 | Yamazaki |
| 6,563,174 B2 | 5/2003 | Kawasaki et al. |
| 6,567,136 B1 | 5/2003 | Sakuramoto et al. |
| 6,586,346 B1 | 7/2003 | Yamazaki et al. |
| 6,603,453 B2 | 8/2003 | Yamazaki et al. |
| 6,624,477 B1 | 9/2003 | Takemura et al. |
| 6,689,492 B1 | 2/2004 | Yamazaki et al. |
| 6,727,522 B1 | 4/2004 | Kawasaki et al. |
| 6,753,257 B2 | 6/2004 | Yamazaki |
| 6,767,755 B2 | 7/2004 | Yamanaka et al. |
| 6,788,567 B2 | 9/2004 | Fujimori |
| 6,790,749 B2 | 9/2004 | Takemura et al. |
| 6,960,787 B2 | 11/2005 | Yamazaki et al. |
| 6,960,812 B2 | 11/2005 | Yamazaki et al. |
| 7,015,141 B2 | 3/2006 | Yamazaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,067,843 B2 | 6/2006 | Carcia et al. |
| 7,105,868 B2 | 9/2006 | Nause et al. |
| 7,109,108 B2 | 9/2006 | Takemura et al. |
| 7,145,174 B2 | 12/2006 | Chiang et al. |
| 7,145,176 B2 | 12/2006 | Kawasaki et al. |
| 7,147,530 B2 | 12/2006 | Yamazaki et al. |
| 7,211,825 B2 | 5/2007 | Shih et al. |
| 7,223,997 B2 | 5/2007 | Kim et al. |
| 7,230,374 B2 | 6/2007 | Suh et al. |
| 7,247,882 B2 | 7/2007 | Yamazaki et al. |
| 7,262,463 B2 | 8/2007 | Hoffman |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,301,211 B2 | 11/2007 | Yamazaki et al. |
| 7,323,356 B2 | 1/2008 | Hosono et al. |
| 7,339,315 B2 | 3/2008 | Suh et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,439,086 B2 | 10/2008 | Yamazaki et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,470,607 B2 | 12/2008 | Carcia et al. |
| 7,491,590 B2 | 2/2009 | Maekawa |
| 7,491,987 B2 | 2/2009 | Genrikh et al. |
| 7,501,293 B2 | 3/2009 | Ito et al. |
| 7,501,655 B2 | 3/2009 | Kim et al. |
| 7,507,618 B2 | 3/2009 | Dunbar |
| 7,544,967 B2 | 6/2009 | Kim et al. |
| 7,566,904 B2 | 7/2009 | Ishii |
| 7,573,069 B2 | 8/2009 | Yamazaki |
| 7,575,966 B2 | 8/2009 | Lai et al. |
| 7,576,394 B2 | 8/2009 | Furuta et al. |
| 7,598,520 B2 | 10/2009 | Hirao et al. |
| 7,601,984 B2 | 10/2009 | Sano et al. |
| 7,602,020 B2 | 10/2009 | Takemura et al. |
| 7,608,531 B2 | 10/2009 | Isa et al. |
| 7,622,371 B2 | 11/2009 | Pan et al. |
| 7,635,889 B2 | 12/2009 | Isa et al. |
| 7,645,478 B2 | 1/2010 | Thelss et al. |
| 7,651,896 B2 | 1/2010 | Honda et al. |
| 7,663,302 B2 | 2/2010 | Shin et al. |
| 7,674,650 B2 | 3/2010 | Akimoto et al. |
| 7,687,807 B2 | 3/2010 | Koo et al. |
| 7,691,666 B2 | 4/2010 | Levy et al. |
| 7,691,685 B2 | 4/2010 | Maekawa et al. |
| 7,719,185 B2 | 5/2010 | Jin et al. |
| 7,723,788 B2 | 5/2010 | Takemura et al. |
| 7,732,251 B2 | 6/2010 | Hoffman et al. |
| 7,732,819 B2 | 6/2010 | Akimoto et al. |
| 7,733,015 B2 | 6/2010 | Saito |
| 7,737,517 B2 * | 6/2010 | Kawamura ....... H01L 29/41733 257/432 |
| 7,745,798 B2 | 6/2010 | Takahashi |
| 7,767,106 B2 | 8/2010 | Chang |
| 7,772,021 B2 | 8/2010 | Lee et al. |
| 7,773,182 B2 | 8/2010 | Kimura et al. |
| 7,791,072 B2 | 9/2010 | Kumomi et al. |
| 7,791,075 B2 | 9/2010 | Kobayashi et al. |
| 7,791,082 B2 | 9/2010 | Iwasaki |
| 7,795,613 B2 | 9/2010 | Ito et al. |
| 7,825,588 B2 | 11/2010 | Yamazaki et al. |
| 7,829,444 B2 | 11/2010 | Yabuta et al. |
| 7,833,845 B2 | 11/2010 | Yamazaki et al. |
| 7,855,379 B2 | 12/2010 | Hayashi et al. |
| 7,858,455 B2 | 12/2010 | Yamazaki |
| 7,858,987 B2 | 12/2010 | Yamazaki |
| 7,863,611 B2 | 1/2011 | Abe et al. |
| 7,867,636 B2 | 1/2011 | Nakagawara et al. |
| 7,868,326 B2 | 1/2011 | Sano et al. |
| 7,872,259 B2 | 1/2011 | Den et al. |
| 7,884,360 B2 | 2/2011 | Takechi et al. |
| 7,884,362 B2 | 2/2011 | Jung et al. |
| 7,888,702 B2 | 2/2011 | Akimoto et al. |
| 7,910,490 B2 | 3/2011 | Akimoto et al. |
| 7,923,722 B2 | 4/2011 | Ryu et al. |
| 7,932,521 B2 | 4/2011 | Akimoto et al. |
| 7,935,641 B2 | 5/2011 | Kim et al. |
| 7,939,822 B2 | 5/2011 | Maekawa et al. |
| 7,977,168 B2 | 7/2011 | Honda et al. |
| 7,977,175 B2 | 7/2011 | Jung et al. |
| 7,978,274 B2 | 7/2011 | Umezaki et al. |
| 7,981,734 B2 | 7/2011 | Furuta et al. |
| 7,993,964 B2 | 8/2011 | Hirao et al. |
| 8,017,422 B2 | 9/2011 | Fujii et al. |
| 8,017,506 B2 | 9/2011 | Takemura et al. |
| 8,067,775 B2 | 11/2011 | Miyairi et al. |

(56) References Cited

U.S. PATENT DOCUMENTS

| | | |
|---|---|---|
| 8,088,652 B2 | 1/2012 | Hayashi et al. |
| 8,097,884 B2 | 1/2012 | Yamazaki |
| 8,106,400 B2 | 1/2012 | Miyairi et al. |
| 8,193,045 B2 | 6/2012 | Omura et al. |
| 8,203,265 B2 | 6/2012 | Yamazaki et al. |
| 8,212,284 B2 | 7/2012 | Akimoto et al. |
| 8,242,496 B2 | 8/2012 | Yamazaki et al. |
| 8,263,421 B2 | 9/2012 | Yamazaki et al. |
| 8,274,077 B2 | 9/2012 | Akimoto et al. |
| 8,319,219 B2 | 11/2012 | Yamazaki |
| 8,350,466 B2 | 1/2013 | Murakami et al. |
| 8,354,674 B2 | 1/2013 | Kimura |
| 8,373,166 B2 | 2/2013 | Yamazaki |
| 8,420,442 B2 | 4/2013 | Takechi et al. |
| 8,420,462 B2 | 4/2013 | Kobayashi et al. |
| 8,421,350 B2 | 4/2013 | Yamazaki et al. |
| 8,436,349 B2 | 5/2013 | Sano et al. |
| 8,466,463 B2 | 6/2013 | Akimoto et al. |
| 8,502,225 B2 | 8/2013 | Yamazaki et al. |
| 8,552,933 B2 | 10/2013 | Koyama et al. |
| 8,563,977 B2 | 10/2013 | Shimada et al. |
| 8,592,861 B2 | 11/2013 | Akimoto et al. |
| 8,629,069 B2 | 1/2014 | Akimoto et al. |
| 8,659,014 B2 | 2/2014 | Honda et al. |
| 8,669,550 B2 | 3/2014 | Akimoto et al. |
| 8,674,600 B2 | 3/2014 | Yamazaki et al. |
| 8,748,898 B2 | 6/2014 | Yamazaki |
| 8,790,959 B2 | 7/2014 | Akimoto et al. |
| 8,796,069 B2 | 8/2014 | Akimoto et al. |
| 8,889,480 B2 | 11/2014 | Takechi et al. |
| 8,987,988 B2 | 3/2015 | Yamazaki et al. |
| 9,099,562 B2 | 8/2015 | Akimoto et al. |
| 9,178,177 B2 | 11/2015 | Yamazaki et al. |
| 9,209,026 B2 | 12/2015 | Takechi et al. |
| 9,444,069 B2 | 9/2016 | Murakami et al. |
| 9,620,714 B2 | 4/2017 | Fujii et al. |
| 10,096,795 B2 | 10/2018 | Murakami et al. |
| 10,304,962 B2 | 5/2019 | Akimoto et al. |
| 2001/0030323 A1 | 10/2001 | Ikeda |
| 2001/0046027 A1 | 11/2001 | Tai et al. |
| 2002/0006681 A1 | 1/2002 | Yamanaka et al. |
| 2002/0043662 A1 | 4/2002 | Yamazaki et al. |
| 2002/0044111 A1 | 4/2002 | Yamazaki et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0051823 A1 | 3/2004 | Choi |
| 2004/0127038 A1 | 7/2004 | Carcia et al. |
| 2004/0184027 A1 | 9/2004 | Mizutani et al. |
| 2004/0257500 A1 | 12/2004 | Kim et al. |
| 2004/0263506 A1 | 12/2004 | Koyama et al. |
| 2005/0017302 A1 | 1/2005 | Hoffman |
| 2005/0062407 A1 | 3/2005 | Suh et al. |
| 2005/0093435 A1 | 5/2005 | Suh et al. |
| 2005/0162579 A1 | 7/2005 | Jeong et al. |
| 2005/0162580 A1 | 7/2005 | Kim et al. |
| 2005/0199959 A1 | 9/2005 | Chiang et al. |
| 2005/0199960 A1 | 9/2005 | Hoffman et al. |
| 2005/0225232 A1 | 10/2005 | Boroson et al. |
| 2005/0263765 A1 | 12/2005 | Maekawa |
| 2005/0269942 A1 | 12/2005 | Ahn et al. |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0049419 A1 | 3/2006 | Tanaka et al. |
| 2006/0061526 A1 | 3/2006 | Shirasaki et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1* | 8/2006 | Isa ................ H01L 21/288 257/775 |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0273316 A1 | 12/2006 | Yang et al. |
| 2006/0284171 A1 | 12/2006 | Levy et al. |
| 2006/0284172 A1 | 12/2006 | Ishii |
| 2006/0292726 A1 | 12/2006 | Akimoto et al. |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0096816 A1 | 5/2007 | Paul et al. |
| 2007/0108446 A1 | 5/2007 | Akimoto |
| 2007/0152217 A1* | 7/2007 | Lai ................ H01L 29/7869 257/59 |
| 2007/0164668 A1 | 7/2007 | Kim |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0222368 A1 | 9/2007 | Lee et al. |
| 2007/0252928 A1 | 11/2007 | Ito et al. |
| 2007/0272922 A1 | 11/2007 | Kim et al. |
| 2007/0273814 A1 | 11/2007 | You et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0042217 A1 | 2/2008 | Jeong et al. |
| 2008/0050595 A1 | 2/2008 | Nakagawara et al. |
| 2008/0073653 A1 | 3/2008 | Iwasaki |
| 2008/0080221 A1 | 4/2008 | Koo et al. |
| 2008/0081105 A1 | 4/2008 | Suh et al. |
| 2008/0083950 A1 | 4/2008 | Pan et al. |
| 2008/0106191 A1 | 5/2008 | Kawase |
| 2008/0118743 A1* | 5/2008 | Lee ................ H01L 51/56 428/332 |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0197350 A1 | 8/2008 | Park et al. |
| 2008/0203387 A1 | 8/2008 | Kang et al. |
| 2008/0204619 A1 | 8/2008 | Saitou et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0033818 A1 | 2/2009 | Nakajima et al. |
| 2009/0057672 A1 | 3/2009 | Kobayashi et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0091678 A1 | 4/2009 | Jeong et al. |
| 2009/0114910 A1 | 5/2009 | Chang |
| 2009/0134399 A1 | 5/2009 | Sakakura et al. |
| 2009/0134401 A1 | 5/2009 | Maekawa |
| 2009/0140438 A1 | 6/2009 | Yamazaki et al. |
| 2009/0152506 A1 | 6/2009 | Umeda et al. |

(56) References Cited

U.S. PATENT DOCUMENTS

| | | |
|---|---|---|
| 2009/0152541 A1 | 6/2009 | Maekawa et al. |
| 2009/0160741 A1 | 6/2009 | Inoue et al. |
| 2009/0184315 A1 | 7/2009 | Lee et al. |
| 2009/0189153 A1 | 7/2009 | Iwasaki et al. |
| 2009/0189155 A1 | 7/2009 | Akimoto |
| 2009/0189156 A1 | 7/2009 | Akimoto |
| 2009/0251048 A1 | 10/2009 | Choi et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0305461 A1 | 12/2009 | Akimoto et al. |
| 2009/0315451 A1 | 12/2009 | Choi et al. |
| 2010/0025678 A1 | 2/2010 | Yamazaki et al. |
| 2010/0044708 A1 | 2/2010 | Lin et al. |
| 2010/0051933 A1 | 3/2010 | Kim et al. |
| 2010/0051937 A1 | 3/2010 | Kaji et al. |
| 2010/0059754 A1 | 3/2010 | Lee et al. |
| 2010/0065844 A1 | 3/2010 | Tokunaga |
| 2010/0084648 A1 | 4/2010 | Watanabe |
| 2010/0084650 A1 | 4/2010 | Yamazaki et al. |
| 2010/0084651 A1 | 4/2010 | Yamazaki et al. |
| 2010/0085081 A1 | 4/2010 | Ofuji et al. |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0102320 A1 | 4/2010 | Chung et al. |
| 2010/0109002 A1 | 5/2010 | Itagaki et al. |
| 2010/0117079 A1 | 5/2010 | Miyairi et al. |
| 2010/0117999 A1 | 5/2010 | Matsunaga et al. |
| 2010/0136743 A1 | 6/2010 | Akimoto et al. |
| 2010/0140612 A1 | 6/2010 | Omura et al. |
| 2010/0193785 A1 | 8/2010 | Kimura |
| 2010/0213459 A1 | 8/2010 | Shimada et al. |
| 2010/0252826 A1 | 10/2010 | Yamazaki et al. |
| 2010/0301326 A1 | 12/2010 | Miyairi et al. |
| 2011/0012106 A1 | 1/2011 | Yamazaki et al. |
| 2011/0012112 A1 | 1/2011 | Yamazaki et al. |
| 2011/0012117 A1 | 1/2011 | Yamazaki et al. |
| 2011/0012118 A1 | 1/2011 | Yamazaki et al. |
| 2011/0017995 A1 | 1/2011 | Yamazaki et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0221475 A1 | 9/2011 | Koyama et al. |
| 2011/0260169 A1 | 10/2011 | Umezaki et al. |
| 2012/0061668 A1 | 3/2012 | Miyairi et al. |
| 2012/0104386 A1 | 5/2012 | Miyairi et al. |
| 2012/0132911 A1 | 5/2012 | Shimada et al. |
| 2013/0187166 A1 | 7/2013 | Yamazaki |
| 2014/0070211 A1 | 3/2014 | Iwasaki et al. |
| 2014/0166999 A1 | 6/2014 | Kim et al. |
| 2014/0175393 A1 | 6/2014 | Beak et al. |
| 2015/0187854 A1 | 7/2015 | Beak et al. |
| 2016/0133678 A1 | 5/2016 | Beak et al. |
| 2018/0151646 A1 | 5/2018 | Kim et al. |
| 2019/0051759 A1 | 2/2019 | Akimoto et al. |
| 2019/0157314 A1 | 5/2019 | Kimura |
| 2019/0326444 A1 | 10/2019 | Akimoto et al. |

FOREIGN PATENT DOCUMENTS

| | | | |
|---|---|---|---|
| CN | 001941299 A | | 4/2007 |
| CN | 101335212 A | | 12/2008 |
| CN | 101809747 A | | 8/2010 |
| EP | 1049167 A | | 11/2000 |
| EP | 1058484 A | | 12/2000 |
| EP | 1737044 A | | 12/2006 |
| EP | 1770788 A | | 4/2007 |
| EP | 1995787 A | | 11/2008 |
| EP | 1998373 A | | 12/2008 |
| EP | 1998374 A | | 12/2008 |
| EP | 1998375 A | | 12/2008 |
| EP | 2006824 A | | 12/2008 |
| EP | 2149910 A | | 2/2010 |
| EP | 2149911 A | | 2/2010 |
| EP | 2226847 A | | 9/2010 |
| EP | 2256808 A | | 12/2010 |
| EP | 2296443 A | | 3/2011 |
| EP | 3614442 A | | 2/2020 |
| JP | 60-198861 A | | 10/1985 |
| JP | 63-210022 A | | 8/1988 |
| JP | 63-210023 A | | 8/1988 |
| JP | 63-210024 A | | 8/1988 |
| JP | 63-215519 A | | 9/1988 |
| JP | 63-239117 A | | 10/1988 |
| JP | 63-265818 A | | 11/1988 |
| JP | 63-301565 A | | 12/1988 |
| JP | 02-156676 A | | 6/1990 |
| JP | 03-231472 A | | 10/1991 |
| JP | 05-251705 A | | 9/1993 |
| JP | 06-202156 A | | 7/1994 |
| JP | 08-264794 A | | 10/1996 |
| JP | 10-290012 A | | 10/1998 |
| JP | 11-505377 | | 5/1999 |
| JP | 2000-044236 A | | 2/2000 |
| JP | 2000-111948 A | | 4/2000 |
| JP | 2000-150900 A | | 5/2000 |
| JP | 2000-180899 A | | 6/2000 |
| JP | 2001-051292 A | | 2/2001 |
| JP | 2001-052873 A | | 2/2001 |
| JP | 2001-094115 A | | 4/2001 |
| JP | 2002-076356 A | | 3/2002 |
| JP | 2002-289859 A | | 10/2002 |
| JP | 2002-305306 A | | 10/2002 |
| JP | 2003-029293 A | | 1/2003 |
| JP | 2003-086000 A | | 3/2003 |
| JP | 2003-086808 A | | 3/2003 |
| JP | 2003-271075 A | | 9/2003 |
| JP | 2003-273228 A | | 9/2003 |
| JP | 2003-273361 A | | 9/2003 |
| JP | 2003-280034 A | | 10/2003 |
| JP | 2003-309266 A | | 10/2003 |
| JP | 2004-047566 A | | 2/2004 |
| JP | 2004-103957 A | | 4/2004 |
| JP | 2004-247533 A | | 9/2004 |
| JP | 2004-273614 A | | 9/2004 |
| JP | 2004-273732 A | | 9/2004 |
| JP | 2004-281087 A | | 10/2004 |
| JP | 2005-037919 A | | 2/2005 |
| JP | 2005-051228 A | | 2/2005 |
| JP | 2005-100939 A | | 4/2005 |
| JP | 2005-167212 A | | 6/2005 |
| JP | 2005-277323 A | | 10/2005 |
| JP | 2006-013480 A | | 1/2006 |
| JP | 2006-202156 A | | 8/2006 |
| JP | 2006-293385 A | | 10/2006 |
| JP | 2006-317955 A | | 11/2006 |
| JP | 2007-081362 A | | 3/2007 |
| JP | 2007-096055 A | | 4/2007 |
| JP | 2007-123861 A | | 5/2007 |
| JP | 2007-150158 A | | 6/2007 |
| JP | 2007-163467 A | | 6/2007 |
| JP | 2007-171932 A | | 7/2007 |
| JP | 2007-250983 A | | 9/2007 |
| JP | 2007-529119 | | 10/2007 |
| JP | 2007-286150 A | | 11/2007 |
| JP | 2007-293073 A | | 11/2007 |
| JP | 2008-010889 A | | 1/2008 |
| JP | 2008-042088 A | | 2/2008 |
| JP | 2008-083171 A | | 4/2008 |
| JP | 2008-085312 A | | 4/2008 |
| JP | 2008-107807 A | | 5/2008 |
| JP | 2008-203761 A | | 9/2008 |
| JP | 2008-276212 A | | 11/2008 |
| JP | 2008-281988 A | | 11/2008 |
| JP | 2009-010362 A | | 1/2009 |
| JP | 2009-021612 A | | 1/2009 |
| JP | 2009-033145 A | | 2/2009 |
| JP | 2009-049223 A | | 3/2009 |
| JP | 2009-081425 A | | 4/2009 |
| JP | 2009-099887 A | | 5/2009 |
| JP | 2009-099944 A | | 5/2009 |
| JP | 2009-109883 A | | 5/2009 |
| JP | 2009-158940 A | | 7/2009 |

(56) References Cited

FOREIGN PATENT DOCUMENTS

| | | |
|---|---|---|
| JP | 2009-265271 A | 11/2009 |
| JP | 2010-098280 A | 4/2010 |
| KR | 0131061 | 11/1997 |
| KR | 2006-0050824 A | 5/2006 |
| KR | 2006-0051388 A | 5/2006 |
| KR | 2006-0109334 A | 10/2006 |
| KR | 2006-0133981 A | 12/2006 |
| KR | 2007-0066257 A | 6/2007 |
| KR | 2008-0028571 A | 4/2008 |
| KR | 2008-0054597 A | 6/2008 |
| KR | 2008-0058406 A | 6/2008 |
| KR | 2008-0066678 A | 7/2008 |
| KR | 2008-0112110 A | 12/2008 |
| KR | 2009-0012075 A | 2/2009 |
| KR | 2009-0018587 A | 2/2009 |
| KR | 2009-0128536 A | 12/2009 |
| TW | 200527093 | 8/2005 |
| TW | 200802888 | 1/2008 |
| TW | 200811568 | 3/2008 |
| TW | 200915577 | 4/2009 |
| TW | 201009954 | 3/2010 |
| WO | WO-2004/114391 | 12/2004 |
| WO | WO-2005/048353 | 5/2005 |
| WO | WO-2005/071478 | 8/2005 |
| WO | WO-2005/093850 | 10/2005 |
| WO | WO-2007/032294 | 3/2007 |
| WO | WO-2007/089048 | 8/2007 |
| WO | WO-2007/119386 | 10/2007 |
| WO | WO-2007/142167 | 12/2007 |
| WO | WO-2008/105250 | 9/2008 |
| WO | WO-2008/105347 | 9/2008 |
| WO | WO-2008/126879 | 10/2008 |
| WO | WO-2008/126884 | 10/2008 |
| WO | WO-2008/143304 | 11/2008 |
| WO | WO-2008/149873 | 12/2008 |
| WO | WO-2009/041544 | 4/2009 |

OTHER PUBLICATIONS

Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m =7, 8, 9, and 16) in the In2O3—ZnGa2O4—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Lee.J et al., "World'S Largest (15-Inch) XGA AMCLD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Jeong.J et al., "3.1: Distinguished Paper: 12.1-Inch WSGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD'09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT"SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID

(56) References Cited

OTHER PUBLICATIONS

Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases For Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kimizuka.n. et al., "SPINEL,YBFe2O4, and YB2Fe3O7 Types of Structures for Compounds in the In2O3 and SC2O3—A2O3—BO Systems [A; Fe, Ga, or Al; B: Mg, Mn, Fe, Ni, Cu,or Zn] at Temperatures Over 1000 ° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
International Search Report (Application No. PCT/JP2010/063734) dated Oct. 12, 2010.
Written Opinion (Application No. PCT/JP2010/063734) dated Oct. 12, 2010.
Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Son.K et al., "42.4L: Late-News Paper: 4 Inch QVGA AMOLED Driven by the Threshold Voltage Controlled Amorphous GIZO Ga2O3—In2O3—ZnO) TFT", SID Digest '08 : SID International Symposium Digest of Technical Papers, May 20, 2008, vol. 39, pp. 633-636.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Nakamura.M, "Synthesis of Homologous Compound with New Long-Period Structure", NIRIM Newsletter, Mar. 1, 1995, vol. 150, pp. 1-4.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Cho.Y et al., "Characteristics of a-Si:H Dual-Gate TFTs Using ITO Electrode for LCD Driver", AM-FPD '08 Digest of Technical Papers, Jul. 2, 2008, pp. 229-232.

(56) References Cited

OTHER PUBLICATIONS

Takahashi.K et al., "4p-N-10 Back-channel control in amorphous In—Ga—Zn—O TFTs", 69th Japan Society of Applied Physics, Sep. 1, 2008, No. 2, p. 851.
International Search Report (Application No. PCT/JP2009/067289) dated Nov. 2, 2009. .
Written Opinion (Application No. PCT/JP2009/067289) dated Nov. 2, 2009.
Chinese Office Action (Application No. 201080040387.3) dated Jun. 3, 2014.
Taiwanese Office Action (Application No. 099129491) dated Mar. 23, 2015.
Korean Office Action (Application No. 2012-7008606) dated Jun. 14, 2016.
Chinese Office Action (Application No. 201610008810.0) dated Dec. 2, 2016.
Korean Office Action (Application No. 2017-7014967) dated Jun. 22, 2017.
Korean Office Action (Application No. 2018-7010617) dated Jul. 13, 2018.
Taiwanese Office Action (Application No. 107104775) dated Sep. 14, 2018.

\* cited by examiner

FIG. 11A1
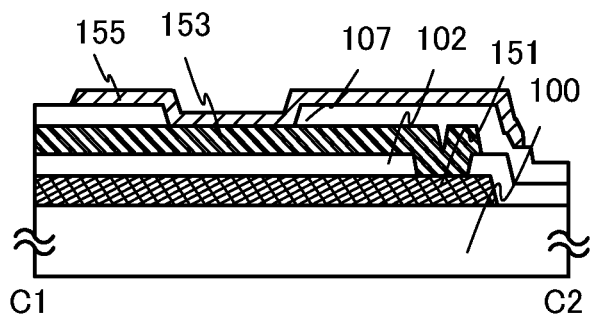
FIG. 11A2
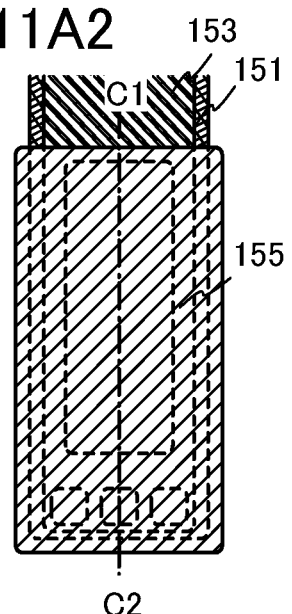
FIG. 11B1
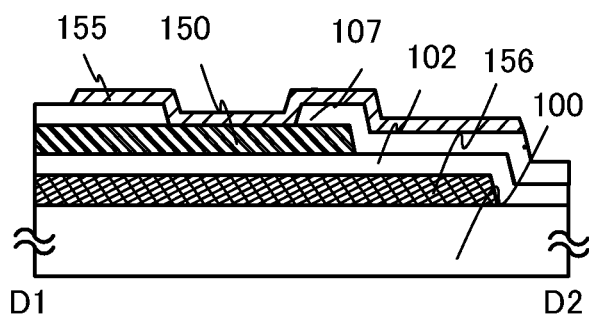
FIG. 11B2
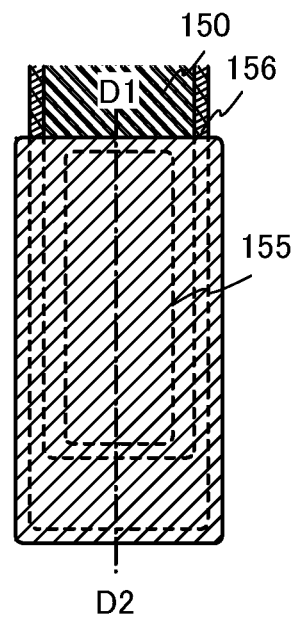

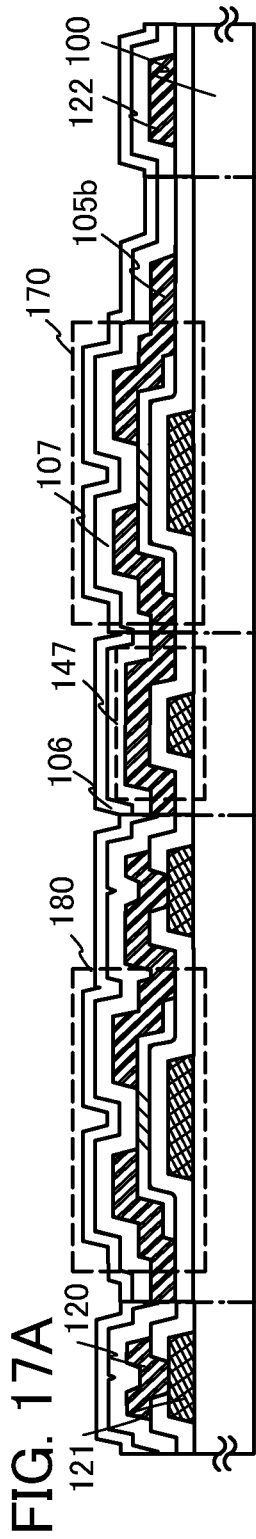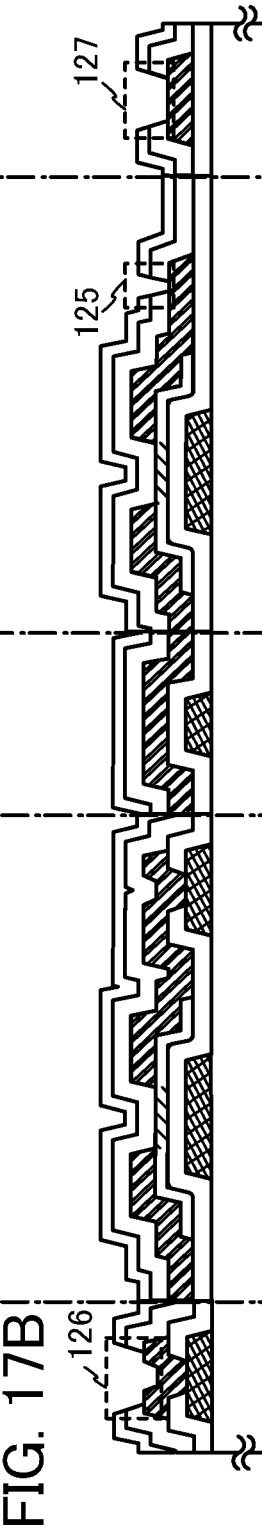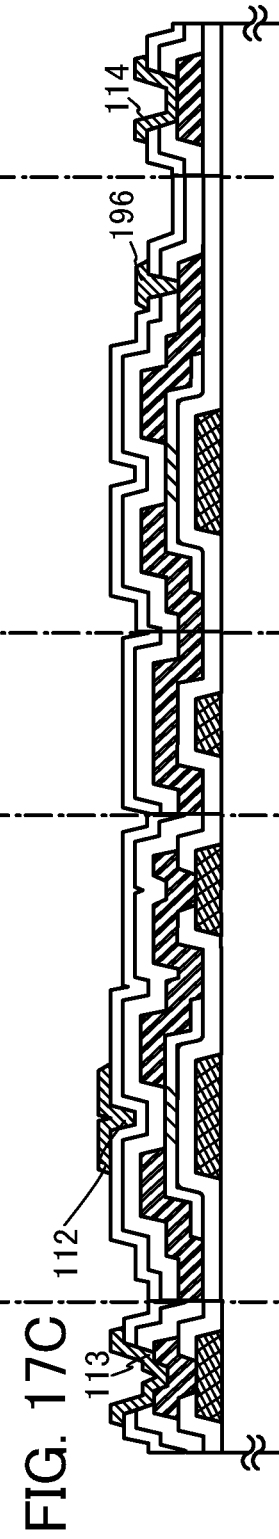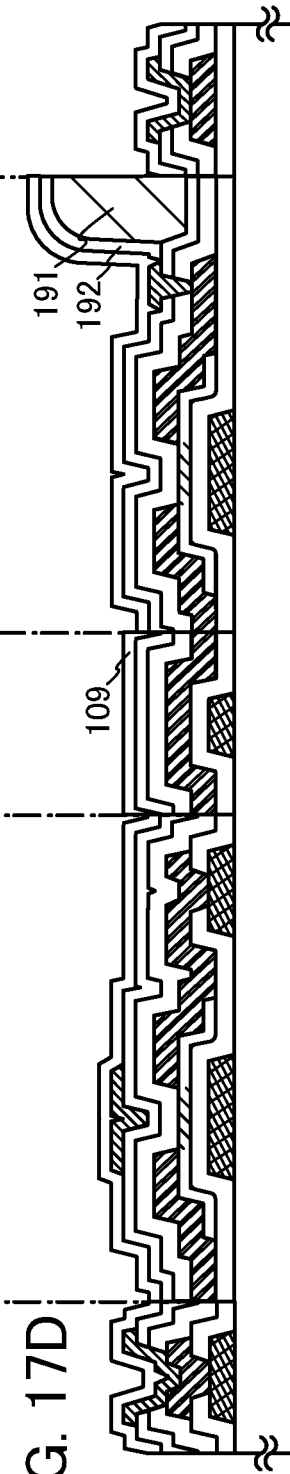

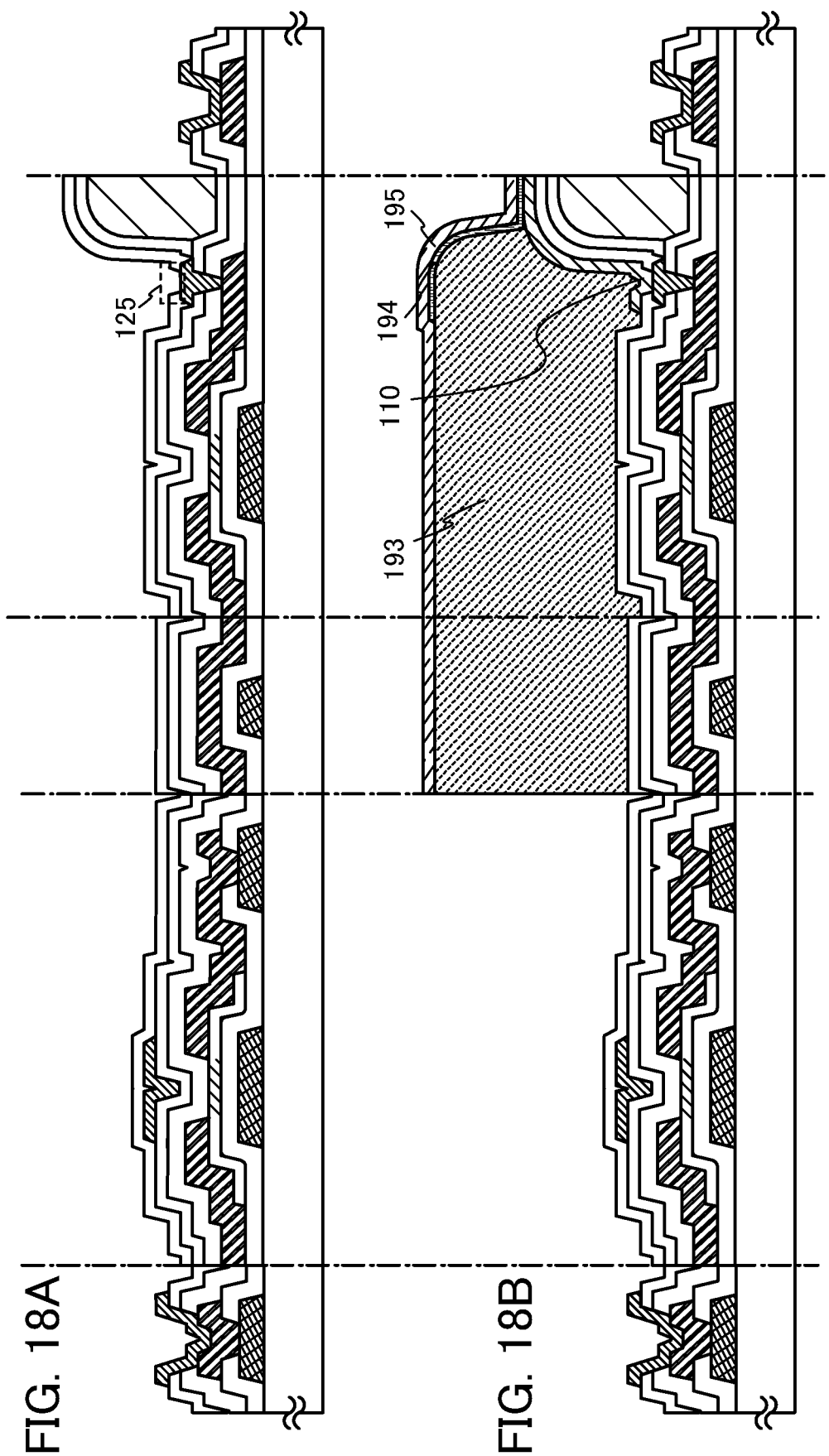

LIGHT-EMITTING DEVICE AND METHOD FOR MANUFACTURING THE SAME

TECHNICAL FIELD

The present invention relates to a light-emitting device including a layer containing an organic compound as a light-emitting layer, and a manufacturing method of the light-emitting device. For example, the present invention relates to an electronic device on which a light-emitting display device having an organic light-emitting element is mounted as a part.

Note that in this specification, a semiconductor device refers to all devices that can function by utilizing semiconductor characteristics, and electro-optic devices such as light-emitting devices, semiconductor circuits, and electronic devices are all semiconductor devices.

BACKGROUND ART

A light-emitting element containing an organic compound as a luminous body, which has features such as thinness, lightness, high-speed response, and DC drive at a low voltage, is expected to be applied to a next-generation flat panel display or a next-generation lighting device. In particular, a display device in which light-emitting elements are arranged in matrix is considered to have advantages in a wide viewing angle and excellent visibility over a conventional liquid crystal display device.

It is said that, as for a light-emitting mechanism of a light-emitting element, an EL layer is interposed between a pair of electrodes and voltage is applied to the pair of electrodes, so that electrons injected from a cathode and holes injected from an anode are recombined in an emission center of the EL layer to form molecular excitons, and the molecular excitons release energy when returning to a ground state, whereby light is emitted. Singlet excitation and triplet excitation are known as excited states, and light emission can probably be achieved through either of the excited states.

An EL layer included in a light-emitting element includes at least a light-emitting layer. In addition, the EL layer can have a stacked-layer structure including a hole-injection layer, a hole-transport layer, an electron-transport layer, an electron-injection layer, and/or the like, in addition to the light-emitting layer.

As a material having semiconductor characteristics, metal oxide has attracted attention. The examples of such metal oxides having semiconductor characteristics are tungsten oxide, tin oxide, indium oxide, zinc oxide, and the like. A thin film transistor in which a channel formation region is formed using such metal oxide having semiconductor characteristics is known (for example, see Patent Documents 1 and 2).

A TFT applying an oxide semiconductor has high field effect mobility. Therefore, a driver circuit in a display device or the like can be formed using the TFT.

REFERENCE

[Patent Document 1] Japanese Published Patent Application No. 2007-123861
[Patent Document 2] Japanese Published Patent Application No. 2007-096055

DISCLOSURE OF INVENTION

For a thin film transistor including an oxide semiconductor film, high-speed operation, a relatively easy manufacturing process, and sufficient reliability are required.

An object is to improve operation characteristics and reliability of a thin film transistor including an oxide semiconductor film.

In particular, higher operation speed of a thin film transistor used in a driver circuit is preferable.

For example, the operation speed is increased when a channel length (L) of the thin film transistor is reduced or a channel width (W) thereof is increased. However, when the channel length is reduced, there is a problem in that a switching characteristic, for example, an on-off ratio is lowered. In addition, when the channel width (W) is increased, there is a problem in that the capacity load of the thin film transistor itself is increased.

Another object is to provide a light-emitting device including a thin film transistor having stable electric characteristics even when a channel length is small.

When a plurality of circuits which are different from each other is formed over an insulating surface, for example, when a pixel portion and a driver circuit are formed over one substrate, excellent switching characteristics such as a high on-off ratio is needed for a thin film transistor used in the pixel portion, while high operation speed is needed for a thin film transistor used in the driver circuit. In particular, as the definition of a display device is higher, writing time of a displayed image is reduced. Therefore, it is preferable that the thin film transistor used for the driver circuit operate at high speed.

Further, another object is to reduce variation in electrical characteristics of a thin film transistor including an oxide semiconductor film.

One embodiment of the present invention is a light-emitting device having a driver circuit portion including a transistor for a driver circuit and a pixel portion including a transistor for a pixel over one substrate. Each of the transistor for the driver circuit and the transistor for the pixel includes a gate electrode layer, a gate insulating layer over the gate electrode layer, an oxide semiconductor layer over the gate insulating layer, a source electrode layer and a drain electrode layer over the oxide semiconductor layer, and an oxide insulating layer, which is in contact with part of the oxide semiconductor layer, over the oxide semiconductor layer, the source electrode layer, and the drain electrode layer. The pixel portion is provided with a color filter layer over the oxide insulating layer and a stack of a first electrode layer electrically connected to the transistor for the pixel, an EL layer, and a second electrode layer over the color filter layer. The transistor for the driver circuit is provided with a conductive layer over the oxide insulating layer, which overlaps with the gate electrode layer and the oxide semiconductor layer. The gate electrode layers, the source electrode layers, and the drain electrode layers are formed using metal conductive films.

Another embodiment of the present invention is a light-emitting device having a driver circuit portion including a transistor for a driver circuit and a pixel portion including a transistor for a pixel over one substrate. Each of the transistor for the driver circuit and the transistor for the pixel includes a gate electrode layer, a gate insulating layer over the gate electrode layer, an oxide semiconductor layer over the gate insulating layer, a source electrode layer and a drain electrode layer over the oxide semiconductor layer, and an oxide insulating layer, which is in contact with part of the oxide semiconductor layer, over the oxide semiconductor layer, the source electrode layer, and the drain electrode layer. The pixel portion is provided with a color filter layer over the oxide insulating layer and a stack of a first electrode layer electrically connected to the transistor for the pixel through a connection electrode layer, an EL layer, and a second electrode layer over the color filter layer. The transistor for the driver circuit is provided with a conductive layer over the oxide insulating layer, which overlaps with the gate electrode layer and the oxide semiconductor layer. The gate electrode layers, the source electrode layers, and the drain electrode layers are formed using metal conductive films.

An inverted staggered transistor having a bottom-gate structure is used as each of the transistor for the pixel and the transistor for the drive circuit. The transistor for the pixel and the transistor for the driver circuit are each a channel-etched transistor in which an oxide insulating film is provided in contact with an oxide semiconductor layer which is exposed between a source electrode layer and a drain electrode layer.

The transistor for the driver circuit has a structure in which the oxide semiconductor layer is sandwiched between the gate electrode and the conductive layer. With this structure, variation in the threshold voltage of the transistor can be reduced; accordingly, a light-emitting device including a transistor with stable electric characteristics can be provided. The conductive layer may have the same potential as the gate electrode layer or may have a floating potential or a fixed potential such as GND potential or 0V. By setting the potential of the conductive layer to an appropriate value, the threshold voltage of the transistor can be controlled.

The transistor for the pixel may be formed in direct contact with a pixel electrode or may be electrically connected to the pixel electrode through the connection electrode layer. The connection electrode layer may be formed using a film including an element selected from Al, Cr, Cu, Ta, Ti, Mo, and W as its main component or a stacked film of alloy films containing any of the elements.

The conductive layer provided over the oxide semiconductor layer of the transistor for the driver circuit, a first wiring (also referred to as a terminal or a connection electrode), and a second wiring (also referred to as a terminal or a connection electrode) may be formed using an oxide conductive material such as indium oxide, an alloy of indium oxide and tin oxide, an alloy of indium oxide and zinc oxide, or zinc oxide in the same step as the pixel electrode or may be formed using a metal film such as a film including an element selected from Al, Cr, Cu, Ta, Ti, Mo, and W as its main component or an alloy including any of the elements in the same step as the connection electrode layer.

Light-emitting elements emitting light with a plurality of colors and transistors for pixels, which are electrically connected to the light-emitting elements, may be formed over one substrate, so that a light-emitting device such as a display can be manufactured.

A plurality of light-emitting elements emitting white light may be provided and an optical film, specifically color filters may be provided so as to overlap light-emitting regions of the light-emitting elements, so that a light-emitting display device capable of full-color display can be manufactured. Note that in this specification, the color filter refers not to a whole of a film including color filter layers with three colors (e.g., a red color filter, a blue color filter, and a green color filter) in addition to a black matrix and/or an overcoat but to a color filter with one color.

In order to realize the above structure, one embodiment of the present invention is a method for manufacturing a light-emitting device, including the steps of forming a gate electrode layer using a metal conductive film over a substrate having an insulating surface including regions for a driver circuit portion and a pixel portion, forming a gate insulating layer over the gate electrode layer, forming an oxide semiconductor layer over the gate insulating layer, dehydrating or dehydrogenating the oxide semiconductor layer, without exposure to the air while water and hydrogen are prevented from entering the oxide semiconductor layer again, forming a source electrode layer and a drain electrode layer using a metal conductive film over the oxide semiconductor layer, forming an oxide insulating layer, which is in contact with part of the oxide semiconductor layer, over the oxide semiconductor layer, the source electrode layer, and the drain electrode layer, whereby a transistor for a driver circuit is formed in the driver circuit portion and a transistor for a pixel is formed in the pixel portion, forming a color filter layer over the oxide insulating layer in the pixel portion, forming a first electrode layer over the color filter layer, which is electrically connected to the transistor for the pixel, stacking an EL layer and a second electrode layer in this order over the first electrode layer, and forming a conductive layer over the oxide insulating layer in the driver circuit portion, which overlaps with the gate electrode layer and the oxide semiconductor layer of the transistor for the driver circuit, in the same step as the first electrode layer.

In order to realize the above structure, another embodiment of the present invention is a method for manufacturing a light-emitting device, including the steps of forming a gate electrode layer using a metal conductive film over a substrate having an insulating surface including regions for a driver circuit portion and a pixel portion, forming a gate insulating layer over the gate electrode layer, forming an oxide semiconductor layer over the gate insulating layer, dehydrating or dehydrogenating the oxide semiconductor layer, without exposure to the air while water and hydrogen are prevented from entering the oxide semiconductor layer again, forming a source electrode layer and a drain electrode layer using a metal conductive film over the oxide semiconductor layer, forming an oxide insulating layer, which is in contact with part of the oxide semiconductor layer, over the oxide semiconductor layer, the source electrode layer, and the drain electrode layer, whereby a transistor for a driver circuit is formed in the driver circuit portion and a transistor for a pixel is formed in the pixel portion, forming a color filter layer over the oxide insulating layer in the pixel portion, forming a first electrode layer over the color filter layer, which is electrically connected to the transistor for the pixel through a connection electrode layer, stacking an EL layer and a second electrode layer in this order over the first electrode layer, and forming a conductive layer over the oxide insulating layer in the driver circuit portion, which overlaps with the gate electrode layer and the oxide semiconductor layer of the transistor for the driver circuit, in the same step as the connection electrode layer.

Note that in a photolithography step of the steps of manufacturing a light-emitting device, an etching step may be performed using a mask layer formed using a multi-tone mask which is a light-exposure mask through which light is transmitted so as to have a plurality of intensities.

Since a mask layer formed with the use of a multi-tone mask has a plurality of film thicknesses and can be changed shapes thereof by performing etching on the mask layer, the mask layer can be used in a plurality of etching steps for processing into different patterns. Therefore, a mask layer corresponding at least two kinds or more of different patterns can be formed by one multi-tone mask. Thus, the number of light-exposure masks can be reduced and the number of corresponding photolithography steps can also be reduced, whereby simplification of a process can be realized.

With the above structure, at least one of the above problems can be resolved.

Oxide semiconductor used in this specification is formed into a thin film of a material expressed by $InMO_3(ZnO)_m$ (m>0), and a thin film transistor in which the thin film is used as an oxide semiconductor layer is manufactured. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M In this specification, an oxide semiconductor layer whose composition formula is represented by $InMO_3 (ZnO)_m$ (m>0) where at least Ga is included as M is referred to as an In—Ga—Zn—O-based oxide semiconductor, and a thin film thereof is referred to as an In—Ga—Zn—O-based non-single-crystal film.

As the metal oxide applied to the oxide semiconductor layer, any of the following metal oxide can be applied besides the above: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Alternatively, silicon oxide may be included in the oxide semiconductor layer formed using the above metal oxide.

It can be said that, by heat treatment in an atmosphere of an inert gas such as nitrogen or a rare gas (e.g., argon or helium), the oxide semiconductor layer is changed into an oxygen-deficient oxide semiconductor layer to have lower resistance, i.e., become an N-type ($N^-$-type) oxide semiconductor layer and that then, by formation of an oxide insulating film in contact with the oxide semiconductor layer and heat treatment after the formation, the oxide semiconductor layer is placed in an oxygen-excess state to have higher resistance, i.e., become an i-type oxide semiconductor layer. In addition, it can also be said that solid phase oxidation by which the oxide semiconductor layer is placed in an oxygen-excess state is performed. Thus, it is possible to manufacture and provide a light-emitting device including a highly reliable thin film transistor with favorable electrical characteristics.

As dehydration or dehydrogenation, heat treatment is performed in an atmosphere of an inert gas such as nitrogen or a rare gas (e.g., argon or helium) at a temperature higher than or equal to 400° C. and lower than or equal to 750° C., preferably higher than or equal to 425° C. and lower than or equal to 750° C., so that impurities such as moisture included in the oxide semiconductor layers are reduced. Further, water ($H_2O$) can be prevented from being contained again in the oxide semiconductor layer later.

The heat treatment for dehydration or dehydrogenation is preferably performed in a nitrogen atmosphere with an $H_2O$ concentration of 20 ppm or lower. Alternatively, the heat treatment may be performed in ultra-dry air with an $H_2O$ concentration of 20 ppm or lower.

The oxide semiconductor layer is subjected to heat treatment for dehydration or dehydrogenation under a condition that two peaks of water or at least one peak of water at around 300° C. is not detected even if TDS is performed at up to 450° C. on the oxide semiconductor layer subjected to dehydration or dehydrogenation. Therefore, even when a thin film transistor using the dehydrated or dehydrogenated oxide semiconductor layer is subjected to TDS at a temperature as high as 450° C., at least a peak of water at around 300° C. is not detected.

In addition, it is important not to mix water or hydrogen into the oxide semiconductor layer, without exposure to the air, with the use of the same furnace in which dehydration or dehydrogenation is performed on the oxide semiconductor layer when the temperature is lowered from a heat temperature T at which dehydration or dehydrogenation is performed. When a thin film transistor is formed using an oxide semiconductor layer obtained by changing an oxide semiconductor layer into a low-resistance oxide semiconductor layer, i.e., an N-type (e.g., $N^-$-type) oxide semiconductor layer by dehydration or dehydrogenation and then by changing the low-resistance oxide semiconductor layer into a high-resistance oxide semiconductor layer so as to be an i-type semiconductor layer, the threshold voltage ($V_{th}$) of the thin film transistor can be positive voltage, so that a so-called normally-off switching element can be realized. It is preferable for a semiconductor device (display device) that a channel be formed with positive threshold voltage and as close to 0 V as possible in a thin film transistor. Note that if the threshold voltage of the thin film transistor is negative, the thin film transistor tends to be normally on; in other words, current flows between a source electrode and a drain electrode even when gate voltage is 0 V. In an active matrix display device, the electrical characteristics of a thin film transistor included in a circuit are important and influence the performance of the display device. Among the electrical characteristics of the thin film transistor, the threshold voltage is particularly important. When the threshold voltage is high or negative even when field-effect mobility is high, it is difficult to control the circuit. In the case where a thin film transistor has high threshold voltage and a large absolute value of its threshold voltage, the thin film transistor cannot perform a switching function as the TFT and might be a load when the TFT is driven at low voltage. In the case of an n-channel thin film transistor, it is preferable that a channel be formed and drain current flows after positive voltage is applied as gate voltage. A transistor in which a channel is not formed unless driving voltage is increased and a transistor in which a channel is formed and drain current flows even when negative voltage is applied are unsuitable for a thin film transistor used in a circuit.

A gas atmosphere in which the heat temperature T is decreased may be switched to a gas atmosphere different from that in which the temperature is increased to the heat temperature T. For example, cooling is performed with the furnace used for dehydration or dehydrogenation, which is filled with a high-purity oxygen gas, a high-purity $N_2O$ gas, or ultra-dry air (having a dew point of −40° C. or lower, preferably −60° C. or lower), without exposure to the air.

The electrical characteristics of a thin film transistor are improved using an oxide semiconductor film cooled slowly (or cooled) in an atmosphere which does not contain moisture (having a dew point of −40° C. or lower, preferably −60° C. or lower) after moisture which is contained in a film is reduced by heat treatment for dehydration or dehydrogenation, and high-performance thin film transistors which can be mass-produced are realized.

In this specification, heat treatment in the atmosphere of an inert gas such as nitrogen or a rare gas (e.g., argon or helium) is referred to as heat treatment for dehydration or dehydrogenation. In this specification, for convenience, dehydration or dehydrogenation refers not only to elimination of $H_2$ but also to elimination of H, OH, or the like.

In the case where heat treatment is performed in an atmosphere of an inert gas such as nitrogen or a rare gas (e.g., argon or helium), an oxide semiconductor layer is changed into an oxygen-deficient oxide semiconductor layer by the heat treatment to be a low-resistance oxide semiconductor layer, i.e., an N-type (e.g., N$^-$-type) oxide semiconductor layer.

A region overlapping with the drain electrode layer is formed as a high-resistance drain region (also referred to as an HRD region) which is an oxygen-deficient region. In addition, a region overlapping with the source electrode layer is formed as a high-resistance source region (also referred to as an HRS region) which is an oxygen-deficient region.

In particular, the carrier concentration of the high-resistance drain region is higher than or equal to $1 \times 10^{18}/cm^3$ and is at least higher than the carrier concentration of a channel formation region (lower than $1 \times 10^{18}/cm^3$). Note that the carrier concentration in this specification is carrier concentration obtained by Hall effect measurement at room temperature.

Then, a channel formation region is formed by making at least part of the dehydrated or dehydrogenated oxide semiconductor layer be in an oxygen-excess state so as to be a high-resistance oxide semiconductor layer, i.e., an i-type oxide semiconductor layer. Note that as the treatment for making part of dehydrated or dehydrogenated the oxide semiconductor layer be in an oxygen-excess state, any of the following methods is employed; deposition of an oxide insulating film by sputtering over and in contact with the dehydrated or dehydrogenated oxide semiconductor layer; heat treatment of the oxide insulating film formed over and in contact with the dehydrated or dehydrogenated oxide semiconductor layer; heat treatment of the oxide insulating film formed over and in contact with the dehydrated or dehydrogenated oxide semiconductor layer in an atmosphere including oxygen; heat treatment of the oxide insulating film formed over and in contact with the dehydrated or dehydrogenated oxide semiconductor layer in an inert gas atmosphere, which is followed by cooling treatment in an oxygen atmosphere; and heat treatment of the oxide insulating film formed over and in contact with the dehydrated or dehydrogenated oxide semiconductor layer in an inert gas atmosphere, which is followed by cooling treatment in ultra-dry air (having a dew point of −40° C. or lower, preferably −60° C. or lower).

Further, in order to use at least a part of the oxide semiconductor layer subjected to dehydration or dehydrogenation (a portion overlapping with a gate electrode layer) as the channel formation region, the oxide semiconductor layer can be selectively made in an oxygen-excess state so as to be a high-resistance oxide semiconductor layer, i.e., an i-type oxide semiconductor layer. The channel formation region can be formed in such a manner that a source electrode layer and a drain electrode layer formed using metal electrodes of Ti or the like are formed on and in contact with the oxide semiconductor layer subjected to dehydration or dehydrogenation and exposure regions which do not overlap with the source electrode layer and the drain electrode layer are selectively made to be in an oxygen-excess state. In the case where the exposure regions are selectively made to be in an oxygen-excess state, a first high-resistance source region overlapping with the source electrode layer and a second high-resistance drain region overlapping with the drain electrode layer are formed, and the channel formation region is formed between the first high-resistance source region and the second high-resistance drain region. That is, the channel formation region is formed between the source electrode layer and the drain electrode layer in a self-aligned manner.

Thus, it is possible to manufacture and provide a light-emitting device including a highly reliable thin film transistor with favorable electrical characteristics.

Note that by forming the high-resistance drain region in the oxide semiconductor layer overlapping with the drain electrode layer, reliability can be improved when a drive circuit is formed. Specifically, by forming the high-resistance drain regions, a structure can be obtained in which conductivity can be varied stepwise from the drain electrode layer to the high-resistance drain region and the channel formation region. Therefore, in the case where the thin film transistor operates using the drain electrode layer connected to a wiring for supplying a high power supply potential VDD, the high-resistance drain region serves as a buffer and a high electric field is not applied locally even if the high electric field is applied between the gate electrode layer and the drain electrode layer, so that the withstand voltage of the thin film transistor can be improved.

In addition, the high-resistance drain region and the high-resistance source region are formed in the oxide semiconductor layers overlapping with the drain electrode layer and the source electrode layer, so that reduction in leakage current can be achieved in the channel formation region in forming the driver circuit. In particular, by forming the high-resistance drain region, leakage current between the drain electrode layer and the source electrode layer of the transistor flows through the drain electrode layer, the high-resistance drain region on the drain electrode layer side, the channel formation region, the high-resistance source region on the source electrode layer side, and the source electrode layer in this order. In this case, in the channel formation region, leakage current flowing from the high-resistance drain region on the drain electrode layer side to the channel formation region can be concentrated on the vicinity of an interface between the channel formation region and a gate insulating layer which has high resistance when the transistor is off. Thus, the amount of leakage current in a back channel portion (part of a surface of the channel formation region which is apart from the gate electrode layer) can be reduced.

Further, the high-resistance source region overlapping with the source electrode layer and the high-resistance drain region overlapping with the drain electrode layer overlap with each other with part of the gate electrode layer and the gate insulating layer therebetween depending on the width of the gate electrode layer, and the intensity of an electric field in the vicinity of an end portion of the drain electrode layer can be reduced more effectively.

Further, an oxide conductive layer may be formed between the oxide semiconductor layer and the source and drain electrodes. The oxide conductive layer preferably contains zinc oxide as a component and preferably does not contain indium oxide. For example, zinc oxide, zinc aluminum oxide, zinc aluminum oxynitride, gallium zinc oxide, or the like can be used. The oxide conductive layer also functions as a low-resistance drain (LRD, also referred to as an LRN (low-resistance n-type conductivity)) region. In particular, the carrier concentration of the low-resistance drain region is higher than that of the high-resistance drain region (HRD region), and preferably in the range of $1 \times 10^{20}/cm^3$ to $1 \times 10^{21}/cm^3$ inclusive. The oxide conductive layer is provided between the oxide semiconductor layer and the source and drain electrodes, whereby contact resistance can be reduced and higher speed operation of the transistor can be realized. Accordingly, frequency characteristics of a peripheral circuit (a driver circuit) can be improved.

The oxide conductive layer and the metal layer for forming the source and drain electrodes can be formed in succession.

Further, the above-described first wiring and the second wiring may be formed using a wiring that is formed by stacking a metal material and the same material as that of the oxide conductive layer functioning as the LRN region or the LRD region. By stacking the metal and the oxide conductive layer, coverage at the step such as an overlapping portion of wirings or an opening can be improved; thus, wiring resistance can be lowered. Furthermore, effects of preventing local increase in resistance of a wiring due to migration or the like and preventing disconnection of a wiring can be expected; accordingly, a highly reliable light-emitting device can be provided.

Regarding the above-described connection between the first wiring and the second wiring, when the oxide conductive layer is sandwiched therebetween, it is expected to prevent increase in contact resistance which is caused by formation of an insulating oxide on a metal surface in the connection portion (contact portion); accordingly, a highly reliable light-emitting device can be provided.

Since a thin film transistor is easily broken due to static electricity or the like, a protective circuit for protecting the thin film transistor in the pixel portion is preferably provided over the same substrate for a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

A light-emitting device, which is a semiconductor device, provided with a thin film transistor which includes an oxide semiconductor layer and has excellent electric characteristics and high reliability can be realized.

BRIEF DESCRIPTION OF DRAWINGS

In the accompanying drawings:

FIGS. 2A to 2C illustrate a method for manufacturing a light-emitting device;

FIGS. 11A1 to 11B2 illustrate a light-emitting device;

FIGS. 17A to 17D illustrate a method for manufacturing a light-emitting device;

FIGS. 18A and 18B illustrate a method for manufacturing a light-emitting device;

BEST MODE FOR CARRYING OUT THE INVENTION

Figure 1:
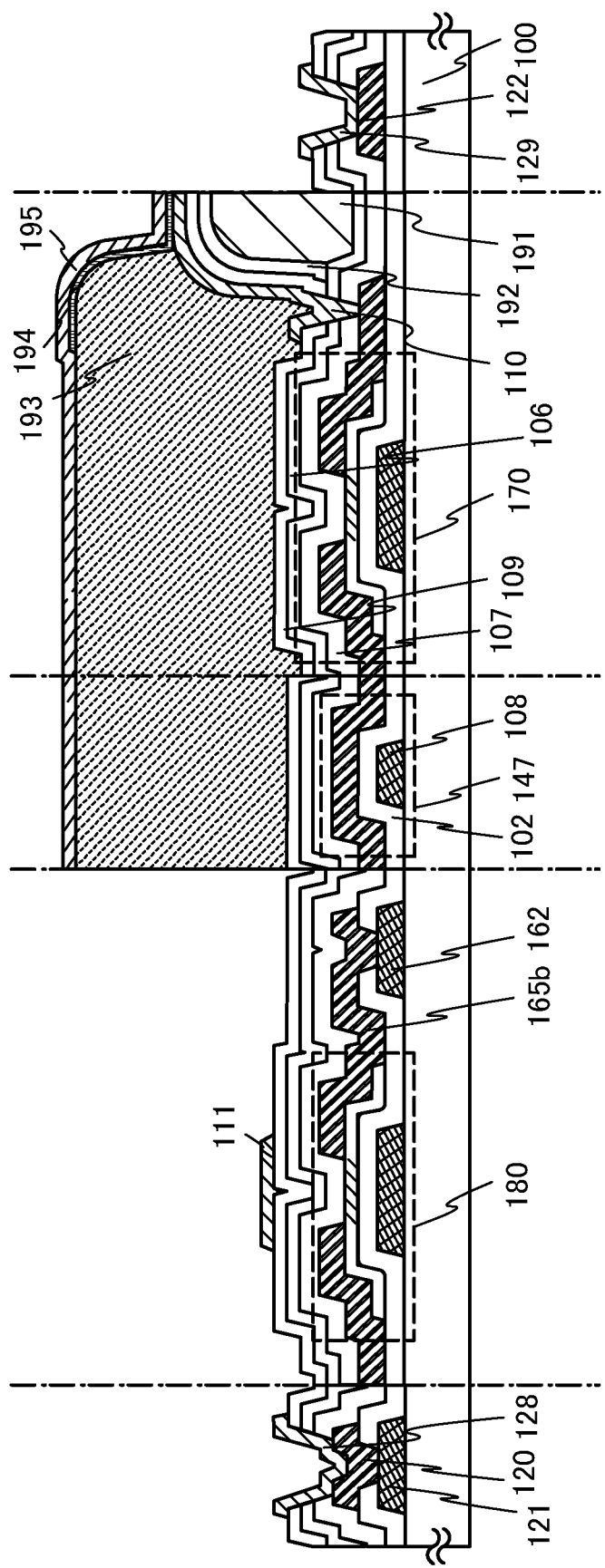
FIG. 1 illustrates a light-emitting device.

Embodiments of the present invention will be described with reference to the accompanying drawings. Note that the present invention is not limited to the following description, and various changes for the modes and details thereof will be apparent to those skilled in the art unless such changes depart from the spirit and the scope of the invention. Therefore, the present invention should not be interpreted as being limited to the following description of the embodiments. In the structures to be given below, the same portions or portions having similar functions are denoted by the same reference numerals in different drawings, and explanation thereof will not be repeated.

Embodiment 1

A light-emitting device including a thin film transistor and a manufacturing process thereof will be described with reference to FIG. 1, FIGS. 2A to 2C, FIGS. 3A to 3C, FIGS. 4A and 4B, FIGS. 5A and 5B, and FIGS. 11A1 to 11B2.

FIG. 1 illustrates a light-emitting device which is one mode of the present invention. The light-emitting device in FIG. 1 is provided, over a substrate 100, with a pixel portion including a light-emitting element, a thin film transistor 170, and a capacitor 147, and a driver circuit portion including a thin film transistor 180. Further, a first terminal 121, a connection electrode 120, and a terminal electrode 128 for connection are provided in a terminal portion for a gate wiring and a second terminal 122 and a terminal electrode 129 for connection are provided in a terminal portion of a source wiring. Moreover, an oxide insulating film 107 and a protective insulating layer 106 are formed over the thin film transistor 180 and the thin film transistor 170.

The light-emitting element is formed using a stack including a first electrode layer 110, an EL layer 194, and a second electrode layer 195. A drain electrode layer of the thin film transistor 170 and the first electrode layer 110 are formed so as to be in contact with each other, so that the light-emitting element and the thin film transistor 170 are electrically connected to each other. In the pixel portion, a color filter layer 191 is formed over the protective insulating layer 106. The color filter layer 191 is covered with an overcoat layer 192, and the protective insulating layer 109 is further formed thereover. The first electrode layer 110 is formed over the protective insulating layer 109. Further, a partition 193 separating between light-emitting elements is formed over the thin film transistor 170.

In the thin film transistor 180 of the driver circuit portion, a conductive layer 111 is provided over a gate electrode layer and a semiconductor layer and a drain electrode layer 165b is electrically connected to a conductive layer 162 which is formed in the same step as the gate electrode layer.

A manufacturing method will be described in detail with reference to FIGS. 2A to 2C, FIGS. 3A to 3C, FIGS. 4A and 4B, FIGS. 5A and 5B, and FIGS. 11A1 to 11B2. FIGS. 2A to 2C, FIGS. 3A to 3C, FIGS. 4A and 4B, and FIGS. 5A and 5B each correspond to a cross-sectional view of the light-emitting device.

A conductive layer is formed over the entire surface of substrate 100 having an insulating surface, and then a first photolithography step is performed to form a resist mask. Then, unnecessary portions of the conductive layer are removed by etching, so that wirings and electrodes (a gate electrode layer 101, a gate electrode layer 161, the conductive layer 162, a capacitor wiring layer 108, and the first terminal 121) are formed. Etching is preferably performed so that end portions of the wirings and electrodes have tapered shapes as illustrated in FIG. 2A, because coverage with a film stacked thereover can be improved. Note that the gate electrode layer 101 and the gate electrode layer 161 are included in the gate wirings.

Although there is no particular limitation on a light-transmitting substrate which can be used as the substrate 100 having an insulating surface, the light-transmitting substrate needs to have heat resistance high enough to withstand at least heat treatment to be performed later. A glass substrate can be used as the substrate 100 having an insulating surface.

In the case where a glass substrate is used and the temperature at which the heat treatment to be performed later is high, a glass substrate whose strain point is greater than or equal to 730° C. is preferably used. As a glass substrate, a glass material such as aluminosilicate glass, aluminoborosilicate glass, or barium borosilicate glass is used, for example. Note that in the case where a larger amount of barium oxide (BaO) than boric acid is contained, a glass substrate is heat-resistant and of more practical use. Therefore, a glass substrate containing BaO and $B_2O_3$ so that the amount of BaO is larger than that of $B_2O_3$ is preferably used.

Note that a substrate formed using an insulator, such as a ceramic substrate, a quartz substrate, or a sapphire substrate, may be used instead of the above glass substrate. Alternatively, crystallized glass or the like may be used. Since the light-emitting device described in this embodiment has a bottom-emission structure in which light is emitted through the surface on the substrate 100 side, a light-transmitting substrate is used as the substrate 100; however, in the case where the light-emitting device has a top-emission structure in which light is emitted through the surface opposite to the substrate 100 side, a non-light-transmitting substrate such as a metal substrate may be used as the substrate 100.

An insulating film serving as a base film may be provided between the substrate 100, and the gate electrode layer 101, the gate electrode layer 161, the conductive layer 162, the capacitor wiring layer 108, and the first terminal 121. The base film has a function of preventing diffusion of an impurity element from the substrate 100, and can be formed as a single-layer structure or a layered structure using one or more of a silicon nitride film, a silicon oxide film, a silicon nitride oxide film, and a silicon oxynitride film.

The gate electrode layer 101, the gate electrode layer 161, the conductive layer 162, the capacitor wiring layer 108, and the first terminal 121 can be formed with a single layer or a stacked layer using a metal material such as molybdenum, titanium, chromium, tantalum, tungsten, aluminum, copper, neodymium, or scandium, or an alloy material which contains any of these materials as a main component.

For example, as a two-layer structure of each of the gate electrode layer 101, the gate electrode layer 161, the conductive layer 162, the capacitor wiring layer 108, and the first terminal 121, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a stacked structure of three layers, a stacked layer of a tungsten layer or a tungsten nitride layer, an alloy of aluminum and silicon or an alloy of aluminum and titanium, and a titanium nitride layer or a titanium layer is preferable.

Next, a gate insulating layer 102 is formed over the gate electrode layer 101, the gate electrode layer 161, the conductive layer 162, the capacitor wiring layer 108, and the first terminal 121 (see FIG. 2A).

The gate insulating layer 102 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed using $SiH_4$, oxygen, and nitrogen as a film formation gas by a plasma CVD method. The thickness of the gate insulating layer 102 is set to greater than or equal to 100 nm and less than or equal to 500 nm. In the case of a stacked structure, for example, a first gate insulating layer having a thickness from 50 nm to 200 nm inclusive and a second gate insulating layer having a thickness from 5 nm to 300 nm inclusive are stacked in this order.

In this embodiment, a silicon nitride layer having a thickness of 200 nm or less is formed by a plasma CVD method as the gate insulating layer 102.

Then, an oxide semiconductor film 130 with a thickness of greater than or equal to 2 nm and less than or equal to 200 nm is formed over the gate insulating layer 102 (see FIG. 2B).

Note that before the oxide semiconductor film is formed by a sputtering method, dust on a surface of the gate insulating layer 102 is preferably removed by reverse sputtering in which an argon gas is introduced and plasma is generated. The reverse sputtering is a method in which voltage is applied to a substrate side with the use of an RF power supply in an argon atmosphere and plasma is generated in the vicinity of the substrate so that a substrate surface is modified. Note that instead of an argon atmosphere, a nitrogen atmosphere, a helium atmosphere, or the like may be used. Alternatively, an argon atmosphere to which oxygen, $N_2O$, or the like is added may be used. Further alternatively, an argon atmosphere to which $Cl_2$, $CF_4$, or the like is added may be used.

The oxide semiconductor film 130 preferably has a thickness as small as 50 nm or less so as to be amorphous even when the heat treatment for dehydration or dehydrogenation follows the formation of the oxide semiconductor film 130. Reduction in thickness can prevent the oxide semiconductor film from being crystallized when heat treatment is performed after the formation of the oxide semiconductor layer.

The oxide semiconductor film 130 is formed using an In—Ga—Zn—O-based non-single-crystal film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, a Sn—O-based oxide semiconductor film, or a Zn—O-based oxide semiconductor film. In this embodiment, the oxide semiconductor film 130 is formed by a sputtering method with the use of an In—Ga—Zn—O-based oxide semiconductor target. Alternatively, the oxide semiconductor film 130 can be formed by a sputtering method under a rare gas (typically argon) atmosphere, an oxygen atmosphere, or an atmosphere of a rare gas (typically argon) and oxygen. When a sputtering method is employed, it is preferable that deposition be performed using a target containing $SiO_2$ of 2 wt % to 10 wt % and SiOx (x>0) which inhibits crystallization be contained in the oxide semiconductor film 130 so as to prevent crystallization at the time of the heat treatment for dehydration or dehydrogenation in a later step.

Here, the oxide semiconductor film is formed using an oxide semiconductor target containing In, Ga, and Zn ($In_2O_3$:$Ga_2O_3$:ZnO=1:1:1 [mol %], In:Ga:Zn=1:1:0.5 [at %]) under conditions where the distance between the substrate and the target is 100 mm, the pressure is 0.2 Pa, and the direct current (DC) power supply is 0.5 kW in an atmosphere containing argon and oxygen (argon:oxygen=30 sccm:20 sccm, the proportion of the oxygen flow is 40%). Note that a pulse direct current (DC) power supply is preferable because dust can be reduced and the film thickness can be uniform. The In—Ga—Zn—O-based non-single-crystal film is formed to have a thickness of 5 nm to 200 nm inclusive. In this embodiment, as the oxide semiconductor film, an In—Ga—Zn—O-based non-single-crystal film having a thickness of 20 nm is formed using the In—Ga—Zn—O-based oxide semiconductor target by a sputtering method.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal film.

In addition, there is a multi-source sputtering apparatus in which a plurality of targets of different materials can be set. With the multi-source sputtering apparatus, films of different materials can be deposited to be stacked in the same chamber, and a film of plural kinds of materials can be deposited by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering method in which a voltage is also applied to a substrate during deposition.

Next, a second photolithography step is performed. A resist mask 137 is formed over the oxide semiconductor film 130, and unnecessary portions of the oxide semiconductor film 130 and the gate insulating layer 102 are removed by etching to form a contact hole 119 reaching the first terminal 121 and a contact hole 118 reaching the conductive layer 162 in the gate insulating layer 102 (see FIG. 2C).

Thus, when the contact holes are formed in the gate insulating layer 102 while the oxide semiconductor film 130 is formed over the entire surface of the gate insulating layer 102, the resist mask is not in direct contact with the surface of the gate insulating layer 102; accordingly, contamination of the surface of the gate insulating layer 102 (e.g., attachment of impurities or the like to the gate insulating layer 102) can be prevented. Thus, a favorable state of the interface between the gate insulating layer 102 and the oxide semiconductor film 130 can be obtained, leading to improvement in reliability.

Alternatively, a resist pattern may be formed directly on the gate insulating layer, and then contact holes may be formed. In such a case, heat treatment is preferably performed to dehydrate, dehydrogenate, or dehydroxylate the surface of the gate insulating film after removal of the resist. For example, impurities such as hydrogen and water included in the gate insulating layer may be removed by heat treatment (at higher than or equal to 400° C. and less than or equal to 750° C.) under an inert gas (e.g., nitrogen, helium, neon, or argon) atmosphere or an oxygen atmosphere.

Next, the resist mask 137 is removed. The oxide semiconductor film 130 is etched with the use of resist masks 135a and 135b formed in a third photolithography step, so that island-shaped oxide semiconductor layers 131 and 132 are formed (see FIG. 3A). Alternatively, the resist masks 135a and 135b used for forming the island-shaped oxide semiconductor layers may be formed by an ink-jet method. When the resist masks are formed by an ink-jet method, the photomask is not used, leading to reduction in manufacturing cost.

Figure 3:
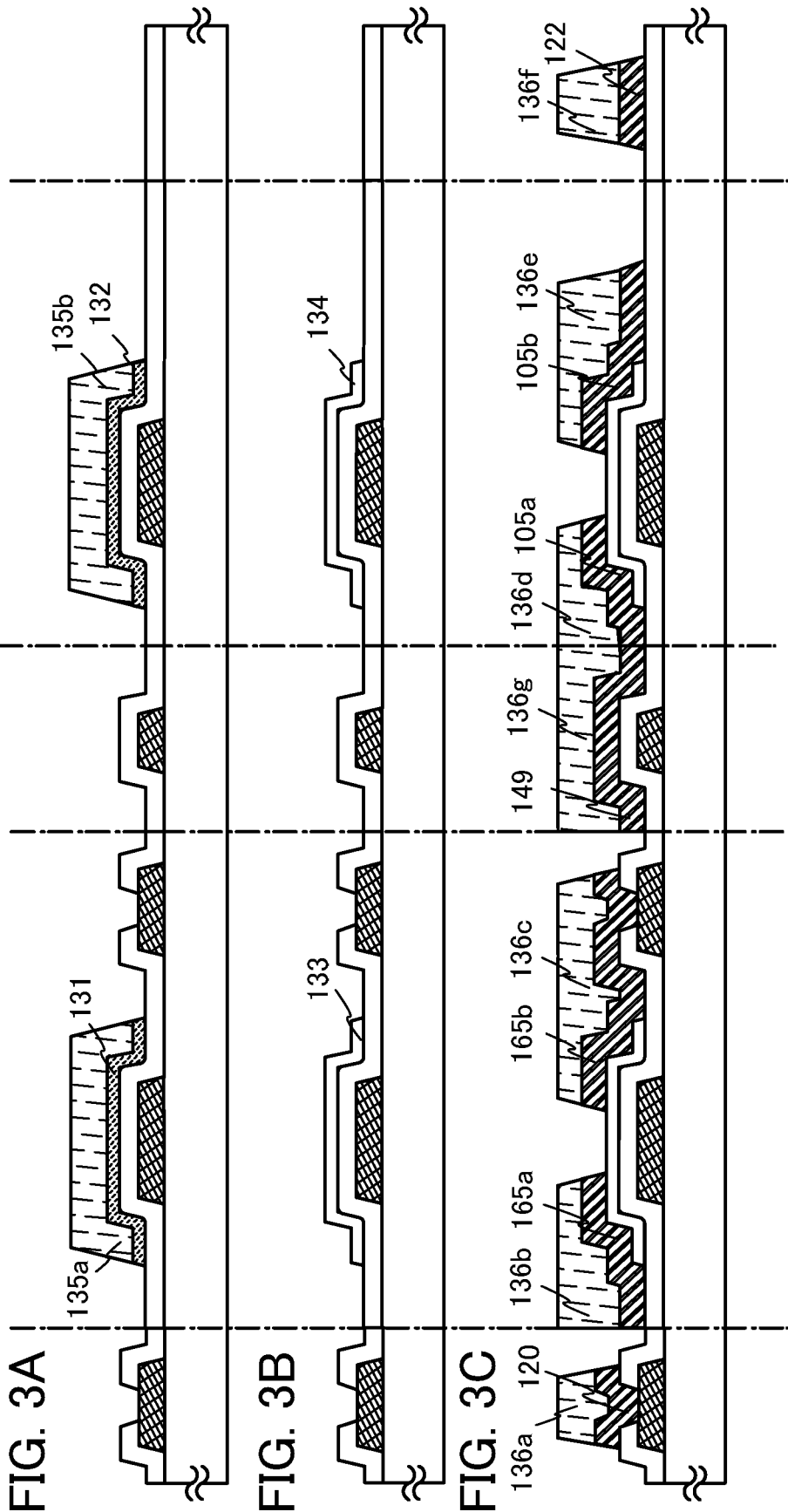
FIGS. 3A to 3C illustrate a method for manufacturing a light-emitting device.

Next, the oxide semiconductor layers 131 and 132 are subjected to dehydration or dehydrogenation, so that dehydrated or dehydrogenated oxide semiconductor layers 133 and 134 are formed (see FIG. 3B). The temperature of first heat treatment at which dehydration or dehydrogenation is performed is higher than or equal to 400° C. and lower than or equal to 750° C., preferably higher than or equal to 425° C. and lower than or equal to 750° C. Note that in the case where the temperature of the first heat treatment is 425° C. or higher, the heat treatment time may be one hour or less, while in the case where the temperature of the first heat treatment is lower than 425° C., the heat treatment time is set to more than one hour. Here, the substrate is introduced into an electric furnace which is one example of heat treatment apparatuses, and the oxide semiconductor layers are subjected to heat treatment in a nitrogen atmosphere. Then, the oxide semiconductor layers are not exposed to air and water and hydrogen are prevented from entering the oxide semiconductor layers again. In this manner, the oxide semiconductor layers 133 and 134 are formed. In this embodiment, slow cooling is performed from the heating temperature T at which the oxide semiconductor layers are dehydrated or dehydrogenated to a temperature low enough to prevent entry of water again, specifically to a temperature that is lower than the heating temperature T by 100° C. or more, in a nitrogen atmosphere in one furnace. Without limitation to a nitrogen atmosphere, dehydration or dehydrogenation may be performed in a rare gas atmosphere such as helium, neon, or argon.

When the oxide semiconductor layers are subjected to heat treatment at 400° C. to 700° C., the dehydration or dehydrogenation of the oxide semiconductor layers can be achieved; thus, water ($H_2O$) can be prevented from being contained again in the oxide semiconductor layers in later steps.

The heat treatment apparatus is not limited to the electric furnace, and, for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In addition, the LRTA apparatus may be provided with not only a lamp but also a device which heats an object to be processed by heat conduction or heat radiation from a heater such as a resistance heater. GRTA is a method of heat treatment using a high-temperature gas. As the gas, an inert gas which does not react with an object to be processed by heat treatment, for example, nitrogen or a rare gas such as argon, is used. The heat treatment may be performed by an RTA method at 600° C. to 750° C. for several minutes.

Note that in the first heat treatment, it is preferable that water, hydrogen and the like be not contained in nitrogen, or the rare gas such as helium, neon, or argon. In particular, the heat treatment which is performed on the oxide semiconductor layers for dehydration or dehydrogenation at 400° C. to 750° C. is preferably performed in a nitrogen atmosphere in which the concentration of $H_2O$ is 20 ppm or lower. Alternatively, it is preferable that nitrogen or a rare gas such as helium, neon, or argon introduced into an apparatus for heat treatment have purity of 6N (99.9999%) or more, preferably, 7N (99.99999%) or more; that is, an impurity concentration is set to 1 ppm or lower, preferably, 0.1 ppm or lower.

In some cases, the oxide semiconductor layers are crystallized to be microcrystalline films or polycrystalline films depending on the conditions of the first heat treatment or the material of the oxide semiconductor layers. For example, the oxide semiconductor layers may crystallize to become microcrystalline semiconductor layers having a degree of crystallization of 90% or more, or 80% or more. Further, depending on the conditions of the first heat treatment and the material of the oxide semiconductor layers, the oxide semiconductor layers may become amorphous oxide semiconductor layers containing no crystalline component.

The first heat treatment of the oxide semiconductor layer can also be performed on the oxide semiconductor film 130 which has not been processed into the island-shaped oxide semiconductor layers 131 and 132. In that case, after the first heat treatment, the substrate is taken out of the heating device and a photolithography step is performed.

The heat treatment for dehydration or dehydrogenation of the oxide semiconductor layers may be performed at any of the following timings: after the oxide semiconductor layers are formed; after a source electrode and a drain electrode are formed over the oxide semiconductor layer; and after a passivation film is formed over the source electrode and the drain electrode.

Further, the step of forming the contact holes 118 and 119 in the gate insulating layer 102 as illustrated in FIG. 2C may be performed after the oxide semiconductor film 130 is subjected to dehydration or dehydrogenation treatment.

Note that this etching step of the oxide semiconductor film is not limited to wet etching and dry etching may also be performed.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the films into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide:ammonia:water=5:2:2), or the like can be used. In addition, ITO07N (produced by KANTO CHEMICAL CO., INC.) may also be used.

The etchant used in the wet etching is removed by cleaning together with the material which is etched off. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are adjusted as appropriate depending on the material so that the material can be etched into a desired shape.

Next, a metal conductive film is formed using a metal material over the oxide semiconductor layers 133 and 134 by a sputtering method or a vacuum evaporation method.

As a material of the metal conductive film, there are an element selected from Al, Cr, Cu, Ta, Ti, Mo, or W, an alloy including the above element, an alloy film in which some of the above elements are combined, and the like. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in this order, and the like can be given. Alternatively, a film, an alloy film, or a nitride film which contains Al and one or a plurality of elements selected from titanium (Ti), tantalum (Ta), tungsten (W), molybdenum (Mo), chromium (Cr), neodymium (Nd), and scandium (Sc) may be used.

In the case where heat treatment is performed after formation of the metal conductive film, the metal conductive film preferably has heat resistance enough to withstand the heat treatment.

Next, a fourth photolithography step is performed. Resist masks 136a, 136b, 136c, 136d, 136e, 136f, and 136g are formed, and unnecessary portions of the metal conductive film are removed by etching, so that a source electrode layer 105a, a drain electrode layer 105b, a source electrode layer 165a, the drain electrode layer 165b, a capacitor electrode layer 149, the connection electrode 120, and the second terminal 122 are formed (see FIG. 3C).

Note that each material and etching conditions are adjusted as appropriate so that the oxide semiconductor layers 133 and 134 are not removed by etching of the metal conductive film.

In this embodiment, a Ti film is used as the metal conductive film, an In—Ga—Zn—O-based oxide semiconductor film is used as the oxide semiconductor layers 133 and 134, and an ammonia hydrogen peroxide solution (a mixture of ammonia, water, and a hydrogen peroxide solution) is used as an etchant.

In the fourth photolithography step, the connection electrode 120 and the second terminal 122, which are formed using the same material as that of the source electrode layers 105a and 165a and the drain electrode layers 105b and 165b, are formed in the respective terminal portions. Note that the second terminal 122 is electrically connected to a source wiring (a source wiring including the source electrode layers 105a and 165a). The connection electrode 120 is formed in contact with the first terminal 121 in the contact hole 119 and electrically connected to the first terminal 121.

Note that the resist masks 136a, 136b, 136c, 136d, 136e, 136f, and 136g used for forming the source electrode layers and the drain electrode layers may be formed by an ink-jet method. When the resist mask is formed by an ink-jet method, the photomask is unnecessary; accordingly, the manufacturing cost can be reduced.

Next, the resist masks 136a, 136b, 136c, 136d, 136e, 136f, and 136g are removed, and an oxide insulating film 107 serving as a protective insulating film in contact with the oxide semiconductor layers 133 and 134 is formed.

At this stage, in the oxide semiconductor layers 133 and 134, there are regions in contact with the oxide insulating film. Among these regions, the regions which are in contact with the oxide insulating film 107 and overlap with the gate electrode layers with the gate insulating layer interposed therebetween are channel formation regions.

The oxide insulating film 107 can be formed to have a thickness of at least 1 nm or more by a sputtering method or the like, as appropriate, which is a method with which impurities such as water and hydrogen are not mixed into the oxide insulating film 107. In this embodiment, a silicon oxide film with a thickness of 300 nm is formed as the oxide insulating film 107 by a sputtering method. The substrate temperature in film formation may be greater than or equal to room temperature and less than or equal to 300° C. In this embodiment, the substrate temperature is at room temperature. The silicon oxide film can be formed by a sputtering method in a rare gas (typically argon) atmosphere, an oxygen atmosphere, or an atmosphere including a rare gas (typically argon) and oxygen. Further, a silicon oxide target or a silicon target can be used as a target. For example, a silicon oxide film can be formed by a sputtering method using a silicon target in an oxygen atmosphere. As the oxide insulating film which is formed in contact with the oxide semiconductor layer whose resistance is reduced, an inorganic insulating film which does not include impurities such as moisture, a hydrogen ion, and OH⁻ and blocks entry of these from the outside is used. Specifically, a silicon oxide film, a silicon nitride oxide film, an aluminum oxide film, or an aluminum oxynitride film is used.

Next, second heat treatment is performed in an inert gas atmosphere or a nitrogen atmosphere at a preferable temperature from 200° C. to 400° C. inclusive, e.g., from 250° C. to 350° C. inclusive. For example, the second heat treatment is performed in a nitrogen atmosphere at 250° C. for one hour. By the second heat treatment, part of the oxide semiconductor layers 133 and 134 which overlaps with the oxide insulating film 107 is heated in the state of being in contact with the oxide insulating film 107.

Through the above-described steps, heat treatment for dehydration or dehydrogenation is performed on the oxide semiconductor layer after deposition to reduce the resistance, and then, part of the oxide semiconductor layer is selectively made to be in an oxygen-excess state.

As a result, in the oxide semiconductor layer 133, a channel formation region 166 overlapping with the gate electrode layer 161 has i-type conductivity, and a high-resistance source region 167a overlapping with the source electrode layer 165a and a high-resistance drain region 167b overlapping with the drain electrode layer 165b are formed in a self-aligned manner; thus, an oxide semiconductor layer 163 is formed. Similarly, in the oxide semiconductor layer 134, a channel formation region 116 overlapping with the gate electrode layer 101 has i-type conductivity, and a high-resistance source region 117a overlapping with the source electrode layer 105a and a high-resistance drain region 117b overlapping with the drain electrode layer 105b are formed in a self-aligned manner; thus, an oxide semiconductor layer 103 is formed.

By formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, reliability in a formed circuit can be improved. Specifically, by formation of the high-resistance drain region 117b, a structure can be employed in which conductivity is varied stepwise from the drain electrode layer 105b to the high-resistance drain region 117b and the channel formation region 116; similarly, by formation of the high-resistance drain region 167b, a structure can be employed in which conductivity is varied stepwise from the drain electrode layer 165b to the high-resistance drain region 167b and the channel formation region 166. Therefore, when the transistors operate in the state of being connected to a wiring which supplies the drain electrode layers 105b and 165b with a high power source potential VDD, the high-resistance drain regions serve as buffers so that a local high electric field is not applied even when a high electric field is applied between the gate electrode layer 101 and the drain electrode layer 105b and between the gate electrode layer 161 and the drain electrode layer 165b; in this manner, the transistors each can have a structure with an increased withstand voltage.

In addition, by formation of the high-resistance drain regions 117b and 167b (or the high-resistance source regions 117a and 167a) in the oxide semiconductor layers 103 and 163 which overlap with the drain electrode layers 105b and 165b (and the source electrode layers 105a and 165a), respectively, leakage current in the channel formation regions 116 and 166 which may flow in a formed circuit can be reduced.

In this embodiment, after a silicon oxide film is formed by a sputtering method as the oxide insulating film 107, heat treatment is performed at 250° C. to 350° C., whereby oxygen enters each of the oxide semiconductor layers from the exposed portion (the channel formation region) of the oxide semiconductor layer between the source region and the drain region, and is diffused thereinto. By formation of the silicon oxide film by a sputtering method, an excessive amount of oxygen can be contained in the silicon oxide film, and oxygen can enter the oxide semiconductor layers and can be diffused thereinto through the heat treatment. Oxygen enters the oxide semiconductor layers and is diffused thereinto, whereby the channel region can have higher resistance (i.e., the channel region can have i-type conductivity). Thus, the thin film transistors can serve as normally-off transistors.

Further, the high-resistance source region or the high-resistance drain region in the oxide semiconductor layer is formed in the entire thickness direction in the case where the thickness of the oxide semiconductor layer is 15 nm or smaller. In the case where the thickness of the oxide semiconductor layer is 30 nm or larger and 50 nm or smaller, in part of the oxide semiconductor layer, that is, in a region in the oxide semiconductor layer which is in contact with the source electrode layer or the drain electrode layer and the vicinity thereof, resistance is reduced and a high-resistance source region or a high-resistance drain region is formed, while a region in the oxide semiconductor layer, which is close to the gate insulating film, can be made to be an I type.

A protective insulating layer may be additionally formed over the oxide insulating film 107. For example, a silicon nitride film is formed by an RF sputtering method. Since an RF sputtering method has high productivity, it is preferably used as a deposition method of the protective insulating layer. As the protective insulating layer, an inorganic insulating film which does not include impurities such as moisture, a hydrogen ion, and OH⁻ and blocks entry of these from the outside is used. Specifically, a silicon nitride film, an aluminum nitride film, a silicon nitride oxide film, an aluminum oxynitride film, or the like is used. In this embodiment, a silicon nitride film is formed as the protective insulating layer 106 (see FIG. 4A).

Through the above steps, the thin film transistor 170 in the pixel portion, the transistor 180 in the driver circuit portion, and the capacitor 147 can be manufactured over the same substrate. Each of the thin film transistors 170 and 180 is a bottom-gate thin film transistor including an oxide semiconductor layer in which a high-resistance source region, a high-resistance drain region, and a channel formation region are formed. Therefore, in each of the thin film transistors 170 and 180, the high-resistance drain region or the high-resistance source region serves as a buffer, so that a local high electric field is not applied even when a high electric field is applied; in this manner, the thin film transistors 170 and 180 can each have a structure with an increased withstand voltage.

The capacitor 147 is formed using the gate insulating layer 102, the capacitor wiring layer 108, and the capacitor electrode layer 149, in which the gate insulating layer 102 in the capacitor portion is used as a dielectric.

By providing the driver circuit and the pixel portion over the same substrate, connection wirings between the driver circuit and an external signal can be shortened; thus, reduction in size and cost of the light-emitting device can be achieved.

Then, the color filter layer 191 is formed over the protective insulating layer 106. As the color filter layer, a green color filter layer, a blue color filter layer, a red color filter layer, or the like can be used, and a green color filter layer, a blue color filter, and a red color filter layer are sequentially formed. Each color filter layer is formed by a printing method, an ink-jet method, an etching method with the use of a photolithography technique, or the like. By providing the color filter layers, alignment of the color filter layers and light-emitting regions of light-emitting elements can be performed without depending on the attachment accuracy of the sealing substrate. In this embodiment, fifth, sixth, and seventh photolithography steps are performed to form a green color filter layer, a blue color filter layer, and a red color filter layer.

Next, an overcoat layer 192 which covers the color filter layers (the green color filter layer, the blue color filter layer, and the red color filter layer) is formed. The overcoat layer 192 is formed using a light-transmitting resin. In this embodiment, the overcoat layer 192 is formed in an eighth photolithography step.

Here, an example in which full color display is performed using three colors of RGB is shown; however, the invention is not particularly limited thereto, and full color display may be performed using four colors of RGBW.

Figure 4:
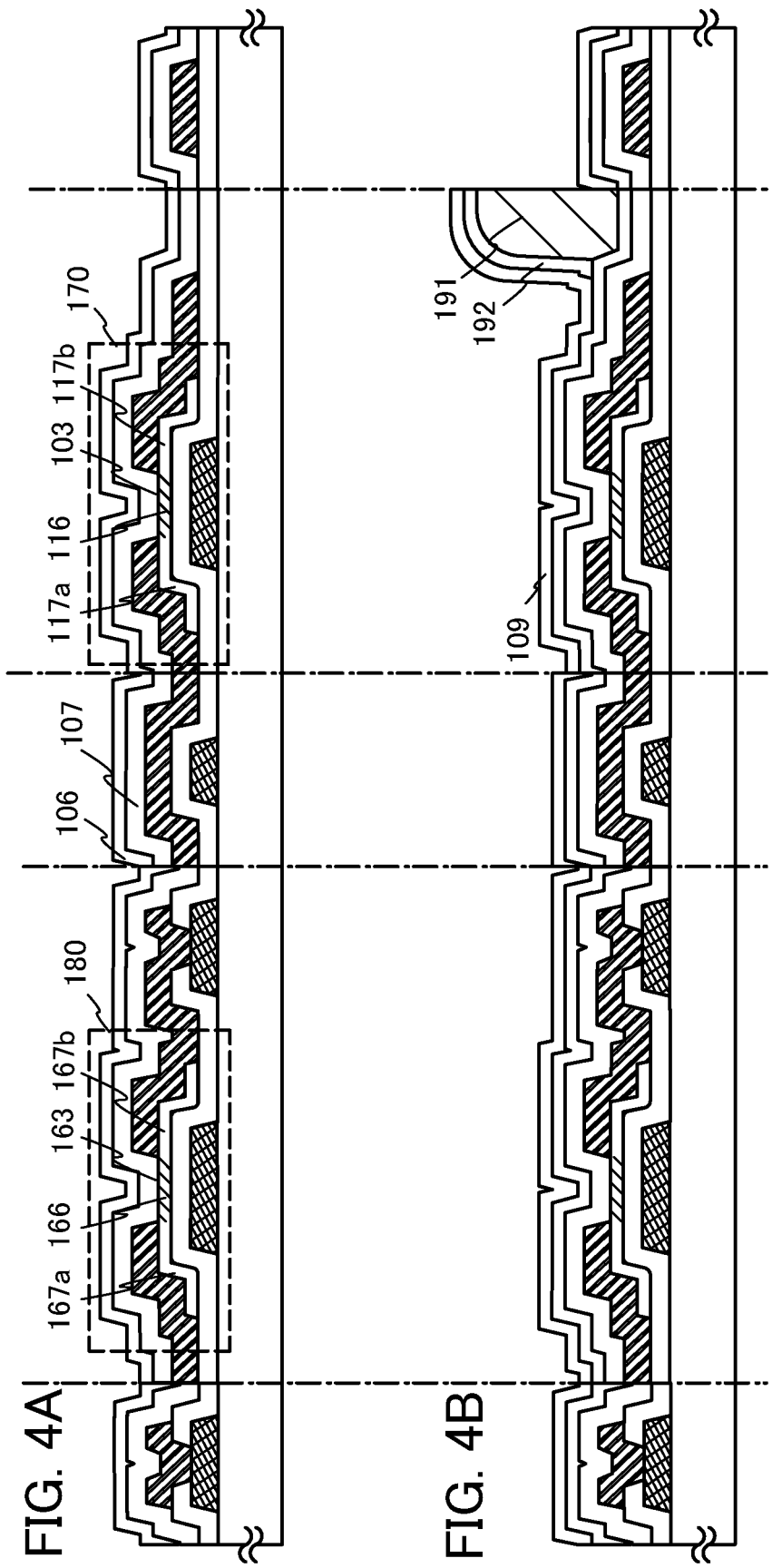
FIGS. 4A and 4B illustrate a method for manufacturing a light-emitting device.
Figure 5:
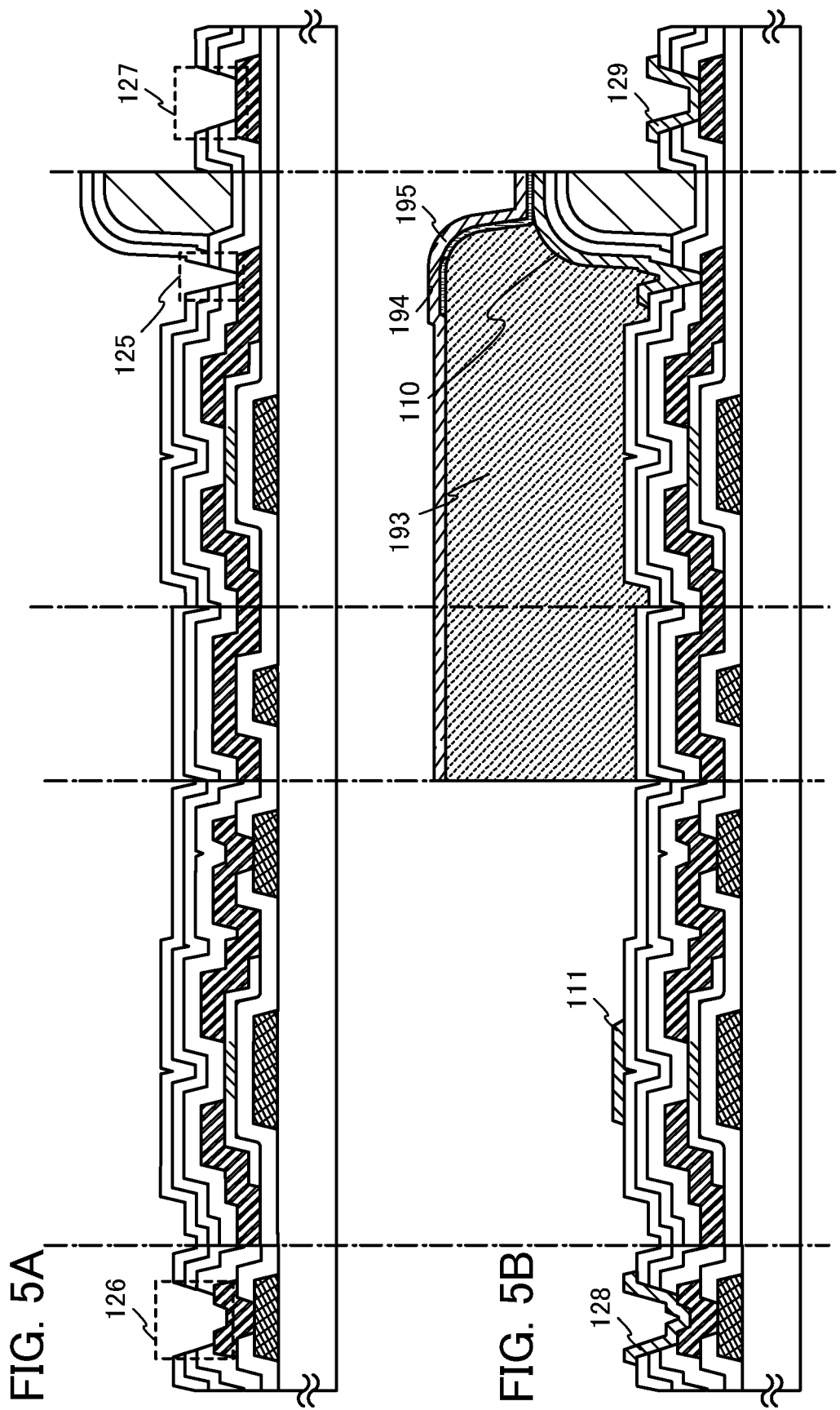
FIGS. 5A and 5B illustrate a method for manufacturing a light-emitting device.

Next, a protective insulating layer 109 which covers the overcoat layer 192 and the protective insulating layer 106 is formed (see FIG. 4B). For the protective insulating layer 109, an inorganic insulating film such as a silicon nitride film, an aluminum nitride film, a silicon nitride oxide film, or an aluminum oxynitride film is used. It is preferable that the protective insulating layer 109 be an insulating film having the same component as that of the protective insulating layer 106 because they can be etched in one step when a contact hole is formed.

Next, a ninth photolithography step is performed. A resist mask is formed, and a contact hole 125 which reaches the drain electrode layer 105b is formed by etching the oxide insulating film 107, the protective insulating layer 106, and the protective insulating layer 109. Then, the resist mask is removed (see FIG. 5A). In addition, a contact hole 127 which reaches the second terminal 122 and a contact hole 126 which reaches the connection electrode 120 are also formed by this etching. Alternatively, a resist mask for forming the contact holes may be formed by an ink-jet method. A photomask is not used when the resist mask is formed by an ink-jet method, leading to reduction in manufacturing cost.

Next, a light-transmitting conductive film is formed. The light-transmitting conductive film is formed using a material such as indium oxide ($In_2O_3$) or an alloy of indium oxide and tin oxide ($In_2O_3$—$SnO_2$, abbreviated to ITO) by a sputtering method, a vacuum evaporation method, or the like. Alternatively, an Al—Zn—O-based non-single-crystal film containing nitrogen (i.e., an Al—Zn—O—N-based non-single-crystal film), a Zn—O-based non-single-crystal film containing nitrogen, or a Sn—Zn—O-based non-single-crystal film containing nitrogen may be used as the material of the light-transmitting conductive film. Note that the composition ratio (atomic %) of zinc in the Al—Zn—O—N-based non-single-crystal film is less than or equal to 47 atomic % and is higher than that of aluminum in the non-single-crystal film; the composition ratio (atomic %) of aluminum in the Al—Zn—O—N-based non-single-crystal film is higher than that of nitrogen in the non-single-crystal film. Such a material is etched with a hydrochloric acid-based solution. However, since a residue is easily left on the substrate particularly in etching ITO, an alloy of indium oxide and zinc oxide ($In_2O_3$—$ZnO$) may be used in order to improve etching processability.

Note that the unit of the composition ratio in the light-transmitting conductive film is atomic percent (atomic %), and the composition ratio is evaluated by analysis using an electron probe X-ray microanalyzer (EPMA).

Next, a tenth photolithography step is performed. A resist mask is formed, and unnecessary portions of the light-transmitting conductive film are removed by etching, so that the first electrode layer 110, the conductive layer 111, and the terminal electrodes 128 and 129 are formed. Then, the resist mask is removed.

The capacitor 147, which includes the gate insulating layer 102 as a dielectric, the capacitor wiring layer 108, and the capacitor electrode layer 149, can also be formed over the same substrate as the driver circuit portion and the pixel portion. In a light-emitting device, the capacitor electrode layer 149 is part of a power supply line, and the capacitor wiring layer 108 is part of a gate electrode layer of a driver TFT.

The terminal electrodes 128 and 129 which are formed in the terminal portion function as electrodes or wirings connected to an FPC. The terminal electrode 128 formed over the first terminal 121 with the connection electrode 120 therebetween is a connection terminal electrode serving as an input terminal for the gate wiring. The terminal electrode 129 formed over the second terminal 122 is a connection terminal electrode serving as an input terminal for the source wiring.

Figure 2:
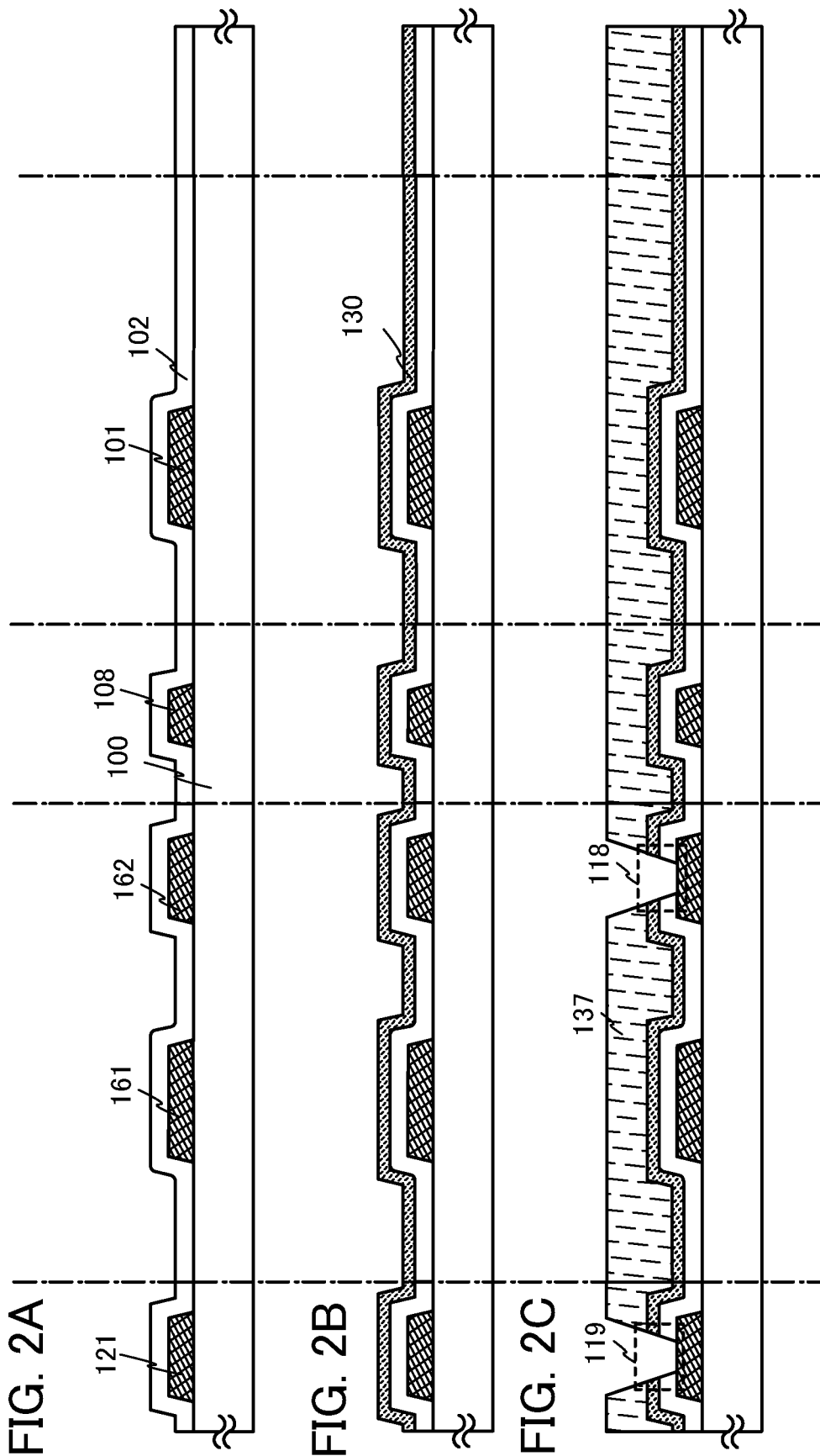

Further, FIGS. 11A1 and 11A2 are a cross-sectional view of a gate wiring terminal portion at this stage and a top view thereof, respectively. FIG. 11A1 is a cross-sectional view taken along line C1-C2 in FIG. 11A2. In FIG. 11A1, a conductive film 155 formed over the oxide insulating film 107 is a connection terminal electrode serving as an input terminal. Furthermore, in FIG. 11A1, in the terminal portion, a first terminal 151 formed using the same material as that of the gate wiring and a connection electrode 153 formed using the same material as that of the source wiring overlap with each other with the gate insulating layer 102 therebetween, and are electrically connected to each other. In addition, the connection electrode 153 and the conductive film 155 are in direct contact with each other through a contact hole provided in the oxide insulating film 107 to form conduction therebetween.

Further, FIGS. 11B1 and 11B2 are a cross-sectional view of a source wiring terminal portion at this stage and a top view thereof, respectively. FIG. 11B1 corresponds to a cross-sectional view taken along line D1-D2 in FIG. 11B2. In FIG. 11B1, the conductive film 155 formed over the oxide insulating film 107 is a connection terminal electrode serving as an input terminal. Furthermore, in FIG. 11B1, in the terminal portion, an electrode 156 formed using the same material as that of the gate wiring is located below and overlapped with the second terminal 150, which is electrically connected to the source wiring, with the gate insulating layer 102 therebetween. The electrode 156 is not electrically connected to the second terminal 150, and a capacitor for preventing noise or static electricity can be formed when the potential of the electrode 156 is set to a potential different from that of the second terminal 150, such as floating, GND, or 0 V. The second terminal 150 is electrically connected to the conductive film 155 with the oxide insulating film 107 therebetween.

A plurality of gate wirings, source wirings, and capacitor wirings are provided depending on the pixel density. In the terminal portion, the first terminal at the same potential as the gate wiring, the second terminal at the same potential as the source wiring, the third terminal at the same potential as the capacitor wiring, and the like are each arranged in plurality. The number of each of the terminals may be any number, and the number of the terminals may be determined by a practitioner as appropriate.

The thin film transistors and the storage capacitor are arranged in matrix in respective pixels so that a pixel portion is formed, which can be used as one of substrates for manufacturing an active matrix display device. In this specification, such a substrate is referred to as an active matrix substrate for convenience.

The conductive layer 111 is provided so as to overlap with the channel formation region 166 in the oxide semiconductor layer, whereby in a bias-temperature stress test (referred to as a BT test) for examining the reliability of a thin film transistor, the amount of change in threshold voltage of the thin film transistor 180 before and after the BT test can be reduced. A potential of the conductive layer 111 may be the same as or different from that of the gate electrode layer 161. The conductive layer 111 can also serve as a second gate electrode layer. Alternatively, the potential of the conductive layer 111 may be GND or 0 V, or the conductive layer 111 may be in a floating state.

Next, a partition 193 is formed so as to cover the periphery of the first electrode layer 110. The partition 193 is formed using a film of an organic resin such as polyimide, acrylic, polyamide, or epoxy, an inorganic insulating film, or a siloxane-based resin.

Note that the siloxane-based resin corresponds to a resin including a Si—O—Si bond formed using a siloxane-based material as a starting material. The siloxane-based resin may include, as a substituent, an organic group (e.g., an alkyl group or an aryl group) or a fluoro group. In addition, the organic group may include a fluoro group.

The partition 193 can be formed using phosphosilicate glass (PSG), borophosphosilicate glass (BPSG), or the like. Note that the partition 193 may be formed by stacking a plurality of insulating films formed using any of these materials.

There is no particular limitation on the method for forming the partition 193. The partition 193 can be formed, depending on the material, with a method such as a sputtering method, an SOG method, a spin coating method, a dipping method, a spray coating method, or a droplet discharge method (e.g., an ink-jet method, screen printing, or offset printing), or with a means such as a doctor knife, a roll coater, a curtain coater, or a knife coater. Further, other insulating layers used in the light-emitting device may be formed using the materials and the methods which are shown as examples of the materials and the methods of the partition 193.

It is particularly preferable that the partition 193 be formed using a photosensitive resin material to have an opening portion over the first electrode layer 110 so that a sidewall of the opening portion is formed as a tilted surface with continuous curvature. When the partition 193 is formed using a photosensitive resin material, a step for forming a resist mask can be omitted. In this embodiment, an eleventh photolithography steps is performed, so that the partition 193 is formed.

The EL layer 194 is formed over the first electrode layer 110 and the second electrode layer 195 is formed over the EL layer 194, whereby a light-emitting element is formed. The second electrode layer 195 is electrically connected to a common potential line. Any of a variety of materials can be used for the second electrode layer 195. Specifically, the second electrode layer 195 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, an aluminum film is used as the second electrode layer 195.

Through these eleven photolithography steps with the use of the eleven photomasks, the light-emitting device of this embodiment illustrated in FIG. 1 can be manufactured, which includes the driver circuit portion including the thin film transistor 180, the pixel portion including the thin film transistor 170 and the light-emitting element, the capacitor 147 including the storage capacitor, and the external extraction terminal portions.

Further, in this embodiment, an example where the contact holes in the oxide insulating film 107, the protective insulating layer 106, and the protective insulating layer 109 are formed in one photolithography step is described; however, the contact holes may be formed in a plurality of photolithography steps with different photomasks. For example, the fifth photolithography step may be performed to form the contact holes in the oxide insulating film 107 and the protective insulating layer 106 serving as interlayer insulating layers, the sixth to ninth photolithography steps may be performed to form the RGB color filter layers and the overcoat layer, and then the contact holes may be formed in the protective insulating layer 109 in the tenth photolithography step. In this case, the number of photolithography steps and photomasks increases by one; accordingly, the light-emitting device is formed through the twelve photolithography steps with twelve photomasks.

Note that in the above-described photolithography steps, an etching step may be performed with the use of a mask layer formed using a multi-tone mask which is a light-exposure mask through which light is transmitted so as to have a plurality of intensities.

Since a mask layer formed with the use of a multi-tone mask has a plurality of film thicknesses and can be changed shapes thereof by performing etching on the mask layer, the mask layer can be used in a plurality of etching steps for processing into different patterns. Therefore, a mask layer corresponding at least two kinds or more of different patterns can be formed by one multi-tone mask. Thus, the number of light-exposure masks can be reduced and the number of corresponding photolithography steps can also be reduced, whereby simplification of a process can be realized.

Further, when a light-emitting device is manufactured, a power supply line electrically connected to the source electrode layer of the driver TFT is provided. The power supply line intersects with a gate wiring and a source wiring and is formed using the same material and in the same step as the gate electrode layer.

Further, in the case where a light-emitting device is manufactured, one electrode of the light-emitting element is electrically connected to the drain electrode layer of the driver TFT, and a common potential line which is electrically connected to the other electrode of the light-emitting element is provided. Note that the common potential line can be formed using the same material and step as those of the gate electrode layer.

Further, in the case where a light-emitting device is manufactured, a plurality of thin film transistors is provided in one pixel, and a connection portion which connects the gate electrode layer of one thin film transistor to the drain electrode layer of the other thin film transistor is provided.

The use of an oxide semiconductor for a thin film transistor leads to reduction in manufacturing cost. In particular, an oxide insulating film is formed in contact with an oxide semiconductor layer by the above method, whereby a thin film transistor having stable electric characteristics can be manufactured and provided. Therefore, a light-emitting device which includes highly reliable thin film transistors having excellent electric characteristics can be provided.

The channel formation region in the semiconductor layer is a high-resistance region; thus, electric characteristics of the thin film transistor are stabilized and increase in off current or the like can be prevented. Therefore, a light-emitting device including a highly reliable thin film transistor having favorable electric characteristics can be provided.

Since a thin film transistor is easily broken due to static electricity or the like, a protective circuit is preferably provided over the same substrate as the pixel portion or the drive circuit. The protective circuit is preferably formed with a non-linear element including an oxide semiconductor layer. For example, protective circuits are provided between the pixel portion and a scan line input terminal and between the pixel portion and a signal line input terminal. In this embodiment, a plurality of protective circuits are provided so that the pixel transistor and the like are not broken when surge voltage due to static electricity or the like is applied to a scan line, a signal line, and a capacitor bus line. Therefore, the protective circuit is formed so as to release charge to a common wiring when surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same step as the thin film transistor 170 in the pixel portion, and can be made to have the same properties as a diode by connecting a gate terminal to a drain terminal of the non-linear element.

This embodiment can be implemented in appropriate combination with the structures described in the other embodiments.

Embodiment 2

In this embodiment, an example in which oxide conductive layers are provided as a source region and a drain region between the oxide semiconductor layer and the source and drain electrode layers in Embodiment 1 will be described with reference to FIGS. 6A to 6D and FIGS. 7A and 7B. Therefore, part of this embodiment can be performed in a manner similar to that of Embodiment 1; thus, repetitive description of the same portions as or portions having functions similar to those in Embodiment 1 and steps for forming such portions will be omitted. Since FIGS. 6A to 6D and FIGS. 7A and 7B are the same as FIG. 1, FIGS. 2A to 2C, FIGS. 3A to 3C, FIGS. 4A and 4B, and FIGS. 5A and 5B except for part of steps, the same portions are denoted by the same reference numerals and detailed description of the same portions is omitted.

Figure 6:
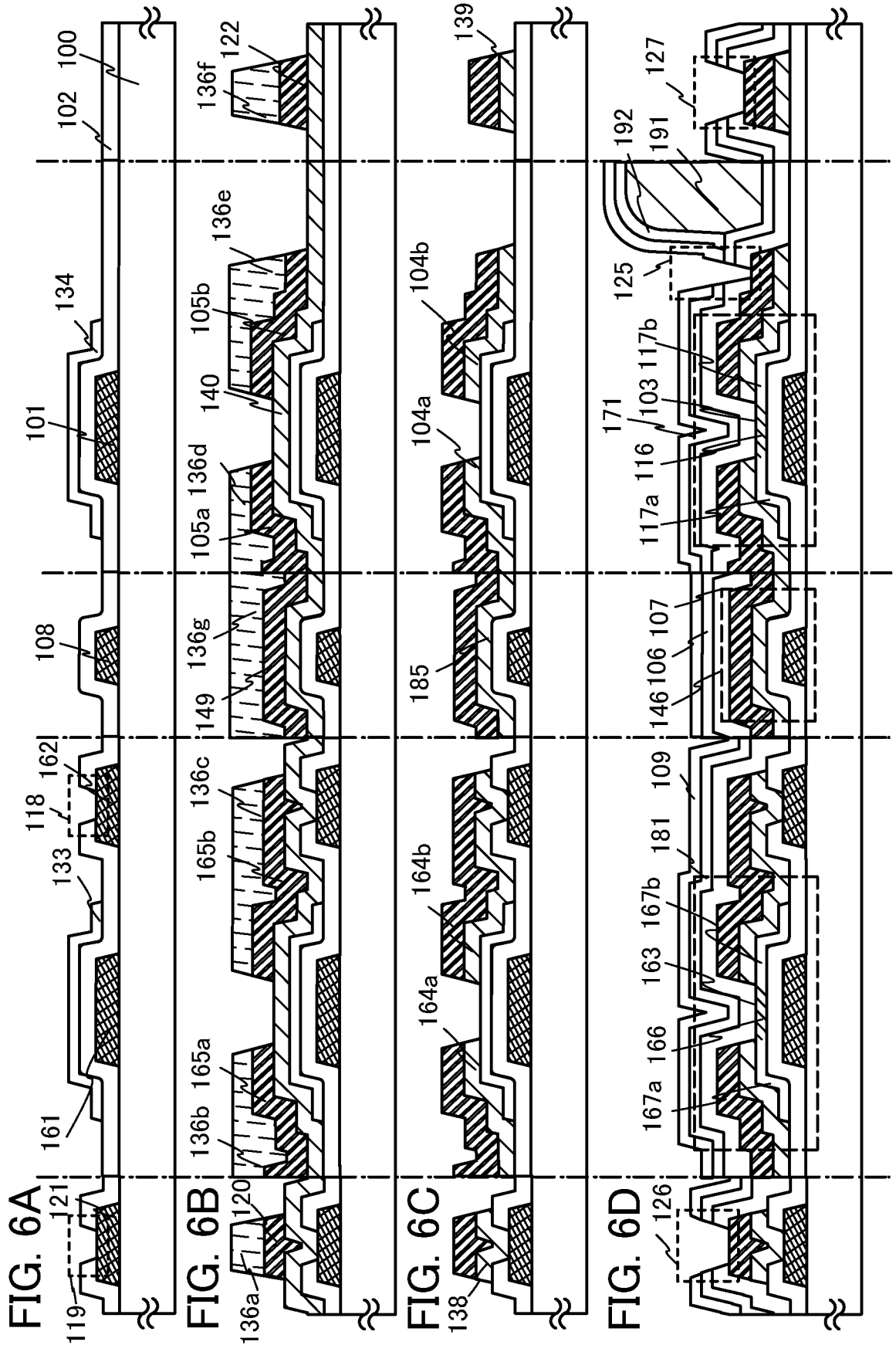
FIGS. 6A to 6D illustrate a method for manufacturing a light-emitting device.
Figure 7:
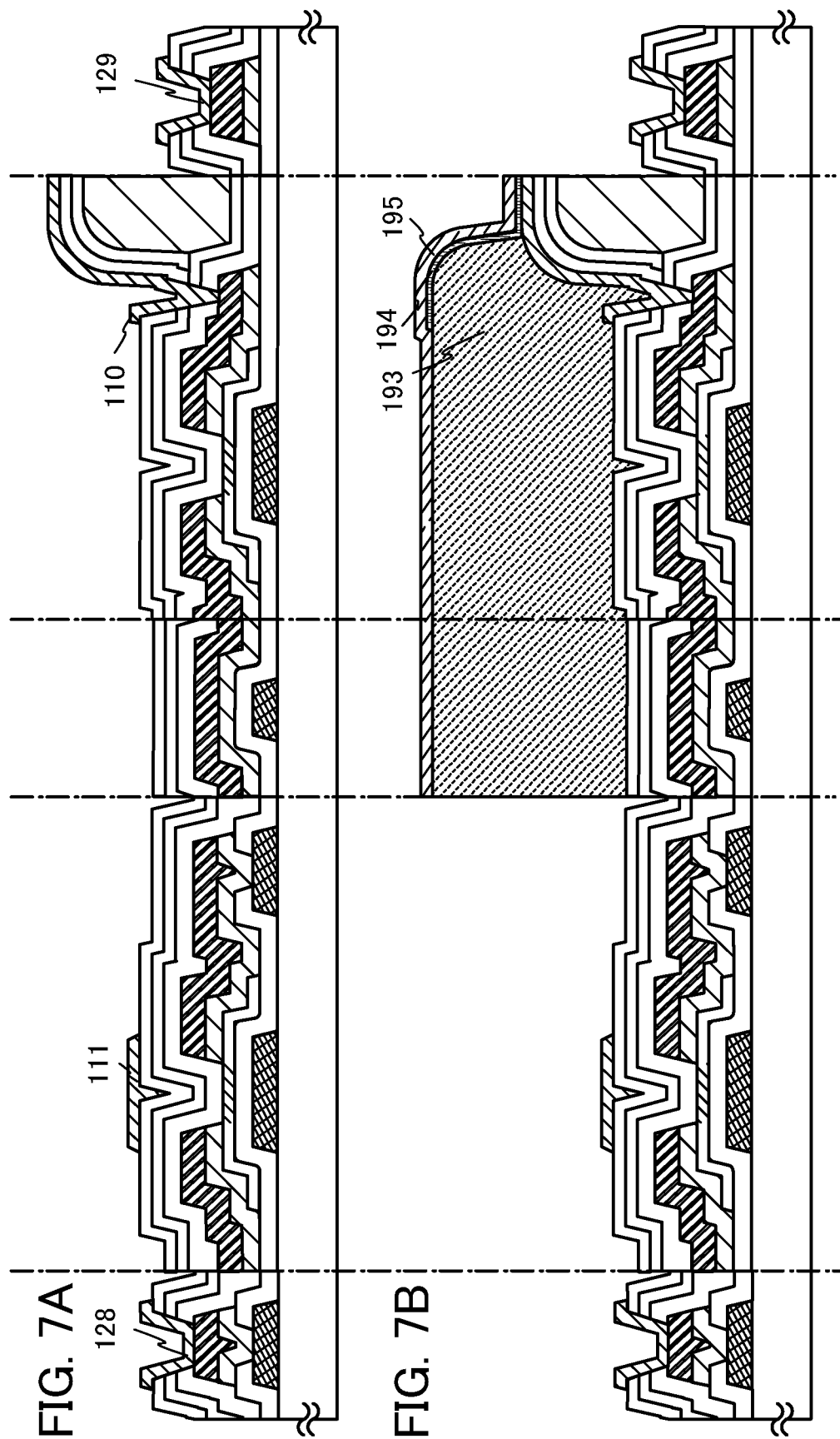
FIGS. 7A and 7B illustrate a method for manufacturing a light-emitting device.

First, the steps up to and including the step in FIG. 3B in Embodiment 1 are performed in accordance with Embodiment 1. FIG. 6A illustrates the same step as FIG. 3B.

An oxide conductive film 140 is formed over the dehydrated or dehydrogenated oxide semiconductor layers 133 and 134, and a metal conductive film formed using a metal conductive material is stacked over the oxide conductive film 140.

As a deposition method of the oxide conductive film 140, a sputtering method, a vacuum evaporation method (e.g., an electron beam evaporation method), an arc discharge ion plating method, or a spray method is used. A material of the oxide conductive film 140 preferably contains zinc oxide as a component and preferably does not contain indium oxide. For such an oxide conductive film 140, zinc oxide, aluminum zinc oxide, aluminum zinc oxynitride, gallium zinc oxide, or the like can be used. The thickness of the oxide conductive film is selected as appropriate in the range of 50 nm to 300 nm inclusive. In addition, in the case where a sputtering method is used, it is preferable that deposition be performed using a target containing $SiO_2$ at 2 wt % to 10 wt %, and $SiO_x$ (x>0), which inhibits crystallization, be contained in the oxide conductive film so that crystallization is suppressed when the heat treatment for dehydration or dehydrogenation is performed in a later step.

Next, a fourth photolithography step is performed. The resist masks 136a, 136b, 136c, 136d, 136e, 136f, and 136g are formed, and unnecessary portions of the metal conductive film are removed by etching, so that the source electrode layer 105a, the drain electrode layer 105b, the source electrode layer 165a, the drain electrode layer 165b, the capacitor electrode layer 149, the connection electrode 120, and the second terminal 122 are formed (see FIG. 6B).

Note that each material and etching conditions are adjusted as appropriate so that the oxide conductive film 140 and the oxide semiconductor layers 133 and 134 are not removed in etching of the metal conductive film.

Next, the resist masks 136a, 136b, 136c, 136d, 136e, 136f, and 136g are removed, and the oxide conductive film 140 is etched using the source electrode layer 105a, the drain electrode layer 105b, the source electrode layer 165a, and the drain electrode layer 165b as masks, so that oxide conductive layers 164a and 164b, oxide conductive layers 104a and 104b, and a capacitor electrode layer 185 are formed (see FIG. 6C). The oxide conductive film 140 containing zinc oxide as a component can be easily etched with an alkaline solution such as a resist stripping solution, for example. In addition, oxide conductive layers 138 and 139 are also formed in respective terminal portions in this step.

Etching treatment for dividing the oxide conductive layer to form channel formation regions is performed by utilizing the difference in etching rates between the oxide semiconductor layers and the oxide conductive layer. The oxide conductive layer over the oxide semiconductor layers is selectively etched utilizing a higher etching rate of the oxide conductive film as compared to that of the oxide semiconductor layers.

Therefore, removal of the resist masks 136a, 136b, 136c, 136d, 136e, 136f, and 136g is preferably performed by ashing. In the case of etching with a stripping solution, etching conditions (the kind of the etchant, the concentration, and the etching time) are adjusted as appropriate so that the oxide conductive film 140 and the oxide semiconductor layers 133 and 134 are not etched excessively.

As described in this embodiment, in the case where the island-shaped oxide semiconductor layers are formed by etching, the oxide conductive film and the metal conductive film are stacked thereover, and etching is performed using the same masks to form a wiring pattern including source electrode layers and drain electrode layers, oxide conductive films can be left under the wiring pattern of the metal conductive film.

At the contact portion between the gate wiring (the conductive layer 162) and the source wiring (the drain electrode layer 165b), the oxide conductive layer 164b is formed below the source wiring. The oxide conductive layer 164b serves as a buffer, the resistance is only the series resistance depending on the thickness of the oxide conductive layer, and further the oxide conductive layer 164b does not form an insulating oxide with metal, which is preferable.

Next, the oxide insulating film 107 serving as a protective insulating film is formed in contact with the oxide semiconductor layer 133 and 134. In this embodiment, a silicon oxide film with a thickness of 300 nm is deposited as the oxide insulating film 107 by a sputtering method.

Next, second heat treatment is performed in an inert gas atmosphere or a nitrogen atmosphere at a preferable temperature from 200° C. to 400° C. inclusive, e.g., from 250° C. to 350° C. inclusive. For example, the second heat treatment is performed in a nitrogen atmosphere at 250° C. for one hour. By the second heat treatment, part of the oxide semiconductor layers 133 and 134 which overlaps with the oxide insulating film 107 is heated in the state of being in contact with the oxide insulating film 107.

Through the above-described steps, heat treatment for dehydration or dehydrogenation is performed on the oxide semiconductor layer after deposition to reduce the resistance, and then, part of the oxide semiconductor layer is selectively made to be in an oxygen-excess state.

As a result, in the oxide semiconductor layer 133, a channel formation region 166 overlapping with the gate electrode layer 161 has i-type conductivity, and a high-resistance source region 167a overlapping with the source electrode layer 165a and the oxide conductive layer 164a and a high-resistance drain region 167b overlapping with the drain electrode layer 165b and the oxide conductive layer 164b are formed in a self-aligned manner; thus, an oxide semiconductor layer 163 is formed. Similarly, in the oxide semiconductor layer 134, a channel formation region 116 overlapping with the gate electrode layer 101 has i-type conductivity, and a high-resistance source region 117a overlapping with the source electrode layer 105a and the oxide conductive layer 104a and a high-resistance drain region 117b overlapping with the drain electrode layer 105b and the oxide conductive layer 164b are formed in a self-aligned manner; thus, an oxide semiconductor layer 103 is formed.

The oxide conductive layers 104b and 164b which are disposed between the oxide semiconductor layers 103 and 163 and the drain electrode layers 105b and 165b formed using a metal material each also function as a low-resistance drain (LRD, also referred to as an LRN (low-resistance n-type conductivity)) region. Similarly, the oxide conductive layers 104a and 164a which are disposed between the oxide semiconductor layers 103 and 163 and the source electrode layers 105a and 165a formed using a metal material each also function as a low-resistance source (LRS, also referred to as an LRN (low-resistance n-type conductivity)) region. With the structure including the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (the HRD region) and preferably in a range of $1 \times 10^{20}/cm^3$ or higher and $1 \times 10^{21}/cm^3$ or lower.

Through the above steps, a thin film transistor 171 in the pixel portion and a transistor 181 in the driver circuit portion can be manufactured over the same substrate. Each of the thin film transistors 171 and 181 is a bottom-gate thin film transistor including an oxide semiconductor layer in which a high-resistance source region, a high-resistance drain region, and a channel formation region are formed. Therefore, in each of the thin film transistors 171 and 181, the high-resistance drain region or the high-resistance source region serves as a buffer, so that a local high electric field is not applied even when a high electric field is applied; in this manner, the thin film transistors 171 and 181 can each have a structure with an increased withstand voltage.

In the capacitor portion, a capacitor 146 is formed from a stack of the capacitor wiring layer 108, the gate insulating layer 102, the capacitor electrode layer 185 formed in the same step as the oxide conductive layer 104b, and the capacitor electrode layer 149 formed in the same step as the drain electrode layer 105b.

Next, the protective insulating layer 106 is formed over the oxide insulating film 107 and the color filter layer 191 is formed over the protective insulating layer 106 in the pixel portion. The overcoat layer 192 is formed so as to cover the color filter layer 191 and the protective insulating layer 109 is formed so as to cover the protective insulating layer 106 and the overcoat layer 192.

Next, a ninth photolithography step is performed in a similar manner in Embodiment 1. A resist mask is formed, and the contact hole 125 which reaches the drain electrode layer 105b is formed by etching the oxide insulating film 107, the protective insulating layer 106, and the protective insulating layer 109. Then, the resist mask is removed (see FIG. 6D). In addition, the contact hole 127 which reaches the second terminal 122 and the contact hole 126 which reaches the connection electrode 120 are also formed by this etching.

Next, a light-transmitting conductive film is formed, and a tenth photolithography step is performed. A resist mask is formed and unnecessary portions of the light-transmitting conductive film are removed by etching to form the first electrode layer 110, the conductive layer 111, and the terminal electrodes 128 and 129. Then, the resist masks are removed (see FIG. 7A).

As in Embodiment 1, the partition 193 is formed in an eleventh photolithography step. The EL layer 194 and the second electrode layer 195 are stacked over the first electrode layer 110, so that the light-emitting device of this embodiment which includes a light-emitting element is manufactured (see FIG. 7B).

When the oxide conductive layers are provided between the oxide semiconductor layer and the source and drain electrode layers as the source region and the drain region, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared to the contact between a metal electrode (e.g., Ti) and an oxide semiconductor layer.

There has been a problem in that molybdenum (Mo) which is used as a part of a wiring material (e.g., Mo/Al/Mo) in a light-emitting device has high contact resistance with an oxide semiconductor layer. This is because Mo is less likely to be oxidized and has a weaker effect of extracting oxygen from the oxide semiconductor layer as compared to Ti, and a contact interface between Mo and the oxide semiconductor layer is not changed to have an n-type conductivity. However, even in such a case, the contact resistance can be reduced by interposing an oxide conductive layer between the oxide semiconductor layer and source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length L can be set as small as 0.1 μm to 2 μm inclusive; in this way, operation speed can be increased.

This embodiment can be implemented in appropriate combination with the structures described in the other embodiments.

Embodiment 3

In this embodiment, another example in which oxide conductive layers are provided as a source region and a drain region between the oxide semiconductor layer and the source and drain electrode layers in Embodiment 1 or 2 will be described with reference to FIGS. 8A to 8D and FIGS. 9A and 9B. Therefore, part of this embodiment can be performed in a manner similar to that of Embodiment 1 or 2; thus, repetitive description of the same portions as or portions having functions similar to those in Embodiment 1 or 2 and steps for forming such portions will be omitted. Since FIGS. 8A to 8D and FIGS. 9A and 9B are the same as FIG. 1, FIGS. 2A to 2C, FIGS. 3A to 3C, FIGS. 4A and 4B, FIGS. 5A and 5B, FIGS. 6A to 6D, and FIGS. 7A and 7B except for part of steps, the same portions are denoted by the same reference numerals and detailed description of the same portions is omitted.

First, in accordance with Embodiment 1, a metal conductive film is formed over the substrate 100, and the metal conductive film is etched using a resist mask formed in a first photolithography step, so that the first terminal 121, the gate electrode layer 161, the conductive layer 162, the gate electrode layer 101, and the capacitor wiring layer 108 are formed.

Next, the gate insulating layer 102 is formed over the first terminal 121, the gate electrode layer 161, the conductive layer 162, the gate electrode layer 101, and the capacitor wiring layer 108, and then an oxide semiconductor film and an oxide conductive film are stacked. The gate insulating layer, the oxide semiconductor film, and the oxide conductive film can be formed in succession without being exposed to air.

Resist masks are formed over the oxide conductive film in a second photolithography step. The gate insulating layer, the oxide semiconductor film, and the oxide conductive film are etched using the resist masks to form the contact hole 119 which reaches the first terminal 121 and the contact hole 118 which reaches the conductive layer 162.

The resist masks formed in the second photolithography step are removed, and resist masks are newly formed over the oxide conductive film in a third photolithography step. With the use of the resist masks in the third photolithography step, island-shaped oxide semiconductor layers and island-shaped oxide conductive layers are formed.

When the contact holes are formed in the gate insulating layer in the state where the oxide semiconductor film and the oxide conductive film are stacked over the entire surface of the gate insulating layer in such a manner, the resist masks are not directly in contact with the surface of the gate insulating layer; accordingly, contamination of the surface of the gate insulating layer (e.g., attachment of impurities or the like to the gate insulating layer) can be prevented. Thus, a favorable state of the interfaces between the gate insulating layer and the oxide semiconductor film and between the gate insulating layer and the oxide conductive film can be obtained, whereby reliability can be improved.

Next, heat treatment for dehydration or dehydrogenation is performed in the state where the oxide semiconductor layers and the oxide conductive layers are stacked. By the heat treatment at 400° C. to 700° C., the dehydration or dehydrogenation of the oxide semiconductor layers can be achieved; thus, water ($H_2O$) can be prevented from being contained again in the oxide semiconductor layers in later steps.

As long as a substance which inhibits crystallization such as silicon oxide is not contained in the oxide conductive layers, the oxide conductive layers are crystallized through this heat treatment. Crystal of the oxide conductive layers grow in a columnar shape with respect to a base surface. Accordingly, when the metal conductive film formed over the oxide conductive layers is etched in order to form a source electrode layer and a drain electrode layer, formation of an undercut can be prevented.

Further, by the heat treatment for dehydration or dehydrogenation of the oxide semiconductor layers, conductivity of the oxide conductive layers can be improved. Note that only the oxide conductive layers may be subjected to heat treatment at a temperature lower than that for the oxide semiconductor layers.

The first heat treatment of the oxide semiconductor layers and the oxide conductive layers can also be performed on the oxide semiconductor film and the oxide conductive film which have not been processed into island-shaped oxide semiconductor layers and the island-shaped oxide conductive layers. In that case, after the first heat treatment, the substrate is taken out of the heating device and a photolithography step is performed.

Figure 8:
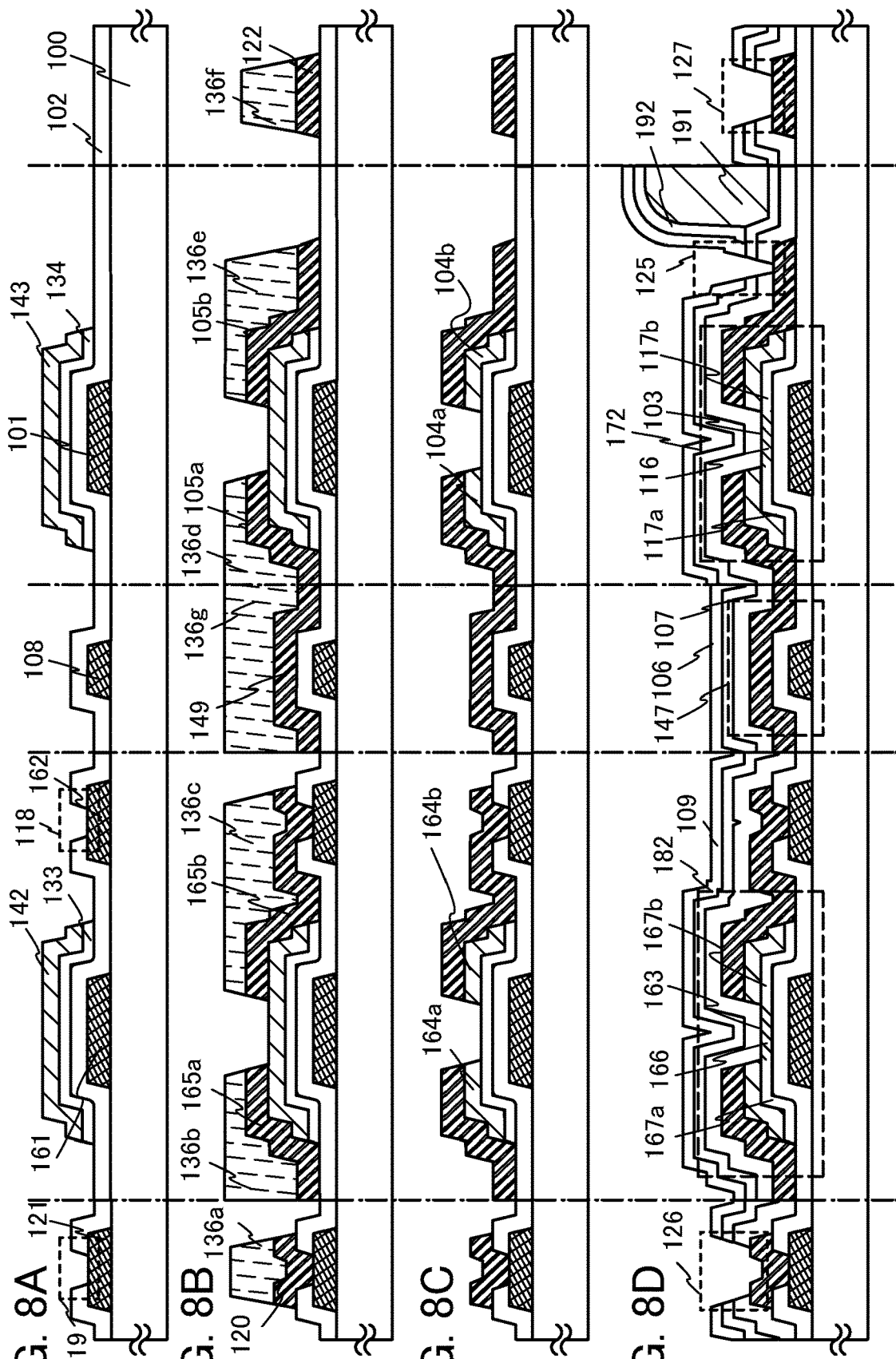
FIGS. 8A to 8D illustrate a method for manufacturing a light-emitting device.
Figure 9:
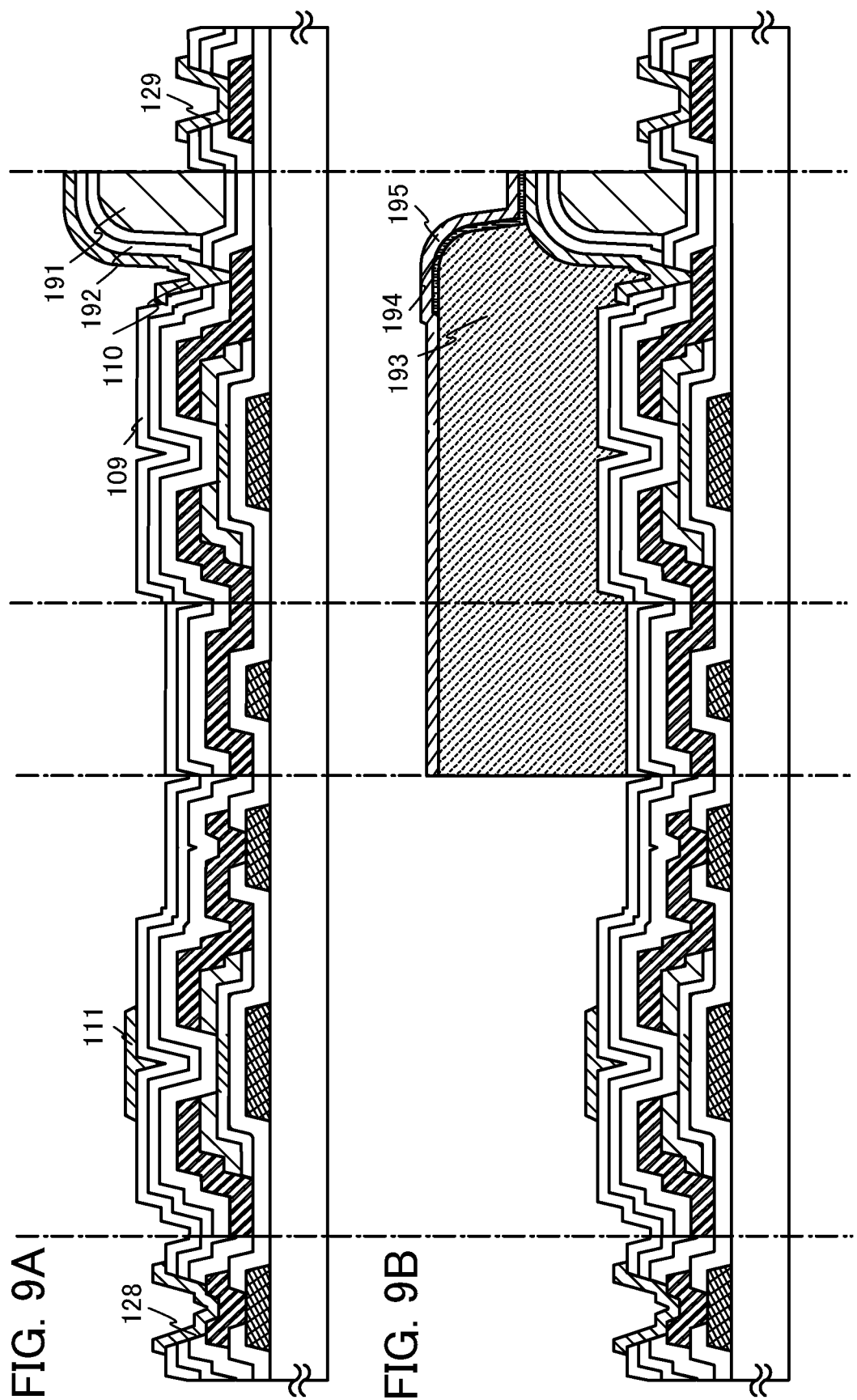
FIGS. 9A and 9B illustrate a method for manufacturing a light-emitting device.

Through the above-described steps, the oxide semiconductor layers 133 and 134 and oxide conductive layers 142 and 143 can be obtained (see FIG. 8A). The oxide semiconductor layer 133 and the oxide conductive layer 142 are island-shaped stacked layers formed using the same mask, and the oxide semiconductor layer 134 and the oxide conductive layer 143 are island-shaped stacked layers formed using the same mask.

Next, a fourth photolithography step is performed. The resist masks 136a, 136b, 136c, 136d, 136e, 136f, and 136g are formed, and unnecessary portions of the metal conductive film are removed by etching, so that the source electrode layer 105a, the drain electrode layer 105b, the source electrode layer 165a, the drain electrode layer 165b, the capacitor electrode layer 149, the connection electrode 120, and the second terminal 122 are formed (see FIG. 8B).

Note that each material and etching conditions are adjusted as appropriate so that the oxide conductive layers 142 and 143 and the oxide semiconductor layers 133 and 134 are not removed in etching of the metal conductive film.

Next, the resist masks 136a, 136b, 136c, 136d, 136e, 136f, and 136g are removed, and then the oxide conductive layers 142 and 143 are etched using the source electrode layer 105a, the drain electrode layer 105b, the source electrode layer 165a, and the drain electrode layer 165b as masks, so that the oxide conductive layers 164a and 164b and the oxide conductive layers 104a and 104b are formed (see FIG. 8C). The oxide conductive layers 142 and 143 containing zinc oxide as a component can be easily etched with an alkaline solution such as a resist stripping solution, for example.

Therefore, removal of the resist masks 136a, 136b, 136c, 136d, 136e, 136f, and 136g is preferably performed by ashing. In the case of etching with a stripping solution, etching conditions (the kind of the etchant, the concentration, and the etching time) are adjusted as appropriate so that the oxide conductive layers 142 and 143 and the oxide semiconductor layers 133 and 134 are not etched excessively.

Next, the oxide insulating film 107 serving as a protective insulating film is formed in contact with the oxide semiconductor layer 133 and 134. In this embodiment, a silicon oxide film with a thickness of 300 nm is deposited as the oxide insulating film 107 by a sputtering method.

Next, second heat treatment is performed in an inert gas atmosphere or a nitrogen atmosphere at a preferable temperature from 200° C. to 400° C. inclusive, e.g., from 250° C. to 350° C. inclusive. For example, the second heat treatment is performed in a nitrogen atmosphere at 250° C. for one hour. By the second heat treatment, part of the oxide semiconductor layers 133 and 134 which overlaps with the oxide insulating film 107 is heated in the state of being in contact with the oxide insulating film 107.

Through the above-described steps, heat treatment for dehydration or dehydrogenation is performed on the oxide semiconductor layer after deposition to reduce the resistance, and then, part of the oxide semiconductor layer is selectively made to be in an oxygen-excess state.

As a result, in the oxide semiconductor layer 133, a channel formation region 166 overlapping with the gate electrode layer 161 has i-type conductivity, and a high-resistance source region 167a overlapping with the source electrode layer 165a and the oxide conductive layer 164a and a high-resistance drain region 167b overlapping with the drain electrode layer 165b and the oxide conductive layer 164b are formed in a self-aligned manner; thus, an oxide semiconductor layer 163 is formed. Similarly, in the oxide semiconductor layer 134, a channel formation region 116 overlapping with the gate electrode layer 101 has i-type conductivity, and a high-resistance source region 117a overlapping with the source electrode layer 105a and the oxide conductive layer 104a and a high-resistance drain region 117b overlapping with the drain electrode layer 105b and the oxide conductive layer 164b are formed in a self-aligned manner; thus, an oxide semiconductor layer 103 is formed.

The oxide conductive layers 104b and 164b which are disposed between the oxide semiconductor layers 103 and 163 and the drain electrode layers 105b and 165b formed using a metal material each also function as a low-resistance drain (LRD, also referred to as an LRN) region. Similarly, the oxide conductive layers 104a and 164a which are disposed between the oxide semiconductor layers 103 and 163 and the source electrode layers 105a and 165a formed using a metal material each also function as a low-resistance source (LRS, also referred to as an LRN) region. With the structure including the oxide semiconductor layer, the low-resistance drain region, and the drain electrode layer formed using a metal material, withstand voltage of the transistor can be further increased. Specifically, the carrier concentration of the low-resistance drain region is higher than that of the high-resistance drain region (the HRD region) and preferably in a range of $1 \times 10^{20}/cm^3$ or higher and $1 \times 10^{21}/cm^3$ or lower.

Through the above steps, a thin film transistor 172 in the pixel portion and a transistor 182 in the driver circuit portion can be manufactured over the same substrate. Each of the thin film transistors 172 and 181 is a bottom-gate thin film transistor including an oxide semiconductor layer in which a high-resistance source region, a high-resistance drain region, and a channel formation region are formed. Therefore, in each of the thin film transistors 172 and 181, the high-resistance drain region or the high-resistance source region serves as a buffer, so that a local high electric field is not applied even when a high electric field is applied; in this manner, the thin film transistors 172 and 182 can each have a structure with an increased withstand voltage.

In the capacitor portion, the capacitor 147 is formed from a stack of the capacitor wiring layer 108, the gate insulating layer 102, and the capacitor electrode layer 149 formed in the same step as the drain electrode layer 105b.

Next, the protective insulating layer 106 is formed over the oxide insulating film 107 and the color filter layer 191 is formed over the protective insulating layer 106 in the pixel portion. The overcoat layer 192 is formed so as to cover the color filter layer 191 and the protective insulating layer 109 is formed so as to cover the protective insulating layer 106 and the overcoat layer 192.

Next, a ninth photolithography step is performed in a similar manner in Embodiment 1. A resist mask is formed, and the contact hole 125 which reaches the drain electrode layer 105b is formed by etching the oxide insulating film 107, the protective insulating layer 106, and the protective insulating layer 109. Then, the resist mask is removed (see FIG. 8D). In addition, the contact hole 127 which reaches the second terminal 122 and the contact hole 126 which reaches the connection electrode 120 are also formed by this etching.

Next, a light-transmitting conductive film is formed, and a tenth photolithography step is performed. A resist mask is formed and unnecessary portions of the light-transmitting conductive film are removed by etching to form the first electrode layer 110, the conductive layer 111, and the terminal electrodes 128 and 129. Then, the resist masks are removed (see FIG. 9A).

As in Embodiment 1, the partition 193 is formed in an eleventh photolithography step. The EL layer 194 and the second electrode layer 195 are stacked over the first electrode layer 110, so that the light-emitting device of this embodiment which includes a light-emitting element is manufactured (see FIG. 9B).

When the oxide conductive layers are provided between the oxide semiconductor layer and the source and drain electrode layers as the source region and the drain region, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared to the contact between a metal electrode (e.g., Ti) and an oxide semiconductor layer.

The contact resistance can be reduced by interposing the oxide conductive layers between the oxide semiconductor layer and the source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length L can be set as small as 0.1 μm to 2 μm inclusive; in this way, operation speed can be increased.

This embodiment can be implemented in appropriate combination with the structures described in the other embodiments.

Embodiment 4

In this embodiment, an example of a light-emitting device in which a thin film transistor in a pixel portion and a first electrode layer of a light-emitting element are electrically connected to each other through a connection electrode layer will be described with reference to FIG. 16, FIGS. 17A to 17D, and FIGS. 18A and 18B. Note that in this embodiment, materials and methods similar to those in Embodiment 1 can be used except for a connection method of the transistor in the pixel portion and the first electrode layer of the light-emitting element. Therefore, part of this embodiment can be performed in a manner similar to that of Embodiment 1; thus, repetitive description of the same portions as or portions having functions similar to those in Embodiment 1 and steps for forming such portions will be omitted. Since FIG. 16, FIGS. 17A to 17D, and FIGS. 18A and 18B are the same as FIG. 1, FIGS. 2A to 2C, FIGS. 3A to 3C, FIGS. 4A and 4B, and FIGS. 5A and 5B except for part of steps, the same portions are denoted by the same reference numerals and detailed description of the same portions is omitted.

Figure 16:
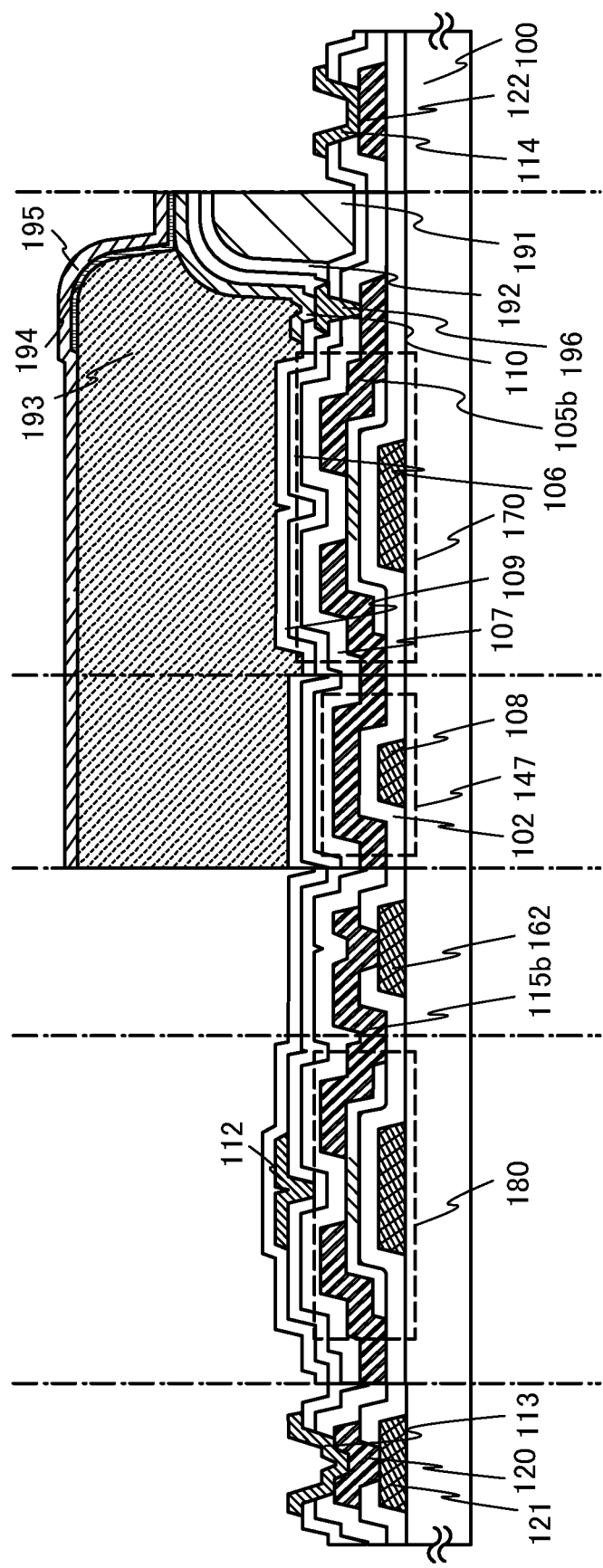
FIG. 16 illustrates a light-emitting device.

A light-emitting device of this embodiment is illustrated in FIG. 16. The drain electrode layer 105b of the thin film transistor 170 in the pixel portion is electrically connected to the first electrode layer 110 through a connection electrode layer 196. A method for manufacturing the light-emitting device illustrated in FIG. 16 will be described with reference to FIGS. 17A to 17D and FIGS. 18A and 18B.

First, according to Embodiment 1, the steps up to and including the step in FIG. 4A in Embodiment 1 are performed. FIG. 17A illustrates the same step as FIG. 4A.

Next, a fifth photolithography step is performed. A resist mask is formed, and the contact hole 125 which reaches the drain electrode layer 105b, the contact hole 127 which reaches the second terminal 122, and the contact hole 126 which reaches the connection electrode 120 are formed by etching the oxide insulating film 107 and the protective insulating layer 106. Then, the resist mask is removed (see FIG. 17B).

Next, a conductive film is formed, and a sixth photolithography step is performed. Resist masks are formed and unnecessary portions of the conductive film are removed by etching to form the connection electrode layer 196, a conductive layer 112, and terminal electrodes 113 and 114. Then, the resist masks are removed (see FIG. 17C). As the conductive film, a metal conductive film can be used; therefore, the connection electrode layer 196, the conductive layer 112, and the terminal electrodes 113 and 114 can be formed of a metal conductive layer.

As the connection electrode layer 196, a film including an element selected from Al, Cr, Cu, Ta, Ti, Mo, and W as its main component or a stacked film including a film of any of the elements and an alloy film thereof can be used. Accordingly, in the case where the conductive layer 112 and the terminal electrodes 113 and 114 are formed in the same step as the connection electrode layer 196 as in this embodiment, the conductive layer 112 and the terminal electrodes 113 and 114 can also be formed using a film including an element selected from Al, Cr, Cu, Ta, Ti, Mo, and W as its main component or a stacked film including a film of any of the elements and an alloy film thereof. The conductive film is not limited to a single layer including the above element and can be formed in a stacked layer of two or more layers. As a deposition method of the conductive film, a sputtering method, a vacuum evaporation method (e.g., an electron beam evaporation method), an arc discharge ion plating method, or a spray method can be used.

Next, the RGB color filter layers 191 is formed over the protective insulating layer 106 in the pixel portion in seventh to ninth photolithography steps and the overcoat layer 192 is formed so as to cover the color filter layers 191 in a tenth photolithography step. The protective insulating layer 109 is formed so as to cover the connection electrode layer 196, the conductive layer 112, the terminal electrodes 113 and 114, the protective insulating layer 106, and the overcoat layer 192 (see FIG. 17D).

Next, an eleventh photolithography step is performed. A resist mask is formed, and the contact hole 125 which reaches the connection electrode layer 196 is formed by etching the protective insulating layer 109. Then, the resist mask is removed. In addition, the protective insulating layer 109 over the terminal electrodes 113 and 114 is also removed by this etching, so that the terminal electrodes 113 and 114 are exposed (see FIG. 18A).

Then, a light-transmitting conductive film is formed. A twelfth photolithography step is performed. A resist mask is formed and unnecessary portions of the light-transmitting conductive film are etched to form the first electrode layer 110. Then, the resist mask is removed.

As in Embodiment 1, the partition 193 is formed in a thirteenth photolithography step. The EL layer 194 and the second electrode layer 195 are stacked over the first electrode layer 110 and thus the light-emitting device of this embodiment, which includes a light-emitting element, is manufactured (see FIG. 18B).

In the case where the connection electrode layer 196 is formed, a power supply line can be formed using the same material as and in the same step as the connection electrode layer 196. Further, a common potential line can also be formed using the same material as and in the same step as the connection electrode layer 196.

This embodiment can be implemented in appropriate combination with the structures described in the other embodiments.

Embodiment 5

Figure 10:
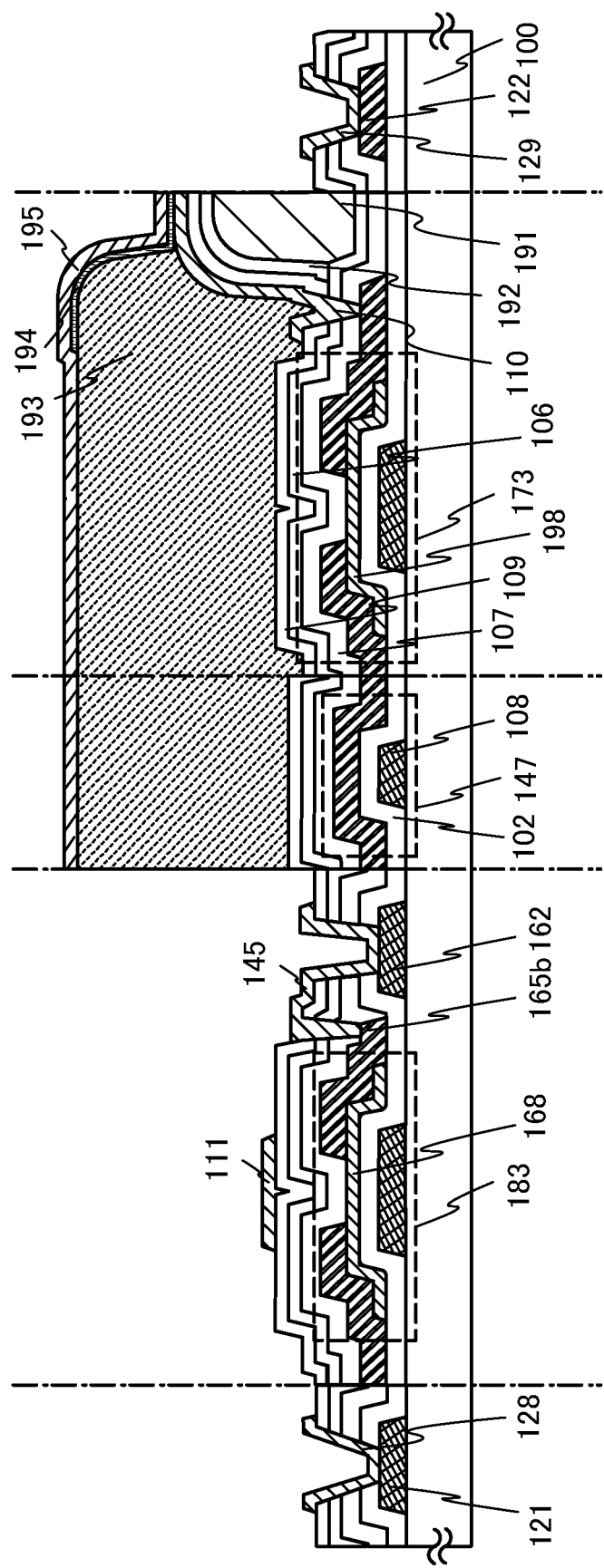
FIG. 10 illustrates a light-emitting device.

In this embodiment, an example of a thin film transistor whose manufacturing process is partly different from that of Embodiment 1 will be described with reference to FIG. 10. FIG. 10 is the same as FIG. 1, FIGS. 2A to 2C, FIGS. 3A to 3C, FIGS. 4A and 4B, and FIGS. 5A and 5B except for part of the steps. Thus, the same parts as in FIG. 1, FIGS. 2A to 2C, FIGS. 3A to 3C, FIGS. 4A and 4B, and FIGS. 5A and 5B are denoted by the same reference numerals and detailed description on the parts is omitted.

First, according to Embodiment 1, the gate electrode layer and the gate insulating layer are formed over a substrate. Then, in the pixel portion, a contact hole which reaches the gate electrode layer is formed in a second photolithography step (not illustrated).

Next, the oxide semiconductor film 130 is formed and then processed into the island-shaped oxide semiconductor layers 131 and 132 in a third photolithography step.

Next, the oxide semiconductor layers 131 and 132 are dehydrated or dehydrogenated. The temperature of first heat treatment at which dehydration or dehydrogenation is performed is higher than or equal to 400° C. and lower than or equal to 750° C., preferably higher than or equal to 425° C. and lower than or equal to 750° C. Note that in the case where the temperature of the first heat treatment is 425° C. or higher, the heat treatment time may be one hour or less, while in the case where the temperature of the first heat treatment is lower than 425° C., the heat treatment time is set to more than one hour. Here, the substrate is introduced into an electric furnace which is one example of heat treatment apparatuses, and the oxide semiconductor layers are subjected to heat treatment in a nitrogen atmosphere. Then, the oxide semiconductor layers are not exposed to air and water and hydrogen are prevented from entering the oxide semiconductor layers again. In this manner, oxide semiconductor layers are formed. Then, a high-purity oxygen gas, a high-purity $N_2O$ gas, or ultra-dry air (having a dew point of −40° C. or lower, preferably −60° C. or lower) is introduced to the same furnace and cooling is performed. It is preferable that water, hydrogen, or the like be not contained in the oxygen gas or the $N_2O$ gas. In addition, it is preferable that the oxygen gas or the $N_2O$ gas, which is introduced into an apparatus for heat treatment, have purity of 6N (99.9999%) or more, preferably 7N (99.99999%) or more; that is, an impurity concentration in the oxygen gas or the $N_2O$ gas is preferably 1 ppm or lower, further preferably 0.1 ppm or lower.

The heat treatment apparatus is not limited to the electric furnace, and, for example, may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In addition, the LRTA apparatus may be provided with not only a lamp but also a device which heats an object to be processed by heat conduction or heat radiation from a heater such as a resistance heater. GRTA is a method of heat treatment using a high-temperature gas. As the gas, an inert gas which does not react with an object to be processed by heat treatment, for example, nitrogen or a rare gas such as argon, is used. The heat treatment may be performed by an RTA method at 600° C. to 750° C. for several minutes.

In addition, after the first heat treatment for dehydration or dehydrogenation, heat treatment may be performed at higher than or equal to 200° C. and lower than or equal to 400° C., preferably higher than or equal to 200° C. and lower than or equal to 300° C., in an oxygen gas atmosphere or an $N_2O$ gas atmosphere.

The first heat treatment of the oxide semiconductor layers 131 and 132 can also be performed on the oxide semiconductor film 130 which has not been processed into the island-shaped oxide semiconductor layers. In that case, after the first heat treatment, the substrate is taken out of the heating device and a photolithography step is performed.

Through the above process, the entire region of the oxide semiconductor film is made in an oxygen-excess state, whereby higher resistance (i-type conductivity) is obtained. Accordingly, oxide semiconductor layers 168 and 198 whose entire region has i-type conductivity are formed.

Next, a fourth photolithography step is performed. Resist masks are formed over the oxide semiconductor layers 168 and 198 and a source electrode layer and a drain electrode layer are formed by a selective etching. An oxide insulating film 107 is formed by a sputtering method.

Next, in order to reduce variation in electric characteristics of the thin film transistors, heat treatment (preferably at higher than or equal to 150° C. and lower than 350° C.) may be performed in an inert gas atmosphere or a nitrogen gas atmosphere. For example, heat treatment may be performed under a nitrogen atmosphere at 250° C. for an hour.

Next, the protective insulating layer 106 is formed over the oxide insulating film 107 and the color filter layer 191 is formed over the protective insulating layer 106 in the pixel portion. The overcoat layer 192 is formed so as to cover the color filter layer 191 and the protective insulating layer 109 is formed so as to cover the protective insulating layer 106 and the overcoat layer 192.

Next, a ninth photolithography step is performed. Resist masks are formed and contact holes which reach the first terminal 121, the conductive layer 162, the drain electrode layer 105$b$, and the second terminal 122 are formed by etching the gate insulating layer 102, the oxide insulating film 107, the protective insulating layer 106, and the protective insulating layer 109. After a light-transmitting conductive film is formed, a tenth photolithography step is performed. Resist masks are formed and selective etching is performed to form the first electrode layer 110, the terminal electrode 128, the terminal electrode 129, and a wiring layer 145.

This embodiment is an example where the first terminal 121 and the terminal electrode 128 are directly connected to each other without the connection electrode 120. Further, the drain electrode layer 165*b* and the conductive layer 162 are connected to each other through the wiring layer 145.

In the capacitor portion, the capacitor 147 is formed from a stack of the capacitor wiring layer 108, the gate insulating layer 102, and the capacitor electrode layer 149 formed in the same step as the source electrode layer and the drain electrode layer.

Through the above steps, a thin film transistor 183 in the driver circuit portion and a thin film transistor 173 in a pixel portion can be formed over the same substrate.

As in Embodiment 1, the partition 193 is formed and the EL layer 194 and the second electrode layer 195 are stacked over the first electrode layer 110, whereby the light-emitting device of this embodiment, which includes a light-emitting element, is manufactured (see FIG. 10).

This embodiment can be implemented in appropriate combination with the structures described in the other embodiments.

Embodiment 6

In this embodiment, in the light-emitting device described in any of Embodiments 1 to 5, an example of manufacturing an active matrix light-emitting display device with the use of a thin film transistor and a light-emitting element utilizing electroluminescence will be described.

Light-emitting elements utilizing electroluminescence are classified according to whether a light-emitting material is an organic compound or an inorganic compound. In general, the former is referred to as an organic EL element, and the latter is referred to as an inorganic EL element.

In the organic EL element, by application of voltage to a light-emitting element, electrons and holes are separately injected from a pair of electrodes into a layer containing a light-emitting organic compound, and thus current flows. Then, the carriers (electrons and holes) recombine, so that the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. The dispersion-type inorganic EL element has a light-emitting layer where particles of a light-emitting material are dispersed in a binder, and its light emission mechanism is donor-acceptor recombination type light emission which utilizes a donor level and an acceptor level. The thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 19:
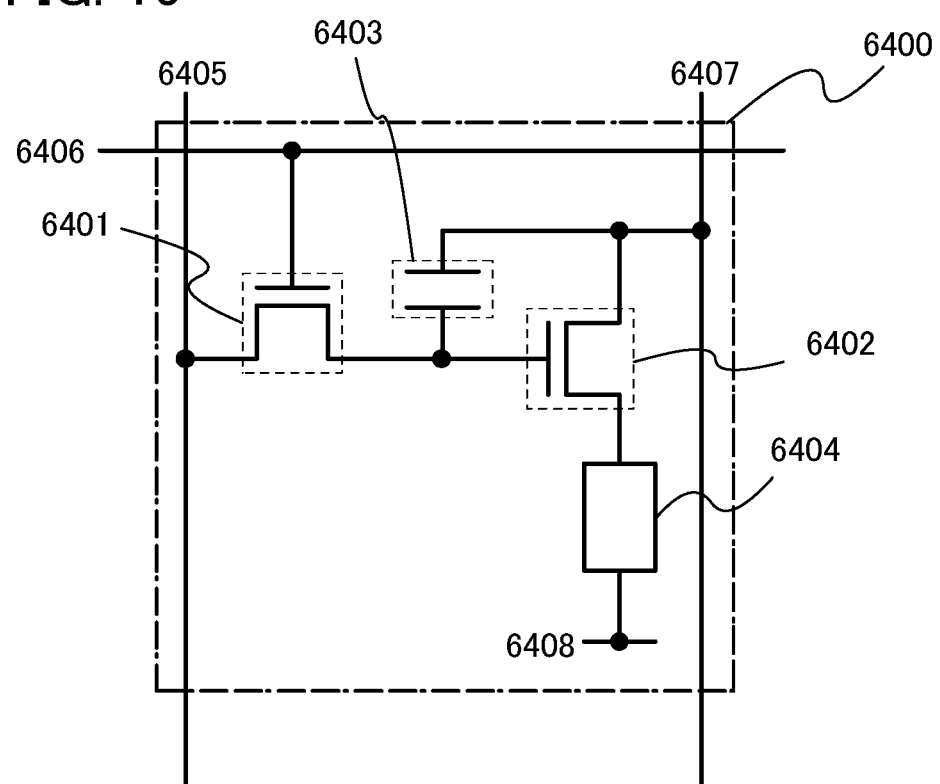
FIG. 19 illustrates an equivalent circuit diagram of a pixel of a light-emitting device.

FIG. 19 illustrates an example of a pixel structure to which digital time grayscale driving can be applied, as an example of a light-emitting device.

The structure and operation of a pixel to which digital time grayscale driving can be applied are described. Here, one pixel includes two n-channel transistors each of which includes an oxide semiconductor layer for a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 through the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential in which the low power supply potential is smaller than a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 so that current flows through the light-emitting element 6404, whereby the light-emitting element 6404 emits light. Thus, each potential is set so that the potential difference between the high power supply potential and the low power supply potential is higher than or equal to a forward threshold voltage of the light-emitting element 6404.

When gate capacitance of the driver transistor 6402 is used as a substitute for the capacitor 6403, the capacitor 6403 can be omitted. The gate capacitance of the driver transistor 6402 may be formed between a channel region and a gate electrode.

In the case of a voltage-input voltage driving method, a video signal is input to the gate of the driver transistor 6402 so that the driver transistor 6402 is completely turned on or off. That is, the driver transistor 6402 operates in a linear region; thus, voltage higher than the voltage of the power supply line 6407 is applied to the gate of the driver transistor 6402. Note that voltage higher than or equal to "voltage of the power supply line+$V_{th}$ of the driver transistor 6402" is applied to the signal line 6405.

In the case of performing analog grayscale driving instead of digital time grayscale driving, the same pixel structure as in FIG. 19 can be used by changing signal input.

In the case of performing the analog grayscale driving, a voltage higher than or equal to voltage which is the sum of the forward voltage of the light-emitting element 6404 and $V_{th}$ of the driver transistor 6402 is applied to the gate of the driver transistor 6402. The forward voltage of the light-emitting element 6404 refers to a voltage at which a desired luminance is obtained, and includes at least forward threshold voltage. By inputting a video signal to enable the driver transistor 6402 to operate in a saturation region, current can flow through the light-emitting element 6404. In order that the driver transistor 6402 can operate in the saturation region, the potential of the power supply line 6407 is set higher than the gate potential of the driver transistor 6402. With an analog video signal, current in accordance with the video signal flows through the light-emitting element 6404, and the analog grayscale driving can be performed.

The pixel structure illustrated in FIG. 19 is not limited thereto. For example, a switch, a resistor, a capacitor, a transistor, a logic circuit, or the like may be added to the pixel illustrated in FIG. 19.

Next, structures of the light-emitting element are described with reference to FIGS. 20A to 20C. Here, a cross-sectional structure of a pixel is described by taking an n-channel driving TFT as an example. Driving TFTs 7001, 7011, and 7021 used in light-emitting devices illustrated in FIGS. 20A, 20B, and 20C, respectively, can be formed in a manner similar to that of the thin film transistor described in any of Embodiments 1 to 5, and are highly reliable thin film transistors each including an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure in which light is extracted through the surface opposite to the substrate; a bottom emission structure in which light is extracted through the surface on the substrate side; or a dual emission structure in which light is extracted through the surface opposite to the substrate and the surface on the substrate side. The pixel structure can be applied to a light-emitting element having any of these emission structures.

A light-emitting element having the bottom emission structure will be described with reference to FIG. 20A.

Figure 20A:
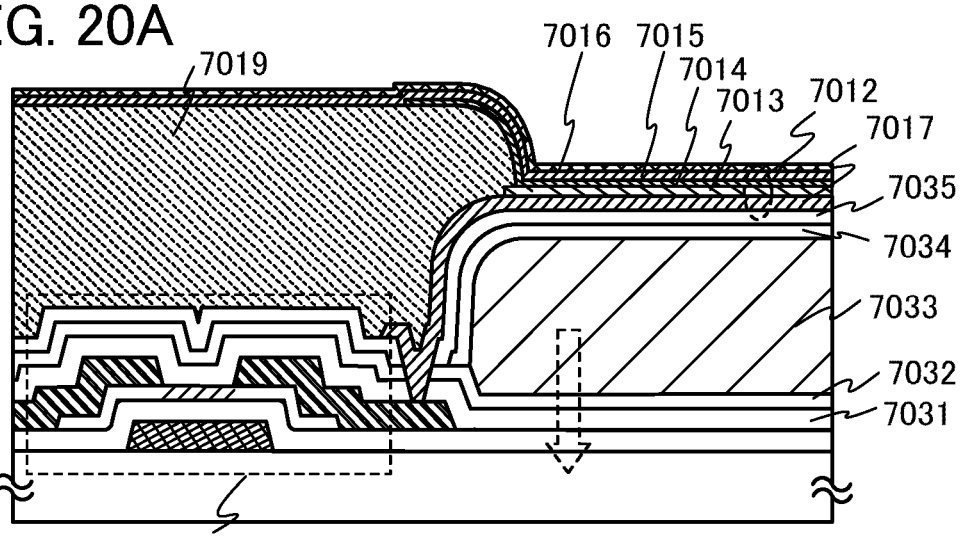
FIGS. 20A to 20C each illustrate a light-emitting device.

FIG. 20A is a cross-sectional view of a pixel in the case where the driver TFT 7011 is an n-channel transistor and light is emitted from a light-emitting element 7012 to a first electrode layer 7013 side. In FIG. 20A, the first electrode layer 7013 of the light-emitting element 7012 is formed over a light-transmitting conductive film 7017 which is electrically connected to the driver TFT 7011, and an EL layer 7014 and a second electrode layer 7015 are stacked in this order over the first electrode layer 7013. Note that the conductive film 7017 is electrically connected to a drain electrode layer of the driver TFT 7011 through a contact hole formed in a protective insulating layer 7035, a protective insulating layer 7032, and an oxide insulating layer 7031.

As the light-emitting conductive film 7017, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Further, a variety of materials can be used for the first electrode layer 7013 of the light-emitting element. For example, in the case where the first electrode layer 7013 is used as a cathode, a material having a low work function such as an alkali metal such as Li or Cs, an alkaline earth metal such as Mg, Ca, or Sr, an alloy containing any of them (e.g., Mg:Ag, Al:Li), or a rare earth metal such as Yb or Er is preferable. In FIG. 20A, the first electrode layer 7013 is formed to have a thickness through which light can be transmitted (preferably, approximately 5 nm to 30 nm). For example, an aluminum film with a thickness of 20 nm is used as the first electrode layer 7013.

Alternatively, a light-transmitting conductive film and an aluminum film may be stacked and then selectively etched so as to form the light-transmitting conductive film 7017 and the first electrode layer 7013. In this case, the etching can be performed using the same mask, which is preferable.

Further, the periphery of the first electrode layer 7013 is covered with a partition 7019. The partition 7019 is formed using a film of an organic resin such as polyimide, acrylic, polyamide, or epoxy, an inorganic insulating film, or organic polysiloxane. It is particularly preferable that the partition 7019 be formed using a photosensitive resin material to have an opening portion over the first electrode layer 7013 so that a sidewall of the opening portion is formed as a tilted surface with continuous curvature. When a photosensitive resin material is used for the partition 7019, a step of forming a resist mask can be omitted.

Further, the EL layer 7014 formed over the first electrode layer 7013 and the partition 7019 may include at least a light-emitting layer and be formed using a single layer or a plurality of layers stacked. When the EL layer 7014 is formed using a plurality of layers, an electron-injection layer, an electron-transport layer, a light-emitting layer, a hole-transport layer, and a hole-injection layer are stacked in this order over the first electrode layer 7013 functioning as a cathode. Note that it is not necessary to form all of these layers.

The stacking order is not limited to the above order. The first electrode layer 7013 may function as an anode and a hole-injection layer, hole-transport layer, a light-emitting layer, an electron-transport layer, and an electron-injection layer may be stacked in this order over the first electrode layer 7013. Note that from a power consumption standpoint, it is preferable to make the first electrode layer 7013 function as a cathode and to stack an electron-injection layer, an electron-transport layer, a light-emitting layer, a hole-transport layer, and a hole-injection layer in this order over the first electrode layer 7013 because increase in driving voltage of the driver circuit portion can be suppressed and thus power consumption can be reduced.

Further, a variety of materials can be used for the second electrode layer 7015 formed over the EL layer 7014. For example, in the case where the second electrode layer 7015 is used as an anode, a material having a high work function, such as ZrN, Ti, W, Ni, Pt, or Cr, or a transparent conductive material such as ITO, IZO, or ZnO is preferable. Further, over the second electrode layer 7015, a light-blocking film 7016 is formed using a metal blocking light, a metal reflecting light, or the like. In this embodiment, an ITO film is used as the second electrode layer 7015 and a Ti film is used as the light-blocking film 7016.

The light-emitting element 7012 corresponds to a region where the EL layer 7014 including a light-emitting layer is sandwiched with the first electrode layer 7013 and the second electrode layer 7015. In the case of the element structure illustrated in FIG. 20A, light is emitted from the light-emitting element 7012 to the first electrode layer 7013 side to pass through a color filter layer 7033 to the outside as indicated by an arrow.

The color filter layer 7033 is formed by a droplet discharge method such as an ink-jet method, a printing method, an etching method with the use of a photolithography technique, or the like.

The color filter layer 7033 is covered with an overcoat layer 7034 and the protective insulating layer 7035 is further formed thereover. Note that although the overcoat layer 7034 is illustrated to have a small thickness in FIG. 20A, the overcoat layer 7034 has a function of reducing roughness caused by the color filter layer 7033.

Next, a light-emitting element having the dual emission structure will be described with reference to FIG. 20B.

Figure 20B:
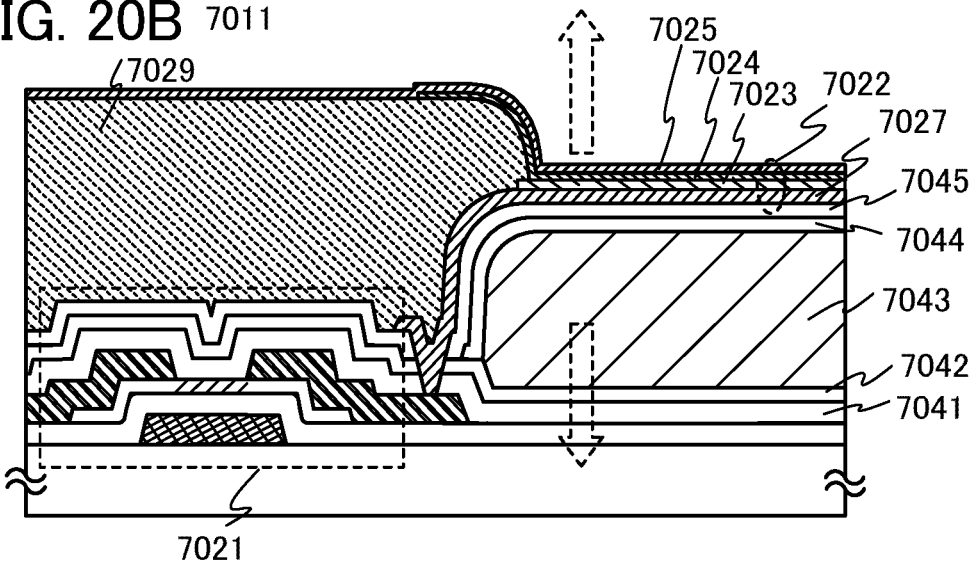

In FIG. 20B, a first electrode layer 7023 of a light-emitting element 7022 is formed over a light-transmitting conductive film 7027 which is electrically connected to the driver TFT 7021, and an EL layer 7024 and a second electrode layer 7025 are stacked in this order over the first electrode layer 7023. Note that the conductive film 7027 is electrically connected to a drain electrode layer of the driver TFT 7021 through a contact hole formed in a protective insulating layer 7045, a protective insulating layer 7042, and an oxide insulating layer 7041.

As the light-transmitting conductive film 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

A variety of materials can be used for the first electrode layer 7023. For example, in the case where the first electrode layer 7023 is used as a cathode, a material having a low work function such as an alkali metal such as Li or Cs, an alkaline earth metal such as Mg, Ca, or Sr, an alloy containing any of them (e.g., Mg:Ag, Al:Li), or a rare earth metal such as Yb or Er is preferable. In this embodiment, the first electrode layer 7023 functions as a cathode and is formed to have a thickness through which light can be transmitted (preferably, approximately 5 nm to 30 nm). For example, an aluminum film with a thickness of 20 nm is used as the cathode.

Alternatively, a light-transmitting conductive film and an aluminum film may be stacked and then selectively etched so as to form the light-transmitting conductive film 7027 and the first electrode layer 7023. In this case, the etching can be performed using the same mask, which is preferable.

Further, the periphery of the first electrode layer 7023 is covered with a partition 7029. The partition 7029 is formed using a film of an organic resin such as polyimide, acrylic, polyamide, or epoxy, an inorganic insulating film, or organic polysiloxane. It is particularly preferable that the partition 7029 be formed using a photosensitive resin material to have an opening portion over the first electrode layer 7023 so that a sidewall of the opening portion is formed as a tilted surface with continuous curvature. When a photosensitive resin material is used for the partition 7029, a step of forming a resist mask can be omitted.

Further, the EL layer 7024 formed over the first electrode layer 7023 and the partition 7029 may include at least a light-emitting layer and be formed using a single layer or a plurality of layers stacked. When the EL layer 7024 is formed using a plurality of layers, an electron-injection layer, an electron-transport layer, a light-emitting layer, a hole-transport layer, and a hole-injection layer are stacked in this order over the first electrode layer 7023 functioning as a cathode. Note that it is not necessary to form all of these layers.

The stacking order is not limited to the above order. The first electrode layer 7023 may function as an anode and a hole-injection layer, hole-transport layer, a light-emitting layer, an electron-transport layer, and an electron-injection layer may be stacked in this order over the anode. Note that from a power consumption standpoint, it is preferable to make the first electrode layer 7023 function as a cathode and to stack an electron-injection layer, an electron-transport layer, a light-emitting layer, a hole-transport layer, and a hole-injection layer in this order over the cathode because power consumption can be reduced.

Further, a variety of materials can be used for the second electrode layer 7025 formed over the EL layer 7024. For example, in the case where the second electrode layer 7025 is used as an anode, a material having a high work function, for example, a transparent conductive material such as ITO, IZO, or ZnO, is preferably used. In this embodiment, the second electrode layer 7025 is used as an anode and an ITO film including silicon oxide is formed.

The light-emitting element 7022 corresponds to a region where the EL layer 7024 including a light-emitting layer is sandwiched with the first electrode layer 7023 and the second electrode layer 7025. In the case of the element structure illustrated in FIG. 20B, light is emitted from the light-emitting element 7022 to both the second electrode layer 7025 side and the first electrode layer 7023 side as indicated by arrows.

A color filter layer 7043 is formed by a droplet discharge method such as an ink-jet method, a printing method, an etching method with the use of a photolithography technique, or the like.

The color filter layer 7043 is covered with an overcoat layer 7044 and the protective insulating layer 7045 is further formed thereover.

Note that when a light-emitting element having a dual emission structure is used and full color display is performed on both display surfaces, light from the second electrode layer 7025 side does not pass through the color filter layer 7043; therefore, a sealing substrate provided with another color filter layer is preferably provided on the second electrode layer 7025.

Next, a light-emitting element having a top emission structure will be described with reference to FIG. 20C.

Figure 20C:
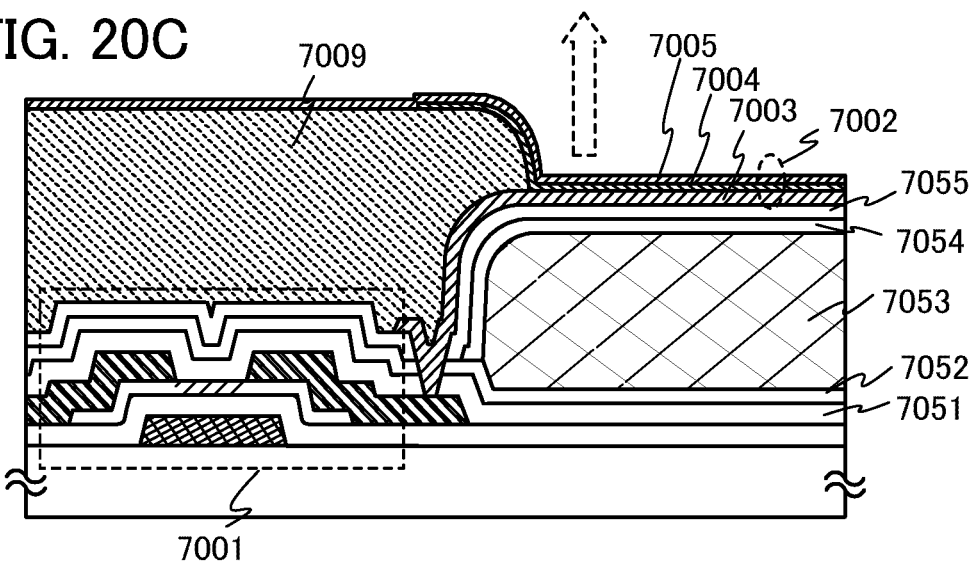

FIG. 20C is a cross-sectional view of a pixel in the case where the driver TFT 7001 is an n-channel transistor and light is emitted from a light-emitting element 7002 to a second electrode layer 7005 side. In FIG. 20C, a first electrode layer 7003 of the light-emitting element 7002, which is electrically connected to the TFT 7001, is formed, and an EL layer 7004 and the second electrode layer 7005 are stacked in this order over the first electrode layer 7003.

Further, a variety of materials can be used for the first electrode layer 7003. For example, in the case where the first electrode layer 7003 is used as a cathode, a material having a low work function such as an alkali metal such as Li or Cs, an alkaline earth metal such as Mg, Ca, or Sr, an alloy containing any of them (e.g., Mg:Ag, Al:Li), or a rare earth metal such as Yb or Er is preferable.

Further, the periphery of the first electrode layer 7003 is covered with a partition 7009. The partition 7009 is formed using a film of an organic resin such as polyimide, acrylic, polyamide, or epoxy, an inorganic insulating film, or organic polysiloxane. It is particularly preferable that the partition 7009 be formed using a photosensitive resin material to have an opening portion over the first electrode layer 7003 so that a sidewall of the opening portion is formed as a tilted surface with continuous curvature. When a photosensitive resin material is used for the partition 7009, a step of forming a resist mask can be omitted.

Further, the EL layer 7004 formed over the first electrode layer 7003 and the partition 7009 may include at least a light-emitting layer and be formed using a single layer or a plurality of layers stacked. When the EL layer 7004 is formed using a plurality of layers, an electron-injection layer, an electron-transport layer, a light-emitting layer, a hole-transport layer, and a hole-injection layer are stacked in this order over the first electrode layer 7003 used as a cathode. Note that it is not necessary to form all of these layers.

The stacking order is not limited to the above order. A hole-injection layer, hole-transport layer, a light-emitting layer, an electron-transport layer, and an electron-injection layer may be stacked in this order over the first electrode layer 7003 used as an anode.

In FIG. 20C, a hole-injection layer, a hole-transport layer, a light-emitting layer, an electron-transport layer, and an electron-injection layer are stacked in this order over a stacked film in which a Ti film, an aluminum film, and a Ti film are formed in this order, and thereover, a stacked layer of a Mg:Ag alloy thin film and an ITO film is formed.

Note that when the TFT 7001 is an n-type transistor, it is preferable to stack an electron-injection layer, an electron-transport layer, a light-emitting layer, a hole-transport layer, and a hole-injection layer in this order over the first electrode layer 7003 because increase in voltage of the driver circuit can be suppressed and thus power consumption can be reduced.

The second electrode layer 7005 is formed using a light-transmitting conductive film. For example, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

The light-emitting element 7002 corresponds to a region where the EL layer 7004 including a light-emitting layer is sandwiched with the first electrode layer 7003 and the second electrode layer 7005. In the case of the pixel illustrated in FIG. 20C, light is emitted from the light-emitting element 7002 to the second electrode layer 7005 side as indicated by an arrow.

Further, in FIG. 20C, a drain electrode layer of the TFT 7001 is electrically connected to the first electrode layer 7003 through a contact hole formed in an oxide insulating layer 7051, a protective insulating layer 7052, and a protective insulating layer 7055. A planarizing insulating layer 7053 can be formed using a resin material such as polyimide, acrylic, benzocyclobutene, polyamide, or epoxy. In addition to such resin materials, it is also possible to use a low dielectric constant material (a low-k material), a siloxane-based resin, PSG (phosphosilicate glass), BPSG (borophosphosilicate glass), or the like. Note that the planarizing insulating layer 7053 may be formed by stacking a plurality of insulating films formed using these materials. There is no particular limitation on a method for forming the planarizing insulating layer 7053. The planarizing insulating layer 7053 can be formed, depending on the material, with a method such as a sputtering method, an SOG method, a spin coating method, a dipping method, a spray coating method, or a droplet discharge method (e.g., an ink-jet method, screen printing, or offset printing), or with a means such as a doctor knife, a roll coater, a curtain coater, or a knife coater.

Further, the partition 7009 is formed to insulate the first electrode layer 7003 from a first electrode layer of an adjacent pixel. The partition 7009 is formed using a film of an organic resin such as polyimide, acrylic, polyamide, or epoxy, an inorganic insulating film, or organic polysiloxane. It is particularly preferable that the partition 7009 be formed using a photosensitive resin material to have an opening portion over the first electrode layer 7003 so that a sidewall of the opening portion is formed as a tilted surface with continuous curvature. When a photosensitive resin material is used for the partition 7009, a step of forming a resist mask can be omitted.

In the structure in FIG. 20C, when full color display is performed, for example, the light-emitting element 7002 is used as a green light-emitting element, one of the adjacent light-emitting elements is used as a red light-emitting element, and the other is used as a blue light-emitting element. Alternatively, a light-emitting display device capable of full color display may be manufactured using four kinds of light-emitting elements, which include a white light emitting-element as well as the three kinds of the light-emitting elements.

Alternatively, in the structure in FIG. 20C, a light-emitting display device capable of full color display may be manufactured in such a way that all of the plurality of light-emitting elements which are arranged are white light-emitting elements and a sealing substrate having a color filter or the like is arranged over the light-emitting element 7002. When a material which exhibits a single color such as white is formed and then combined with a color filter or a color conversion layer, full color display can be performed.

The examples in which the first electrode layer is in direct contact with the thin film transistor are illustrated in FIGS. 20A to 20C; however, as described in Embodiment 4, the drain electrode layer of the thin film transistor may be electrically connected to the first electrode layer through the connection electrode layer. The thin film transistors described in any of Embodiments 2, 3, and 5 may be used as the TFTs 7001, 7011, and 7021.

Needless to say, display of monochromatic light emission can also be performed. For example, a lighting device may be formed with the use of white light emission; alternatively, an area-color light-emitting device may be formed with the use of monochromatic light emission.

If necessary, an optical film such as a polarizing film including a circularly polarizing plate may be provided.

Note that, although the organic EL element is described here as the light-emitting element, an inorganic EL element can also be provided as a light-emitting element.

Note that the example is described in which the thin film transistor (the driver TFT) which controls the driving of a light-emitting element is electrically connected to the light-emitting element; however, a structure may be employed in which a TFT for current control is connected between a driver TFT and a light-emitting element.

This embodiment can be combined with any of the other embodiments as appropriate.

Embodiment 7

In this embodiment, an example of an element structure of the light-emitting element described in any of Embodiments 1 to 6 will be described.

Figure 21A:
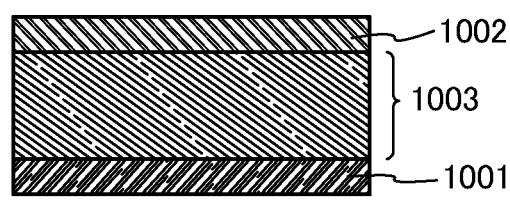
FIGS. 21A and 21B each illustrate a light-emitting element.

In the element structure illustrated in FIG. 21A, an EL layer 1003 including a light-emitting region is sandwiched between a pair of electrodes (a first electrode 1001 and a second electrode 1002). Note that the first electrode 1001 is used as an anode and the second electrode 1002 is used as a cathode as an example in the following description of this embodiment.

The EL layer 1003 includes at least a light-emitting layer and may have a stacked structure including a functional layer in addition to the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron-transport and hole-transport properties), or the like can be used. Specifically, functional layers such as a hole-injection layer, a hole-transport layer, an electron-transport layer, and an electron-injection layer can be used in combination as appropriate.

The light-emitting element illustrated in FIG. 21A emits light when current flows because of the potential difference generated between the first electrode 1001 and the second electrode 1002, and holes and electrons are recombined in the EL layer 1003. That is, a light-emitting region is formed in the EL layer 1003.

Light emission is extracted outside through one of or both the first electrode 1001 and the second electrode 1002. Therefore, either or both of the first electrode 1001 and the second electrode 1002 is formed using a light-transmitting substance.

Figure 21B:
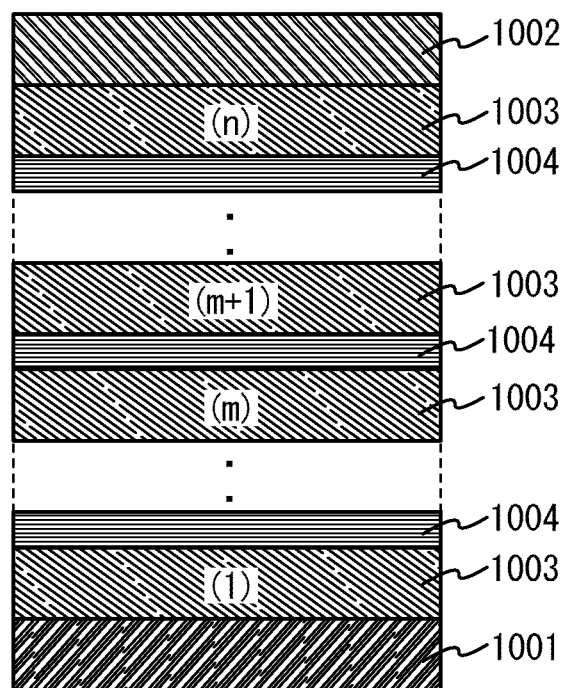

Note that a plurality of EL layers may be stacked between the first electrode 1001 and the second electrode 1002 as illustrated in FIG. 21B. In the case where n (n is a natural number of 2 or more) layers are stacked, a charge generation layer 1004 is preferably provided between each m-th (m is a natural number of 1 and more and n−1 or less) EL layer and each (m+1)-th EL layer.

The charge generation layer 1004 can be formed using a composite material of an organic compound and a metal oxide, a metal oxide, or a composite material of an organic compound and an alkali metal, an alkaline earth metal, or a compound thereof Alternatively, these materials can be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ $cm^2/Vs$ or higher. However, substances other than the above-described materials may also be used as long as the substances have higher hole-transport properties than electron-transport properties. These materials used for the charge generation layer 1004 are excellent in carrier-injection property and carrier-transport property, and thus, a light-emitting element can be driven with low current and with low voltage.

Note that the charge generation layer 1004 may be formed in a combination of a composite material of an organic compound and a metal oxide with another material. For example, a layer containing a composite material of the organic compound and the metal oxide may be combined with a layer containing a compound of a substance selected from substances having an electron-donation property and a compound having a high electron-transport property. Moreover, a layer containing a composite material of the organic compound and the metal oxide may be combined with a transparent conductive film.

As for a light-emitting element having such a structure, problems such as energy transfer and quenching are unlikely to occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be readily obtained.

Note that the charge generation layer 1004 has a function of injecting holes to one EL layer 1003 which is formed in contact with the charge generation layer 1004 and a function of injecting electrons to the other EL layer 1003 which is formed in contact with the charge generation layer 1004, when voltage is applied to the first electrode 1001 and the second electrode 1002.

The light-emitting element shown in FIG. 21B can provide a variety of emission colors by changing the type of the light-emitting substance that is used for the light-emitting layer. In addition, a plurality of light-emitting substances of different colors is used as the light-emitting substance, whereby light emission having a broad spectrum or white light emission can also be obtained.

In the case of obtaining white color light using the light-emitting element shown in FIG. 21B, as for the combination of a plurality of light-emitting layers, a structure for emitting white light including red light, blue light, and green light may be used. For example, the structure may include a first EL layer containing a blue fluorescent substance as a light-emitting substance and a second EL layer containing green and red phosphorescent substances as light-emitting substances. Alternatively, the structure may include a first EL layer exhibiting red light emission, a second EL layer exhibiting green light emission, and a third EL layer exhibiting blue light emission. Also with a structure including light-emitting layers emitting light of complementary colors, white light emission can be obtained. When light emission from the first EL layer and light emission from the second EL layer have complementary colors to each other in an element including two EL layers stacked, the combination of colors are as follows: blue and yellow, blue-green and red, and the like.

Note that in the structure of the above-mentioned stacked element, by providing the charge generation layer between the stacked EL layers, the element can have long lifetime in a high luminance region while keeping the current density low. In addition, the voltage drop due to resistance of the electrode material can be reduced, whereby uniform light emission in a large area is possible.

This embodiment can be combined with the structures disclosed in the other embodiments as appropriate.

Embodiment 8

Figure 22A:
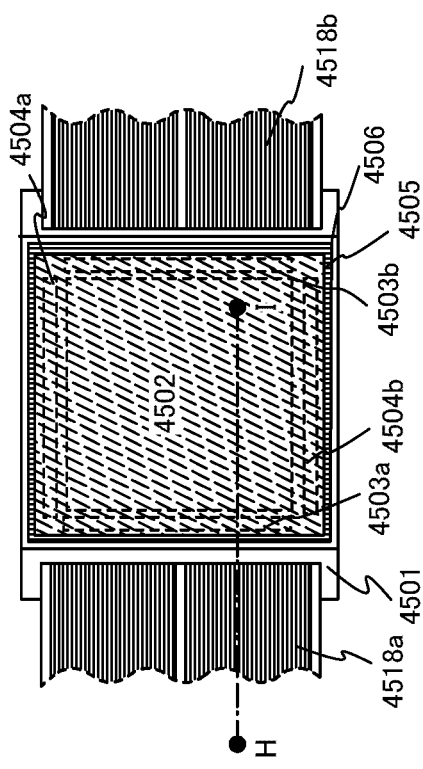
FIGS. 22A and 22B illustrate a light-emitting device.
Figure 22B:
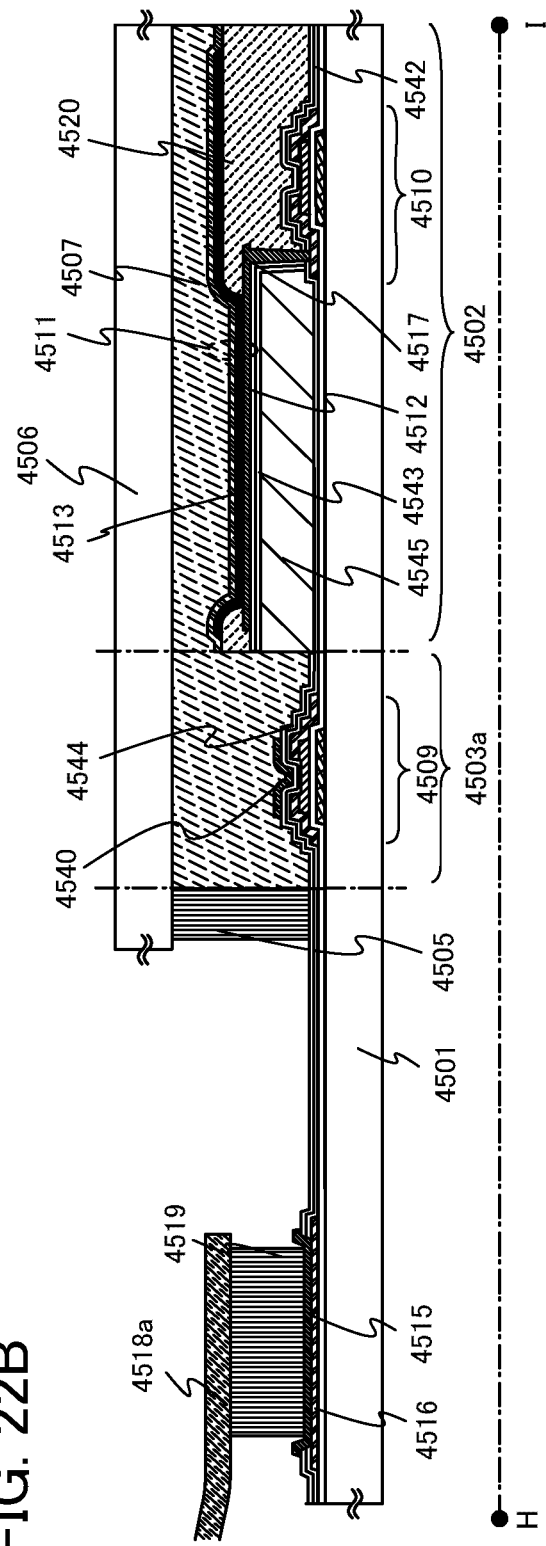

In this embodiment, the appearance and a cross section of a light-emitting display panel (also referred to as a light-emitting panel) will be described with reference to FIGS. 22A and 22B. FIG. 22A is a plan view of a panel in which a thin film transistor and a light-emitting element which are formed over a first substrate are sealed between the first substrate and a second substrate with a sealant. FIG. 22B is a cross-sectional view taken along line H-I in FIG. 22A.

A sealant 4505 is provided so as to surround a pixel portion 4502, signal line driver circuits 4503*a* and 4503*b*, and scan line driver circuits 4504*a* and 4504*b* which are provided over a first substrate 4501. In addition, a second substrate 4506 is provided over the pixel portion 4502, the signal line driver circuits 4503*a* and 4503*b*, and the scan line driver circuits 4504*a* and 4504*b*. Accordingly, the pixel portion 4502, the signal line driver circuits 4503*a* and 4503*b*, and the scan line driver circuits 4504*a* and 4504*b* are sealed together with a filler 4507, by the first substrate 4501, the sealant 4505, and the second substrate 4506. It is preferable that a panel be packaged (sealed) with a protective film (such as a bonding film or an ultraviolet curable resin film) or a cover material with high air-tightness and little degasification so that the panel is not exposed to the outside air.

The pixel portion 4502, the signal line driver circuits 4503*a* and 4503*b*, and the scan line driver circuits 4504*a* and 4504*b* formed over the first substrate 4501 each include a plurality of thin film transistors, and a thin film transistor 4510 included in the pixel portion 4502 and a thin film transistor 4509 included in the signal line driver circuit 4503*a* are illustrated as an example in FIG. 22B.

Any of the highly reliable thin film transistors including the oxide semiconductor layers, which are described in Embodiments 1 to 5, can be used as the thin film transistors 4509 and 4510. As the thin film transistor 4509 for the driver circuit, any of the thin film transistors 180, 181, and 182 which are described in Embodiments 1 to 5 can be used. As the thin film transistor 4510 for the pixel, any of the thin film transistors 170, 171, and 172 which are described in Embodiments 1 to 5 can be used. In this embodiment, the thin film transistors 4509 and 4510 are n-channel thin film transistors.

A conductive layer 4540 is provided over an insulating layer 4544 so as to overlap with a channel formation region in an oxide semiconductor layer of the thin film transistor 4509 for the driver circuit. The conductive layer 4540 is provided so as to overlap with the channel formation region of the oxide semiconductor layer, whereby the amount of change in the threshold voltage of the thin film transistor 4509 before and after BT test can be reduced. Further, a potential of the conductive layer 4540 may be the same as or different from that of the gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

Although not illustrated, a protective insulating layer such as the protective insulating layer 106 in Embodiment 1 may be provided between an oxide insulating layer 4542 and the insulating layer 4544.

The thin film transistor 4510 is electrically connected to a first electrode layer 4517.

The oxide insulating layer 4542 may be formed using a material and method which are similar to those of the oxide insulating film 107 described in Embodiment 1.

A color filter layer 4545 is formed over the oxide insulating layer 4542 so as to overlap with a light-emitting region of a light-emitting element 4511.

Further, in order to reduce the surface roughness of the color filter layer 4545, the color filter layer 4545 is covered with an overcoat layer 4543 functioning as a planarizing insulating film.

Further, an insulating layer 4544 is formed over the overcoat layer 4543. The insulating layer 4544 may be formed using a material and a method which are similar to those of the protective insulating layer 109 described in Embodiment 1.

Moreover, reference numeral 4511 denotes a light-emitting element. The first electrode layer 4517 which is a pixel electrode included in the light-emitting element 4511 is electrically connected to a source or drain electrode layer of the thin film transistor 4510. Note that although the light-emitting element 4511 has a stacked structure of the first electrode layer 4517, an electroluminescent layer 4512, and a second electrode layer 4513, the structure of the light-emitting element 4511 is not limited to the structure described in this embodiment. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistor 4509.

The connection terminal electrode 4515 is electrically connected to a terminal included in the FPC 4518*a* via an anisotropic conductive film 4519.

The second substrate located in the direction in which light is extracted from the light-emitting element 4511 needs to have a light-transmitting property. In that case, a light-transmitting material such as a glass plate, a plastic plate, a polyester film, or an acrylic film is used for the second substrate 4506.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, anti-glare treatment may be performed by which reflected light can be diffused by projections and depressions on the surface so that the glare can be reduce.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or the scan line driver circuits or part thereof may be separately formed and mounted. This embodiment is not limited to the structure illustrated in FIGS. 22A and 22B.

Through the above steps, a highly reliable light-emitting device (display panel) as a semiconductor device can be manufactured.

This embodiment can be implemented in appropriate combination with the structures described in the other embodiments.

Embodiment 9

In this embodiment, an example is described below in which at least some of driver circuits and a thin film transistor provided in a pixel portion are formed over the same substrate.

The thin film transistor provided in the pixel portion is formed in accordance with Embodiments 1 to 5. The thin film transistors described in Embodiments 1 to 5 are n-channel TFTs; therefore, some of driver circuits which can be formed using n-channel TFTs are formed over the same substrate as the thin film transistor of the pixel portion.

Figure 12A:
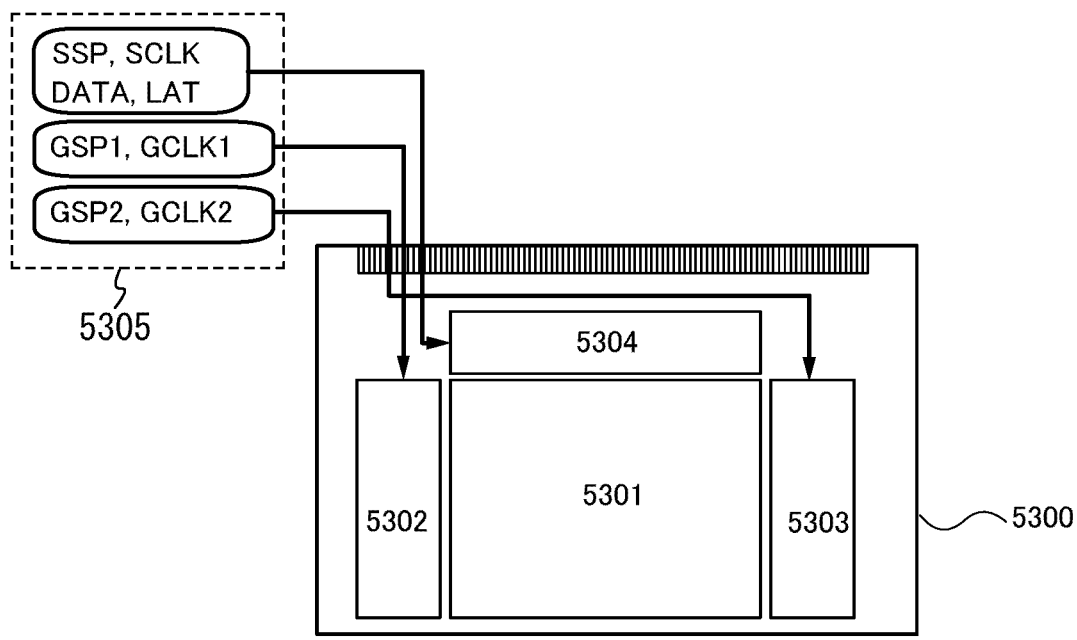
FIGS. 12A and 12B each illustrate a block diagram of a light-emitting device.

FIG. 12A illustrates an example of a block diagram of an active matrix display device. The display device includes a pixel portion 5301, a first scan line driver circuit 5302, a second scan line driver circuit 5303, and a signal line driver circuit 5304 over a substrate 5300. In the pixel portion 5301, a plurality of signal lines which are extended from the signal line driver circuit 5304 and a plurality of scan lines which are extended from the first scan line driver circuit 5302 and the second scan line driver circuit 5303 are provided. Note that pixels which include display elements are arranged in matrix in regions where the scan lines and the signal lines are crossed. In addition, the substrate 5300 of the display device is connected to a timing control circuit 5305 (also referred to as a controller or a control IC) through a connection portion such as a flexible printed circuit (FPC).

In FIG. 12A, the first scan line driver circuit 5302, the second scan line driver circuit 5303, and the signal line driver circuit 5304 are formed over the same substrate 5300 as the pixel portion 5301. Therefore, the number of components of a driver circuit which is provided outside and the like is reduced, which leads to cost reduction. Further, the number of connections in the connection portion can be reduced by extending wirings in the case where a driver circuit is provided outside the substrate 5300, which leads to improvement in reliability or improvement in a yield.

The timing control circuit 5305 supplies, for example, a first scan line driver circuit start signal (GSP1) and a scan line driver circuit clock signal (GCLK1) to the first scan line driver circuit 5302. The timing control circuit 5305 supplies, for example, a second scan line driver circuit start signal (GSP2, also referred to as a start pulse) and a scan line driver circuit clock signal (GCLK2) to the second scan line driver circuit 5303. The timing control circuit 5305 supplies a signal line driver circuit start signal (SSP), a signal line driver circuit clock signal (SCLK), video signal data (DATA, also simply referred to as a video signal), and a latch signal (LAT) to the signal line driver circuit 5304. Note that each clock signal may be a plurality of clock signals whose phases are shifted or may be supplied together with an inverted clock signal (CKB) which is obtained by inverting the clock signal. Note that one of the first scan line driver circuit 5302 and the second scan line driver circuit 5303 can be eliminated.

Figure 12B:
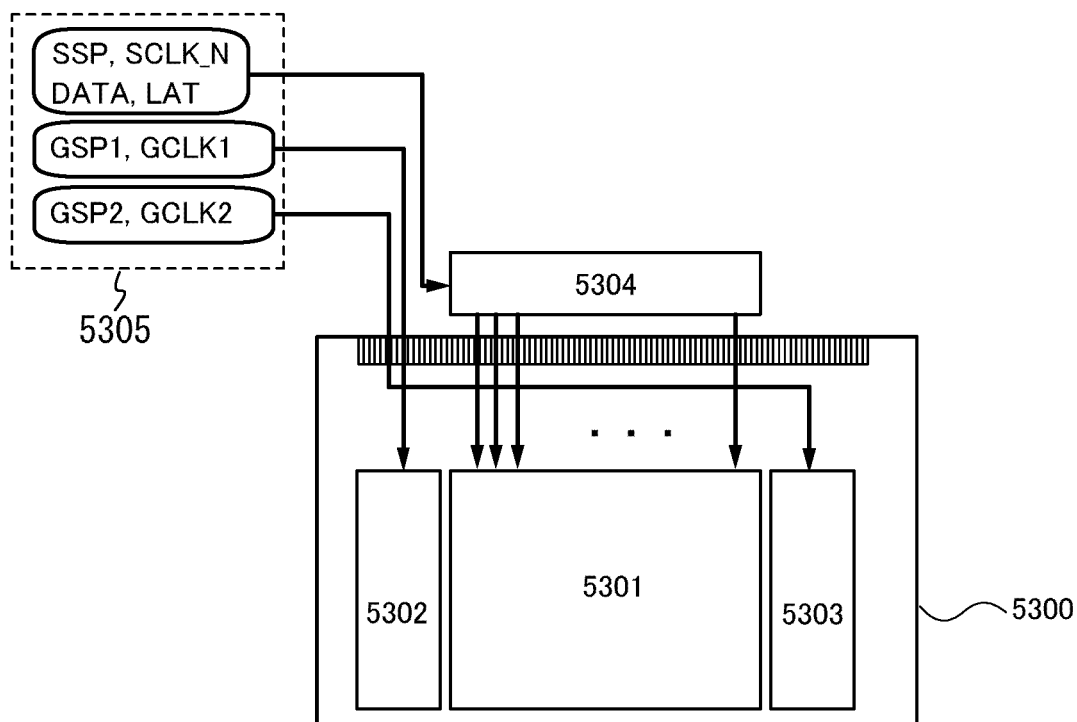

FIG. 12B illustrates a structure in which circuits with low driving frequency (e.g., the first scan line driver circuit 5302 and the second scan line driver circuit 5303) are formed over the same substrate 5300 as the pixel portion 5301 and the signal line driver circuit 5304 is formed over a substrate which is different from the pixel portion 5301. With this structure, a driver circuit formed over the substrate 5300 can be formed using a thin film transistor with lower field effect mobility as compared to that of a transistor formed using a single crystal semiconductor. Thus, increase in size of the display device, reduction in cost, improvement in yield, or the like can be achieved.

Figure 13A:
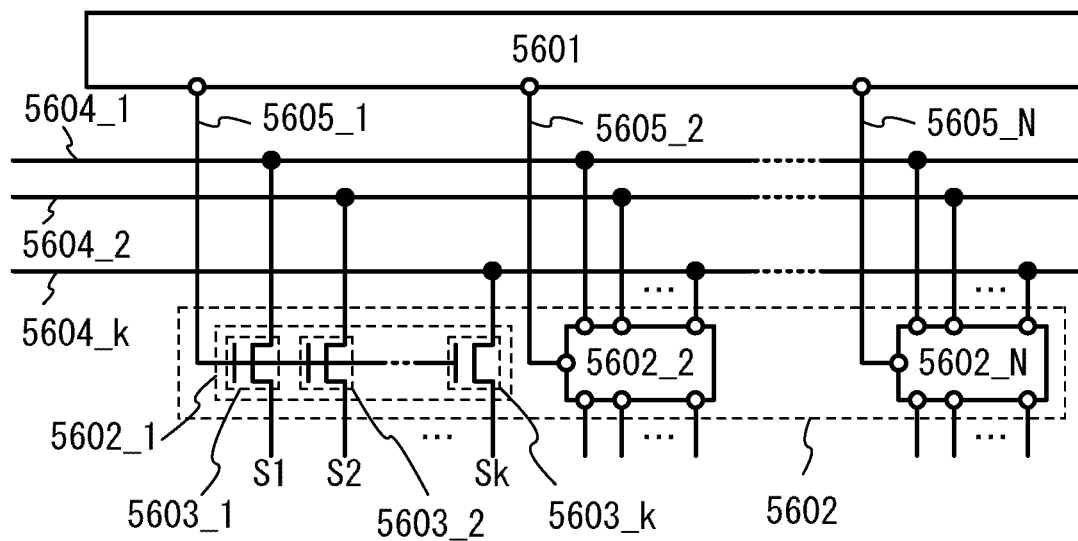
FIGS. 13A and 13B illustrate a structure and a timing chart of a signal line driver circuit.
Figure 13B:
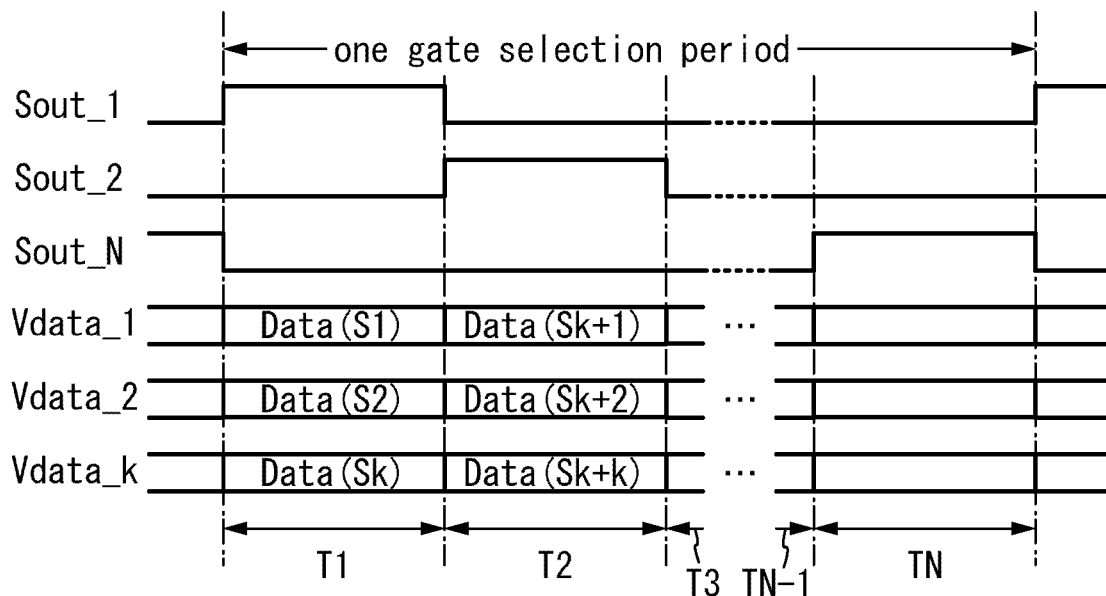

The thin film transistors described in Embodiments 1 to 5 are n-channel TFTs. FIGS. 13A and 13B illustrate an example of a structure and operation of a signal line driver circuit which is formed using n-channel TFTs.

The signal line driver circuit includes a shift register 5601 and a switching circuit 5602. The switching circuit 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). An example where the thin film transistors 5603_1 to 5603_$k$ are n-channel TFTs is described.

A connection relation in the signal line driver circuit is described taking the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially outputting H-level signals (also referred to as H signals or signals at high power supply potential level) to the wirings 5605_1 to 5605_N and sequentially selecting the switching circuits 5602_1 to 5602_N.

The switching circuit 5602_1 has a function of controlling a conduction state between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Further, the thin film transistors 5603_1 to 5603_$k$ each have functions of controlling conduction states between the wirings 5604_1 to 5604_$k$ and the signal lines S1 to Sk, that is, functions of supplying the potentials of the wirings 5604_1 to 5604_$k$ to the signal lines S1 to Sk. In this manner, each of the thin film transistors 5603_1 to 5603_$k$ functions as a switch.

Note that video signal data (DATA) is input to each of the wirings 5604_1 to 5604_$k$. The video signal data (DATA) is an analog signal corresponding to an image signal or image data in many cases.

Next, operation of the signal line driver circuit in FIG. 13A is described with reference to a timing chart in FIG. 13B. FIG. 13B illustrates examples of signals Sout_1 to Sout_N and signals Vdata_1 to Vdata_k. The signals Sout_1 to Sout_N are examples of output signals from the shift register 5601, and the signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period during which the video signal data (DATA) is written to pixels in a selected row.

Note that as for structures shown in drawings and the like of this embodiment, distortion in signal waveforms and the like are exaggerated for simplicity in some cases. Thus, the scale is not necessarily limited to that illustrated.

In the periods T1 to TN, the shift register 5601 sequentially outputs H-level signals to the wirings 5605_1 to 5605_N. For example, in the period T1, the shift register 5601 outputs the H-level signal to the wiring 5605_1. Then, the thin film transistors 5603_1 to 5603_$k$ are turned on, so that the wirings 5604_1 to 5604_$k$ and the signal lines S1 to Sk are brought into conduction. In this case, Data (S1) to Data (Sk) are input to the wirings 5604_1 to 5604_$k$, respectively. The Data (S1) to Data (Sk) are input to pixels in a selected row in first to k-th columns through the thin film transistors 5603_1 to 5603_$k$, respectively. Thus, in the periods T1 to TN, video signal data (DATA) is sequentially written to the pixels in the selected row by k columns.

By writing video signal data (DATA) to pixels by a plurality of columns as described above, the number of video signal data (DATA) or the number of wirings can be reduced. Accordingly, the number of connections to an external circuit can be reduced. By writing video signals to pixels by a plurality of columns, writing time can be extended and insufficient writing of video signals can be prevented.

Note that as the shift register 5601 and the switching circuit 5602, a circuit including the thin film transistor described in any of Embodiments 1 to 5 can be used.

One mode of a shift register which is used for part of a scan line driver circuit and/or a signal line driver circuit is described with reference to FIGS. 14A to 14C and FIGS. 15A and 15B.

The scan line driver circuit includes a shift register. The scan line driver circuit may also include a level shifter, a buffer, or the like in some cases. In the scan line driver circuit, a clock signal (CLK) and a start pulse signal (SP) are input to the shift register, and then a selection signal is generated. The generated selection signal is buffered and amplified in the buffer, and the resulting signal is supplied to a corresponding scan line. Gate electrodes of transistors in pixels of one line are connected to a scan line. Since the transistors in the pixels of one line must be turned on all at once, a buffer which can supply a large amount of current is used.

Figure 14A:
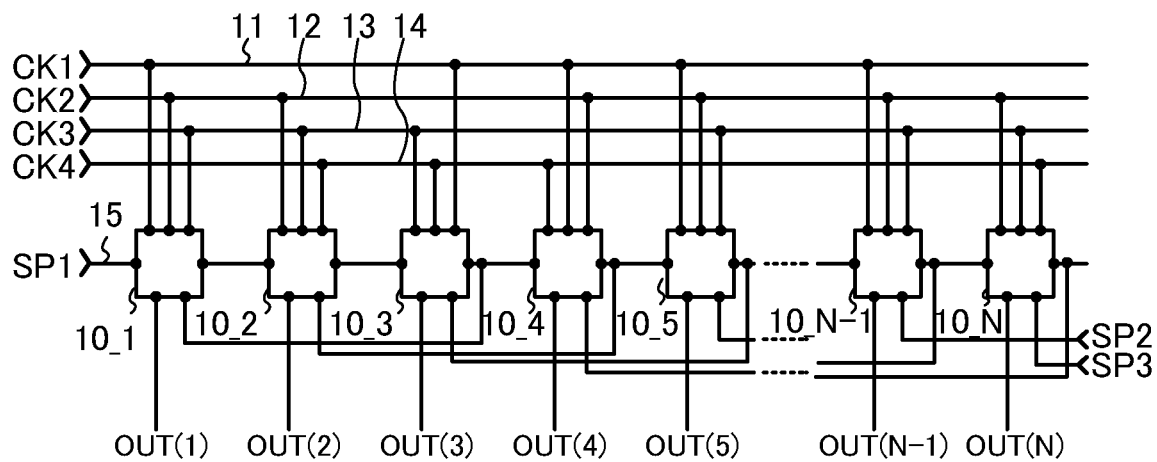
FIGS. 14A to 14C illustrate circuit diagrams of a configuration of a shift register.

The shift register includes first to N-th pulse output circuits 10_1 to 10_N (N is a natural number of 3 or more) (see FIG. 14A). A first clock signal CK1 from a first wiring 11, a second clock signal CK2 from a second wiring 12, a third clock signal CK3 from a third wiring 13, and a fourth clock signal CK4 from a fourth wiring 14 are supplied in the first to N-th pulse output circuits 10_1 to 10_N of the shift register illustrated in FIG. 14A. In addition, a start pulse SP1 (a first start pulse) from a fifth wiring 15 is input to the first pulse output circuit 10_1. Further, a signal from the pulse output circuit 10_(n−1) of the previous stage (referred to as a previous stage signal OUT (n−1)) is input to the n-th pulse output circuit 10_n (n is a natural number of 2 or more and N or less) in a second or subsequent stage. A signal from the third pulse output circuit 10_3 which is two stages after the first pulse output circuit 10_1 is input to the first pulse output circuit 10_1. Similarly, a signal from the (n+2)-th pulse output circuit 10_(n+2) which is two stages after the n-th pulse output circuit 10_n (referred to as a subsequent stage signal OUT (n+2)) is input to the n-th pulse output circuit 10_n in the second or subsequent stage. Therefore, the pulse output circuits in respective stages output first output signals (OUT (1) (SR) to OUT (N) (SR)) which is input to the pulse output circuit in the previous and/or subsequent stage, and second output signals (OUT (1) to OUT (N)) which is input to other circuits and the like. Note that as illustrated in FIG. 14A, since the subsequent stage signal OUT (n+2) is not input to the last two stages of the shift register, a second start pulse SP2 and a third start pulse SP3 may be separately input to the last two stages of the shift register, for example.

Note that a clock signal (CK) is a signal which oscillates between an H-level signal and an L-level signal (also referred to as L signal or a signal at a low power supply potential level) at regular intervals. Here, the first to fourth clock signals CK1 to CK4 are delayed by ¼ cycle sequentially (i.e., they are 90° out of phase with each other). In this embodiment, by using the first to fourth clock signals CK1 to CK4, control or the like of driving of the pulse output circuits is performed. The clock signal is also referred to as GCK or SCK in accordance with a driver circuit to which the signal is input; however, here, description is made using CK as the clock signal.

Figure 14B:
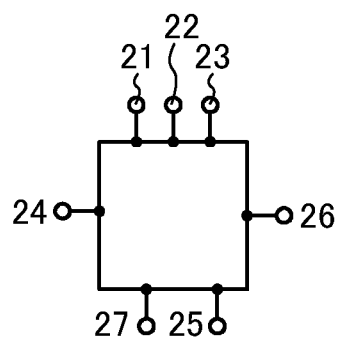

FIG. 14B is one of the pulse output circuits 10_1 to 10_N shown in FIG. 14A. A first input terminal 21, a second input terminal 22, and a third input terminal 23 are electrically connected to any of the first to fourth wirings 11 to 14. For example, in FIG. 14A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 14B). In the first pulse output circuit 10_1, the first clock signal CK1 is input to the first input terminal 21; the second clock signal CK2 is input to the second input terminal 22; the third clock signal CK3 is input to the third input terminal 23; the start pulse is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

In addition to a thin film transistor (TFT) having three terminals, the thin film transistor having four terminals, which is described in the above embodiment, can be used for each of the first to N-th pulse output circuits 10_1 to 10_N. Note that in this specification, when a thin film transistor includes two gate electrodes with a semiconductor layer therebetween, the gate electrode which is located below the semiconductor layer is also referred to as a lower gate electrode and the gate electrode which is located above the semiconductor layer is also referred to as an upper gate electrode.

When an oxide semiconductor is used for a semiconductor layer including a channel formation region of a thin film transistor, threshold voltage is shifted in a negative or positive direction in some cases depending on a manufacturing process. Thus, a thin film transistor in which an oxide semiconductor is used for a semiconductor layer including a channel formation region preferably has a structure where threshold voltage can be controlled. The threshold voltage of a thin film transistor having four terminals can be controlled to be a desired value by controlling a potential of an upper gate electrode and/or a lower gate electrode.

Next, an example of a specific circuit structure of the pulse output circuit illustrated in FIG. 14B is described with reference to FIG. 14C.

Figure 14C:
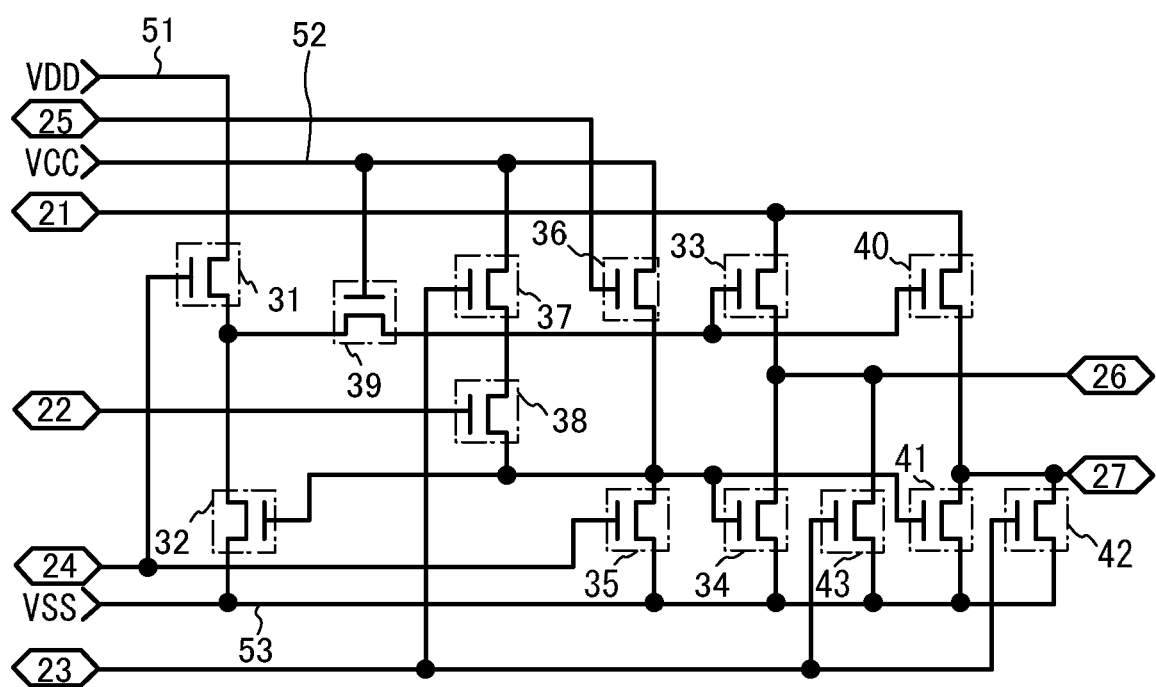

The pulse output circuit illustrated in FIG. 14C includes first to thirteenth transistors 31 to 43. In addition to the first to fifth input terminal 21 to 25, signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied. Signals or the like are output through the first output terminal 26 and the second output terminal 27. Here, the power supply potentials of the power supply lines in FIG. 14C are set so that the first power supply potential VDD is higher than or equal to the second power supply potential VCC and the second power supply potential VCC is higher than the third power supply potential VSS. Although the first to fourth clock signals CK1 to CK4 are signals which oscillate between an H-level signal and an L-level signal at regular intervals, a potential is VDD when the clock signal is at the H level, and the potential is VSS when the clock signal is at the L level. When the potential VDD of the power supply line 51 is set to higher than the potential VCC of the power supply line 52, a potential applied to the gate electrode of the transistor can be lowered without adversely affecting the operation, whereby the shift of the threshold voltage of the transistor can be reduced and deterioration can be suppressed. Note that a thin film transistor having four terminals is preferably used for the first transistor 31 and the sixth to ninth transistors 36 to 39 among the first to thirteenth transistors 31 to 43. The first transistor 31 and the sixth to ninth transistors 36 to 39 are required to switch a potential of each node connected to one of electrodes which is to be a source or a drain by a control signal of the gate electrode. The first transistor 31 and the sixth to ninth transistors 36 to 39 can further reduce malfunctions of the pulse output circuits by quick response (sharp rising of on current) with respect to a control signal input to the gate electrode. Therefore, when a thin film transistor having four terminals is used, the threshold voltage can be controlled and malfunctions of the pulse output circuits can be further reduced.

In FIG. 14C, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 is electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 14C, a connection point of the gate electrode of the third transistor 33, the gate electrode of the tenth transistor 40, and the second terminal of the ninth transistor 39 is referred to as a node A. In addition, a connection point of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is referred to as a node B.

Figure 15A:
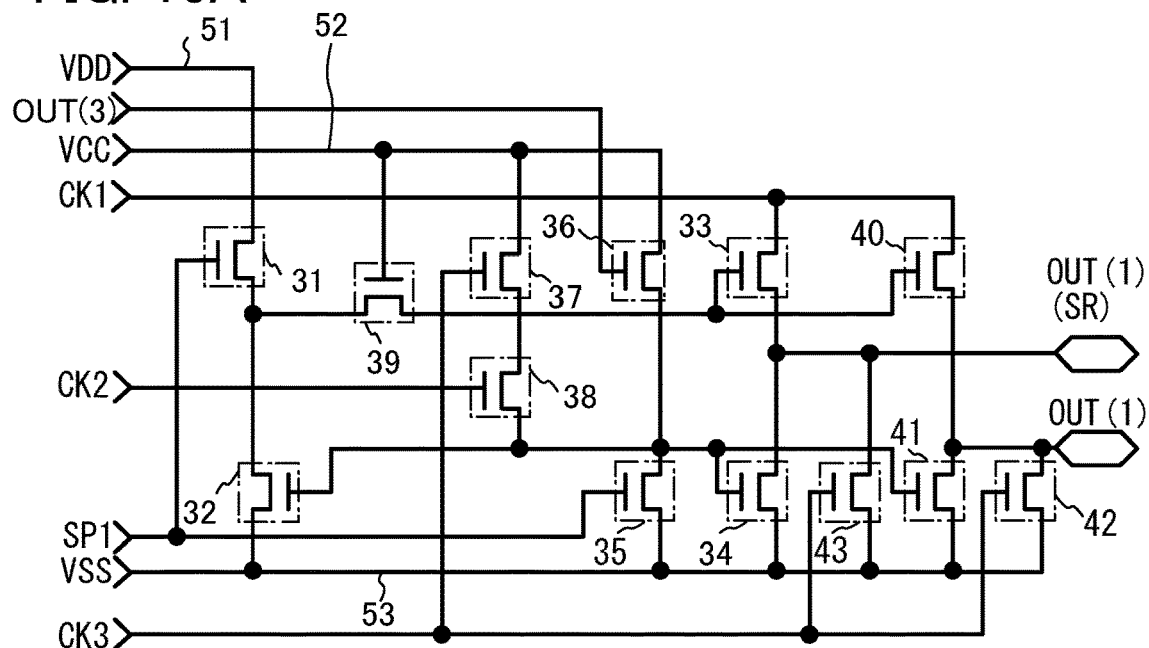
FIGS. 15A and 15B illustrate a circuit diagram and a timing chart of a shift register.

FIG. 15A illustrates signals input to the first to fifth input terminals 21 to 25 and signals output from the first output terminal 26 and the second output terminal 27 when the pulse output circuit illustrated in FIG. 14C is used as the first pulse output circuit 10_1.

Specifically, the first clock signal CK1 is input to the first input terminal 21; the second clock signal CK2 is input to the second input terminal 22; the third clock signal CK3 is input to the third input terminal 23; the start pulse (SP1) is input to the fourth input terminal 24; the subsequent stage signal OUT (3) is input to the fifth input terminal 25; the first output signal OUT (1) (SR) is output from the first output terminal 26; and the second output signal OUT (1) is output from the second output terminal 27.

Note that a thin film transistor is an element having at least three terminals of a gate, a drain, and a source. Further, the thin film transistor includes a semiconductor in which a channel region is formed in a region overlapping with the gate and the amount of current which flows between the drain and the source through the channel region can be controlled by controlling a potential of the gate. Here, since the source and the drain of the thin film transistor may change depending on the structure, the operating condition, and the like of the thin film transistor, it is difficult to define which is a source or a drain. Therefore, a region functioning as a source or a drain is not called a source or a drain in some cases. In such a case, for example, one of the source and the drain may be referred to as a first terminal and the other thereof may be referred to as a second terminal.

Note that in FIG. 14C and FIG. 15A, a capacitor for performing bootstrap operation by setting the node A floating may be additionally provided. Further, a capacitor having one electrode electrically connected to the node B may be additionally provided in order to hold a potential of the node B.

Figure 15B:
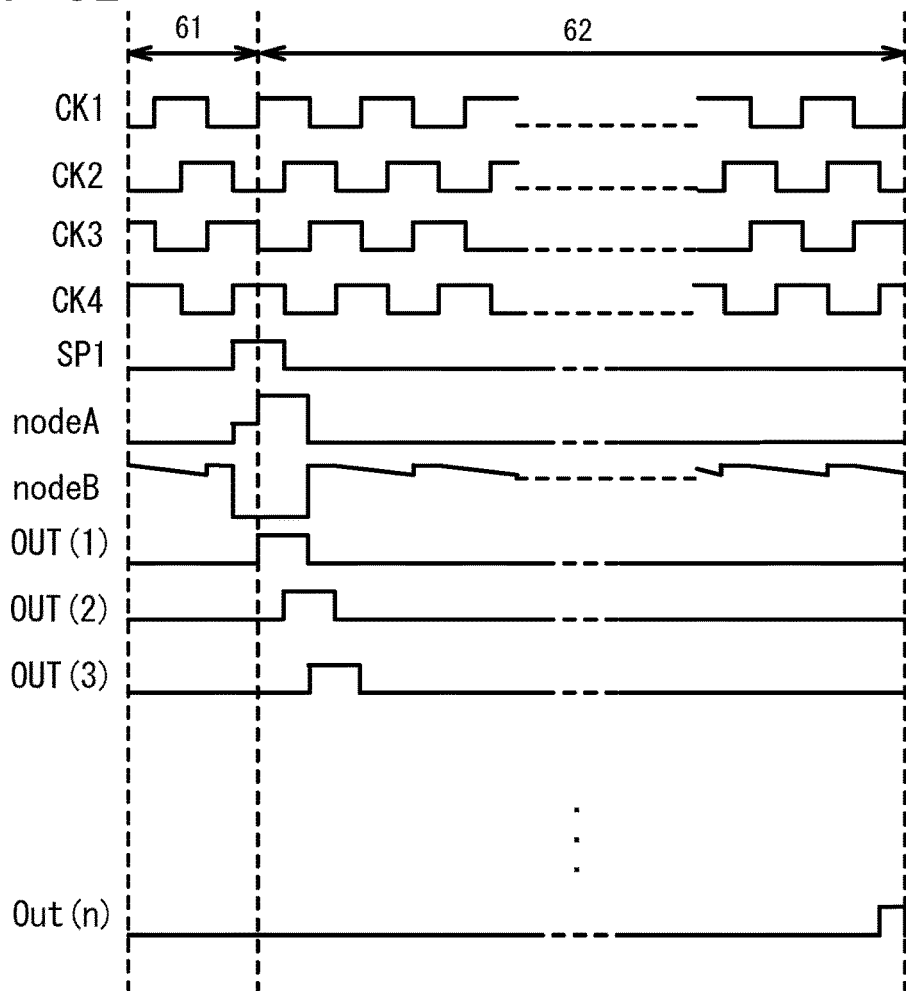

Here, FIG. 15B illustrates a timing chart of a shift register including a plurality of the pulse output circuits illustrated in FIG. 15A. Note that in the case where the shift register is a scan line driver circuit, a period 61 of FIG. 15B corresponds to a vertical retrace period and a period 62 of FIG. 15B corresponds to a gate selection period.

Note that as illustrated in FIG. 15A, with the ninth transistor 39 whose gate is supplied with the second power supply potential VCC, advantages described below are obtained before and after bootstrap operation.

Without the ninth transistor 39 whose gate is supplied with the second power supply potential VCC, when a potential of the node A is raised by bootstrap operation, a potential of a source which is the second terminal of the first thin film transistor 31 increases to a value higher than the first power supply potential VDD. Then, the first terminal of the first transistor 31, that is, the terminal on the power supply line 51 side, comes to serve as a source of the first transistor 31. Therefore, in the first transistor 31, a high bias voltage is applied and thus significant stress is applied between the gate and the source and between the gate and the drain, which might cause deterioration in the transistor. Thus, with the ninth transistor 39 whose gate electrode is supplied with the second power supply potential VCC, the potential of the node A is raised by bootstrap operation, but at the same time, an increase in the potential of the second terminal of the first transistor 31 can be prevented. In other words, with the ninth transistor 39, the level of a negative bias voltage applied between the gate and the source of the first transistor 31 can be lowered. Accordingly, with a circuit structure in this embodiment, a negative bias voltage applied between the gate and the source of the first transistor 31 can be lowered, so that deterioration in the first transistor 31, which is due to stress, can be further restrained.

Note that the ninth transistor 39 is provided so that the first terminal and the second terminal of the ninth transistor 39 are connected between the second terminal of the first transistor 31 and the gate of the third transistor 33. In the case where a shift register includes a plurality of pulse output circuits of this embodiment, the ninth transistor 39 may be eliminated in a signal line driver circuit which has more stages than a scan line driver circuit, which is advantageous in reducing the number of the transistors.

When an oxide semiconductor is used for each of the semiconductor layers of the first to thirteenth transistors 31 to 43, the amount of off current of the thin film transistors can be reduced, the amount of on current and field-effect mobility can be increased, and, the rate of deterioration can be decreased, whereby malfunctions of the circuit can be reduced. Further, a transistor including an oxide semiconductor has a lower rate of deterioration of the transistor due to application of a high potential to a gate electrode, as compared to a transistor including amorphous silicon. Therefore, even when the first power supply potential VDD is supplied to the power supply line to which the second power supply potential VCC is supplied, similar operation can be performed and the number of power supply lines provided between the circuits can be reduced, whereby size reduction in a circuit can be achieved.

Note that a similar effect is obtained even when a connection relation is changed so that a clock signal which is supplied to the gate electrodes (the lower gate electrode and the upper gate electrode) of the seventh transistor 37 through the third input terminal 23 is a clock signal which is supplied to the gate electrodes (the lower gate electrode and the upper electrode) of the seventh transistor 37 through the second input terminal 22; and a clock signal which is supplied to the gate electrodes (the lower gate electrode and the upper gate electrode) of the eighth transistor 38 through the second input terminal 22 is a clock signal which is supplied to the gate electrodes (the lower electrode and the upper electrode) of the eighth transistor 38 through the third input terminal 23. Note that in the shift register illustrated in FIG. 15A, the seventh transistor 37 and the eighth transistor 38 are both on, the seventh transistor 37 is turned off and the eighth transistor 38 is kept on, and then the seventh transistor 37 kept off state and the eighth transistor 38 is turned off, whereby the decrease in the potential of the node B, which is caused by the decrease in the potentials of the second input terminal 22 and the third input terminal 23, occurs twice due to the decrease in the potential of the gate electrode of the seventh transistor 37 and the decrease in the potential of the gate electrode of the eighth transistor 38. On the other hand, in the shift register illustrated in FIG. 15A, the seventh transistor 37 and the eighth transistor 38 are both on, the seventh transistor 37 is kept on and the eighth transistor 38 is turned off, and then the seventh transistor 37 is turned off and the eighth transistor 38 is kept off, whereby the decrease in the potential of the node B, which is caused by the decrease in the potentials of the second input terminal 22 and the third input terminal 23, can be reduced to once due to the decrease in the potential of the gate electrode of the eighth transistor 38 is decreased. Accordingly, the connection relation, in which the clock signal CK3 is supplied to the gate electrodes (the lower electrode and the upper electrode) of the seventh transistor 37 through the third input terminal 23 and the clock signal CK2 is supplied to the gate electrodes (the lower gate electrode and the upper gate electrode) of the eighth transistor 38 through the second input terminal 22, is preferable. That is because the number of times of fluctuation of the potential of the node B can be reduced and noise can be reduced.

In this way, in a period during which the potential of the first output terminal 26 and the potential of the second output terminal 27 are held at the L level, an H level signal is regularly supplied to the node B; therefore, a malfunction of the pulse output circuit can be suppressed.

This embodiment can be implemented in appropriate combination with the structures described in the other embodiments.

Embodiment 10

A light-emitting device disclosed in this specification can be applied to a variety of electronic devices (including an amusement machine). Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game console, a portable information terminal, an audio reproducing device, a large-sized game machine such as a pachinko machine, and the like.

Figure 23A:
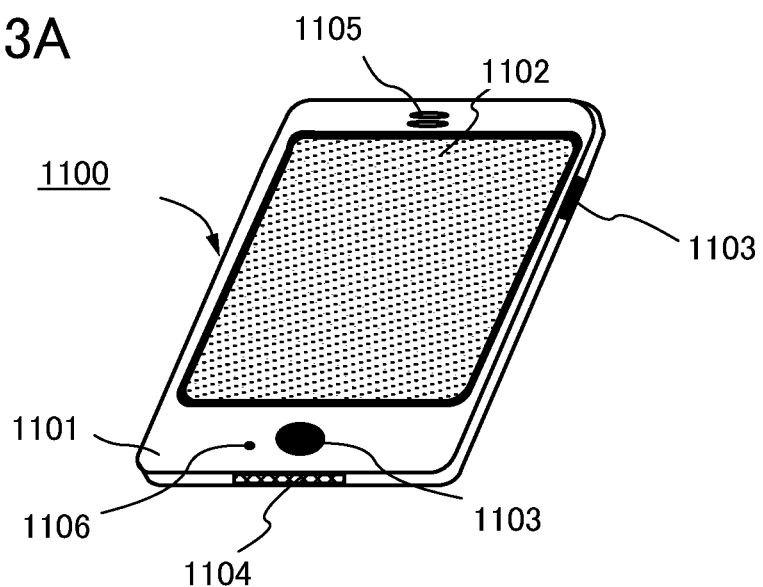
FIGS. 23A and 23B illustrate electronic devices.

FIG. 23A illustrates a mobile phone 1100. The mobile phone 1100 is provided with a display portion 1102 incorporated in a housing 1101, operation buttons 1103, an external connection port 1104, a speaker 1105, a microphone 1106, and the like.

When the display portion 1102 illustrated in FIG. 23A is touched with a finger or the like, data can be input into the mobile phone 1100. Further, operations such as making a call and texting can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making a call or texting, the input mode mainly for inputting text is selected for the display portion 1102 so that characters displayed on a screen can be input. In this case, it is preferable to display a keyboard or number buttons on almost the entire screen of the display portion 1102.

When a detection device including a sensor for detecting inclination, such as a gyroscope or an acceleration sensor, is provided inside the mobile phone 1100, display on the screen of the display portion 1102 can be automatically switched by determining the direction of the mobile phone 1100 (whether the mobile phone 1100 is placed horizontally or vertically for a landscape mode or a portrait mode).

The screen mode is switched by touching the display portion 1102 or operating the operation buttons 1103 of the housing 1101. Alternatively, the screen modes may be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by an optical sensor in the display portion 1102 is detected, the screen mode may be controlled so as to be changed from the input mode to the display mode.

The display portion 1102 may function as an image sensor. For example, an image of a palm print, a fingerprint, or the like is taken when the display portion 1102 is touched with a palm or a finger, whereby personal identification can be performed. Further, by providing a backlight or a sensing light source which emits a near-infrared light in the display portion, an image of a finger vein, a palm vein, or the like can also be taken.

The light-emitting device described in any of Embodiments 1 to 9 is used for the display portion 1102, whereby reliability can be increased.

Figure 23B:
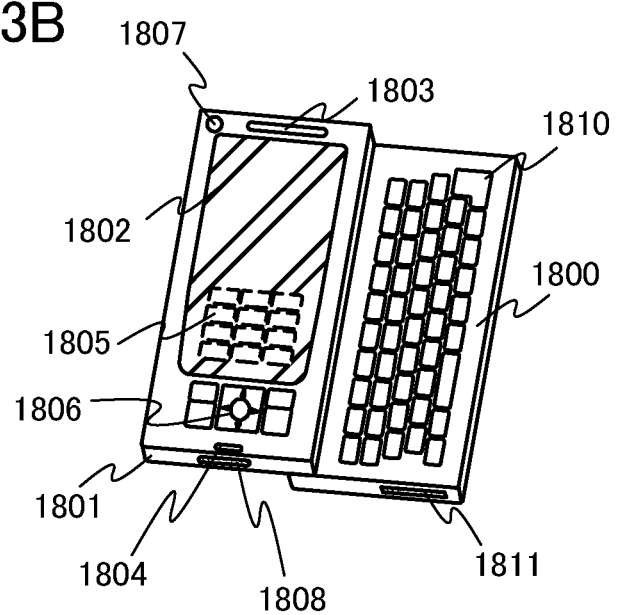

FIG. 23B illustrates an example of a portable information terminal. A portable information terminal whose example is illustrated in FIG. 23B can have a plurality of functions. For example, in addition to a telephone function, such a portable information terminal can have a function of processing a variety of pieces of data by incorporating a computer.

The portable information terminal illustrated in FIG. 23B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1800 or 1801.

The display panel 1802 is provided with a touch panel. A plurality of operation keys 1805 which is displayed as images is illustrated by dashed lines in FIG. 23B.

Further, in addition to the above structure, a contactless IC chip, a small-sized memory device, or the like may be incorporated.

The light-emitting device of the present invention can be used for the display panel 1802 and the direction of display is changed as appropriate depending on an application mode. Further, the camera lens 1807 is provided on the same surface as the display panel 1802, and thus it can be used as a video phone. The speaker 1803 and the microphone 1804 can be used for videophone calls, recording, and playing sound, etc. as well as voice calls. Moreover, the housings 1800 and 1801 in a state where they are developed as illustrated in FIG. 23B can be slid so that one is lapped over the other; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 24A:
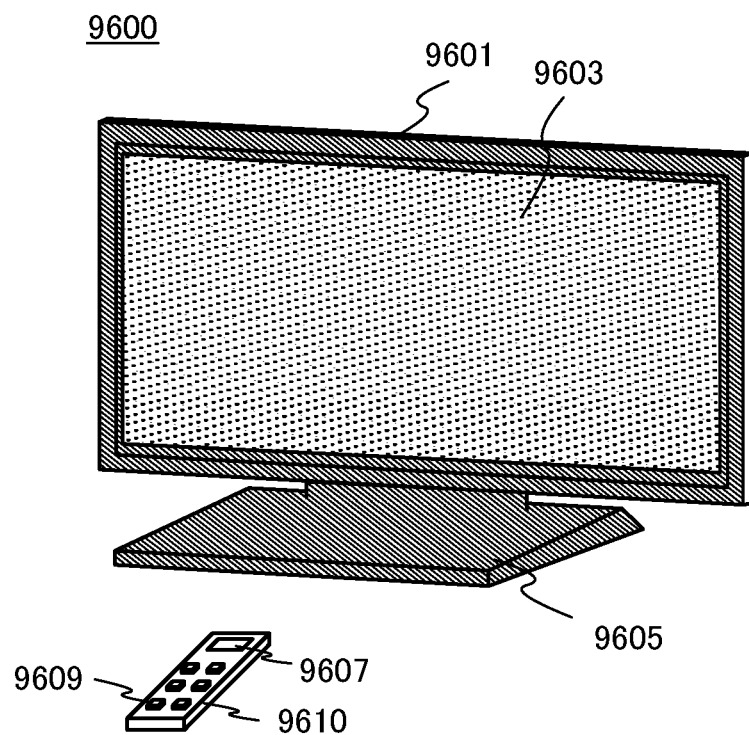
FIGS. 24A and 24B illustrate electronic devices.

FIG. 24A illustrates a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610, so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

The light-emitting device described in any of Embodiments 1 to 9 is used for the display portion 9603, whereby reliability can be increased.

Figure 24B:
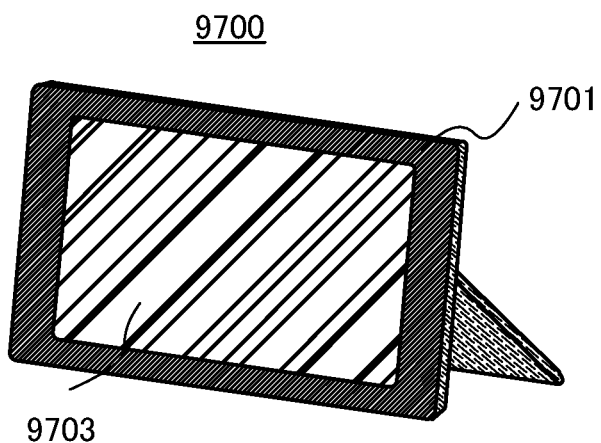

FIG. 24B illustrates a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame.

The light-emitting device described in any of Embodiments 1 to 9 is used for the display portion 9703, whereby reliability can be increased.

Note that the digital photo frame 9700 is provided with an operation portion, an external connection terminal (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 25:
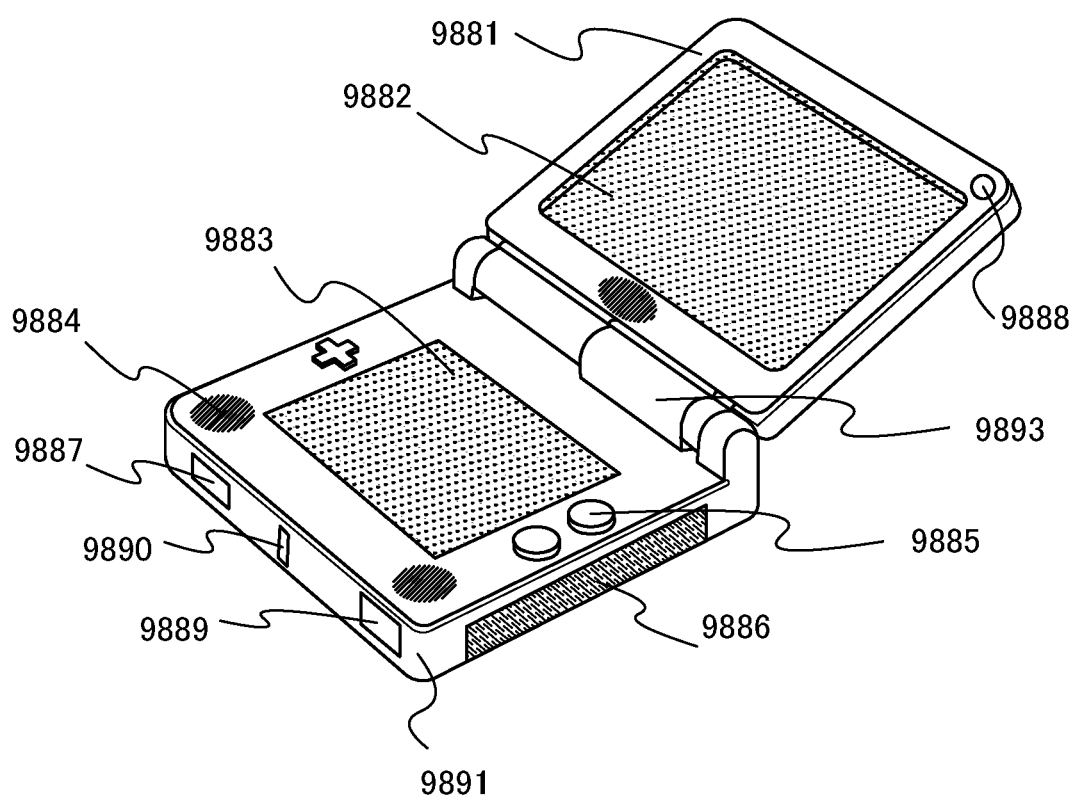
FIG. 25 illustrates an electronic device.

FIG. 25 is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively.

The light-emitting device described in any of Embodiments 1 to 9 is used for the display portions 9882 and 9883, whereby reliability can be increased.

The portable game machine illustrated in FIG. 25 is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a thin film transistor disclosed in this specification can be employed. The portable game machine may include an additional accessory as appropriate. The portable game machine illustrated in FIG. 25 has a function of reading a program or data stored in the recording medium to display it on the display portion, and a function of sharing data with another portable game machine by wireless communication. Note that a function of the portable game machine illustrated in FIG. 25 is not limited to those described above, and the portable game machine can have a variety of functions.

Figure 26:
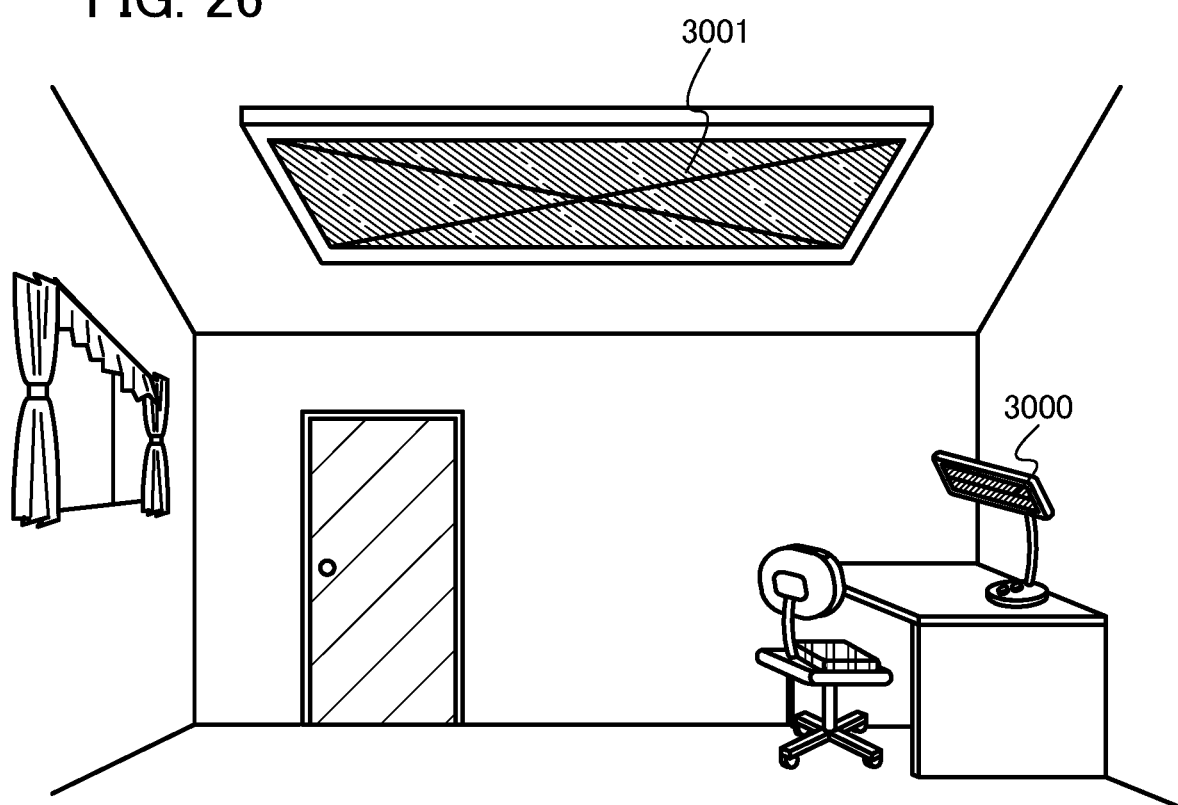
FIG. 26 illustrates electronic devices.

FIG. 26 is an example in which the light-emitting device formed in accordance with the above embodiments is used as an indoor lighting device 3001. Since the light-emitting device described in the above embodiments can be increased in area, the light-emitting device can be used as a lighting device having a large area. Further, the light-emitting device described in Embodiment 2 can be used as a desk lamp 3000. Note that the lighting equipment includes, in its category, a ceiling light, a wall light, a lightning for an inside of a car, an emergency exit light, and the like.

As described above, the light-emitting device described in any of Embodiments 1 to 9 can be used in the display panels of a variety of electronic devices such as the above ones, and thus an electronic device with high reliability can be provided.

This application is based on Japanese Patent Application serial no. 2009-204972 filed with Japan Patent Office on Sep. 4, 2009, the entire contents of which are hereby incorporated by reference.

EXPLANATION OF REFERENCE

10: pulse output circuit, 11: wiring, 12: wiring, 13: wiring, 14: wiring, 15: wiring, 21: input terminal, 22: input terminal, 23: input terminal, 24: input terminal, 25: input terminal, 26: output terminal, 27: output terminal, 31: transistor, 32: transistor, 33: transistor, 34: transistor, 35: transistor, 36: transistor, 37: transistor, 38: transistor, 39: transistor, 40: transistor, 41: transistor, 42: transistor, 43: transistor, 51: power supply line, 52: power supply line, 53: power supply line, 100: substrate, 101: gate electrode layer, 102: gate insulating layer, 103: oxide semiconductor layer, 106: protective insulating layer, 107: oxide insulating film, 108: capacitor wiring layer, 109: protective insulating layer, 110: electrode layer, 111: conductive layer, 112: conductive layer, 113: terminal electrode, 116: channel formation region, 118: contact hole, 119: contact hole, 120: connection electrode, 121: terminal, 122: terminal, 125: contact hole, 126: contact hole, 127: contact hole, 128: terminal electrode, 129: terminal electrode, 130: oxide semiconductor film, 131: oxide semiconductor layer, 133: oxide semiconductor layer, 134: oxide semiconductor layer, 137: resist mask, 138: oxide conductive layer, 140: oxide conductive film, 142: oxide conductive layer, 143: oxide conductive layer, 145: wiring layer, 146: capacitor, 147: capacitor, 149: capacitor electrode layer, 150: terminal, 151: terminal, 153: connection electrode, 155: conductive film, 156: electrode, 161: gate electrode layer, 162: conductive layer, 163: oxide semiconductor layer, 166: channel formation region, 168: oxide semiconductor layer, 170: thin film transistor, 171: thin film transistor, 172: thin film transistor, 173: thin film transistor, 180: thin film transistor, 181: thin film transistor, 182: thin film transistor, 183: thin film transistor, 185: capacitor electrode layer, 191: color filter layer, 192: overcoat layer, 193: partition, 194: EL layer, 195: electrode layer, 196: connection electrode layer, 198: oxide semiconductor layer, 1001: electrode, 1002: electrode, 1003: EL layer, 1004: charge generation layer, 104*a*: oxide conductive layer, 104*b*: oxide conductive layer, 105*a*: source electrode layer, 105*b*: drain electrode layer, 1100: mobile phone, 1101: housing, 1102: display portion, 1103: operation button, 1104: external connection port, 1105: speaker, 1106: microphone, 117*a*: highresistance source region, 117*b*: highresistance drain region, 135*a*: resist mask, 136*a*: resist mask, 164*a*: oxide conductive layer, 164*b*: oxide conductive layer, 165*a*: source electrode layer, 165*b*: drain electrode layer, 167*a*: high-resistance source region, 167*b*: high-resistance drain region, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 3000: table light, 3001: lighting device, 4501: substrate, 4502: pixel portion, 4505: sealant, 4506: substrate, 4507: filler, 4509: thin film transistor, 4510: thin film transistor, 4511: light-emitting element, 4512: electroluminescent layer, 4513: electrode layer, 4515: connection terminal electrode, 4516: terminal electrode, 4517: electrode layer, 4519:

anisotropic conductive film, 4520: partition, 4540: conductive layer, 4542: oxide insulating layer, 4543: overcoat layer, 4544: insulating layer, 4545: color filter layer, 4546: insulating layer, 5300: substrate, 5301: pixel portion, 5302: scan line driver circuit, 5303: scan line driver circuit, 5304: signal line driver circuit, 5305: timing control circuit, 5601: shift register 5602: switching circuit, 5603: thin film transistor, 5604: wiring, 5605: wiring, 6400: pixel, 6401: switching transistor, 6402: transistor, 6403: capacitor, 6404: light-emitting element, 6405: signal line, 6406: scan line, 6407: power supply line, 6408: common electrode, 7001: TFT, 7002: light-emitting element, 7003: electrode layer, 7004: EL layer, 7005: electrode layer, 7009: partition, 7011: driver TFT, 7012: light-emitting element, 7013: electrode layer, 7014: EL layer, 7015: electrode layer, 7016: light-blocking film, 7017: conductive film, 7019: partition, 7021: driver TFT, 7022: light-emitting element, 7023: electrode layer, 7024: EL layer, 7025: electrode layer, 7026: electrode layer, 7027: conductive film, 7029: partition, 7031: oxide insulating layer, 7032: protective insulating layer, 7033: color filter layer, 7034: overcoat layer, 7035: protective insulating layer, 7041: oxide insulating layer, 7042: protective insulating layer, 7043: color filter layer, 7044: overcoat layer, 7045: protective insulating layer, 7051: oxide insulating layer, 7052: protective insulating layer, 7053: planarizing insulating layer, 7055: protective insulating layer, 9600: television device, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording media insertion portion, 9887: connection terminal, 9888: sensor, 9889: microphone, 9890: LED lamp, 9891: housing, 4503a: signal line driver circuit, and 4504a: scan line driver circuit.

The invention claimed is:

1. A semiconductor device comprising:
a pixel portion comprising:
   a first transistor;
   a color filter layer; and
   a partition over the color filter layer; and
a circuit portion comprising:
   a second transistor,
wherein the first transistor comprises a first oxide semiconductor layer, a first source electrode layer, and a first drain electrode layer,
wherein the first oxide semiconductor layer comprises a first region, a second region, and a first channel formation region sandwiched between the first and second regions,
wherein the first region has a lower resistance than the first channel formation region,
wherein the second region has a lower resistance than the first channel formation region,
wherein the second transistor comprises a second oxide semiconductor layer,
wherein the second oxide semiconductor layer comprises a third region, a fourth region, and a second channel formation region sandwiched between the third and fourth regions,
wherein the third region has a lower resistance than the second channel formation region,
wherein the fourth region has a lower resistance than the second channel formation region,
wherein a first insulating layer is positioned over the first source and drain electrode layers,
wherein the color filter layer is positioned over the first insulating layer and not overlapping the first channel formation region, and
wherein the partition comprises a region overlapping the first channel formation region.

2. The semiconductor device according to claim 1, wherein the circuit portion is a protection circuit portion.

3. The semiconductor device according to claim 1,
wherein the second transistor comprises a second source electrode layer, a second drain electrode layer, and a gate electrode layer, and
wherein the second drain electrode layer is electrically connected to the gate electrode layer.

4. A semiconductor device comprising:
a pixel portion comprising:
   a first transistor;
   a color filter layer; and
   a partition over the color filter layer; and
a circuit portion comprising:
   a second transistor,
wherein the first transistor comprises a first oxide semiconductor layer comprising In, Ga, and Zn, a first source electrode layer, and a first drain electrode layer,
wherein the first oxide semiconductor layer comprises a first region, a second region, and a first channel formation region sandwiched between the first and second regions,
wherein the first region has a lower resistance than the first channel formation region,
wherein the second region has a lower resistance than the first channel formation region,
wherein the second transistor comprises a second oxide semiconductor layer comprising In, Ga, and Zn,
wherein the second oxide semiconductor layer comprises a third region, a fourth region, and a second channel formation region sandwiched between the third and fourth regions,
wherein the third region has a lower resistance than the second channel formation region,
wherein the fourth region has a lower resistance than the second channel formation region,
wherein a first insulating layer is positioned over the first source and drain electrode layers,
wherein the color filter layer is positioned over the first insulating layer and not overlapping the first channel formation region, and
wherein the partition comprises a region overlapping the first channel formation region.

5. The semiconductor device according to claim 4, wherein the circuit portion is a protective circuit portion.

6. The semiconductor device according to claim 4,
wherein the second transistor comprises a second source electrode layer, a second drain electrode layer, and a gate electrode layer, and
wherein the second drain electrode layer is electrically connected to the gate electrode layer.

* * * * *